United States Patent
Lee et al.

(10) Patent No.: US 8,473,829 B2
(45) Date of Patent: *Jun. 25, 2013

(54) ADDRESS GENERATION FOR CONTENTION-FREE MEMORY MAPPINGS OF TURBO CODES WITH ARP (ALMOST REGULAR PERMUTATION) INTERLEAVES

(75) Inventors: Tak K. Lee, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 376 days.

This patent is subject to a terminal disclaimer.

(21) Appl. No.: 12/941,178

(22) Filed: Nov. 8, 2010

(65) Prior Publication Data
US 2011/0055663 A1    Mar. 3, 2011

Related U.S. Application Data

(63) Continuation of application No. 11/810,989, filed on Jun. 7, 2007, now Pat. No. 7,831,894.

(60) Provisional application No. 60/850,492, filed on Oct. 10, 2006, provisional application No. 60/872,367, filed on Dec. 1, 2006, provisional application No. 60/872,716, filed on Dec. 4, 2006, provisional application No. 60/861,832, filed on Nov. 29, 2006, provisional application No. 60/879,301, filed on Jan. 8, 2007.

(51) Int. Cl.
*H03M 13/00* (2006.01)

(52) U.S. Cl.
USPC ............................................................ 714/794

(58) Field of Classification Search
USPC ................................................................ 714/794
See application file for complete search history.

(56) References Cited

U.S. PATENT DOCUMENTS

| | | | | |
|---|---|---|---|---|
| 5,721,745 | A * | 2/1998 | Hladik et al. | 714/755 |
| 5,734,962 | A * | 3/1998 | Hladik et al. | 455/12.1 |
| 6,023,783 | A * | 2/2000 | Divsalar et al. | 714/792 |
| 6,580,767 | B1 * | 6/2003 | Koehler et al. | 375/341 |
| 6,594,792 | B1 * | 7/2003 | Hladik et al. | 714/755 |
| 6,678,843 | B2 * | 1/2004 | Giulietti et al. | 714/701 |
| 6,715,120 | B1 * | 3/2004 | Hladik et al. | 714/755 |
| 6,775,800 | B2 * | 8/2004 | Edmonston et al. | 714/755 |
| 6,789,218 | B1 * | 9/2004 | Edmonston et al. | 714/701 |
| 6,983,412 | B2 * | 1/2006 | Fukumasa | 714/755 |
| 7,113,554 | B2 * | 9/2006 | Dielissen et al. | 375/341 |
| 7,180,843 | B2 * | 2/2007 | Furuta et al. | 369/59.22 |
| 7,281,198 | B2 * | 10/2007 | Yagihashi | 714/794 |

(Continued)

*Primary Examiner* — Joseph D Torres
(74) *Attorney, Agent, or Firm* — Garlick & Markison; Shayne S. Short

(57) ABSTRACT

Address generation for contention-free memory mappings of turbo codes with ARP (almost regular permutation) interleaves. Anticipatory address generation is employed using an index function ($\mathcal{I}$), that is based on an address mapping ($\mathcal{A}$), which corresponds to an interleave inverse order of decoding processing ($\pi^{-1}$). In accordance with parallel turbo decoding processing, instead of performing the natural order phase decoding processing by accessing data elements from memory bank locations sequentially, the accessing of addresses is performed based on the index function ($\mathcal{I}$), that is based on an mapping and the interleave ($\pi$) employed within the turbo coding. In other words, the accessing data elements from memory bank locations is not sequential for natural order phase decoding processing. The index function ($\mathcal{I}$) also allows for the interleave ($\pi$) order phase decoding processing to be performed by accessing data elements from memory bank locations sequentially.

20 Claims, 30 Drawing Sheets

U.S. PATENT DOCUMENTS

| | | | |
|---|---|---|---|
| 7,302,621 B2 * | 11/2007 | Edmonston et al. | 714/702 |
| 7,530,011 B2 * | 5/2009 | Obuchii et al. | 714/794 |
| 7,720,017 B2 * | 5/2010 | Khan | 370/310 |
| 2006/0101319 A1 * | 5/2006 | Park et al. | 714/755 |

* cited by examiner

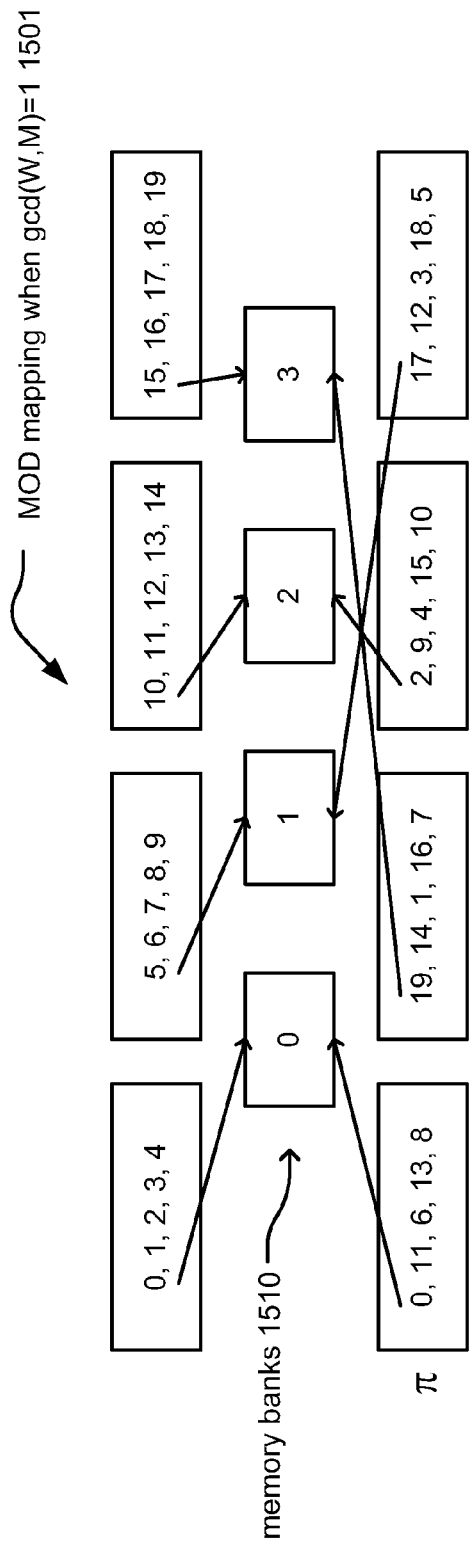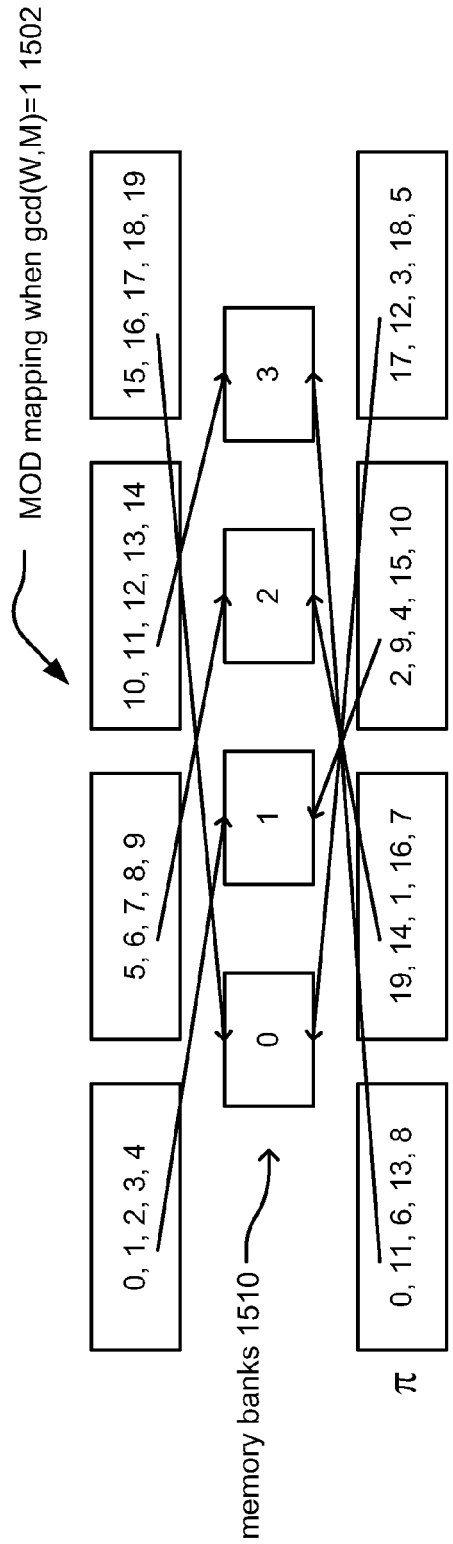
Fig. 15A
Fig. 15B

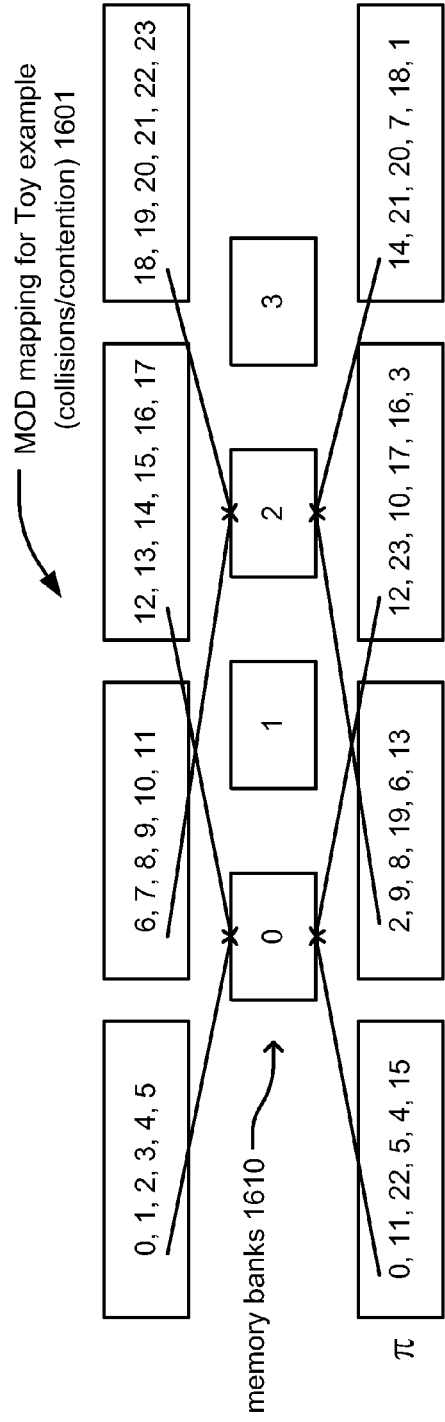
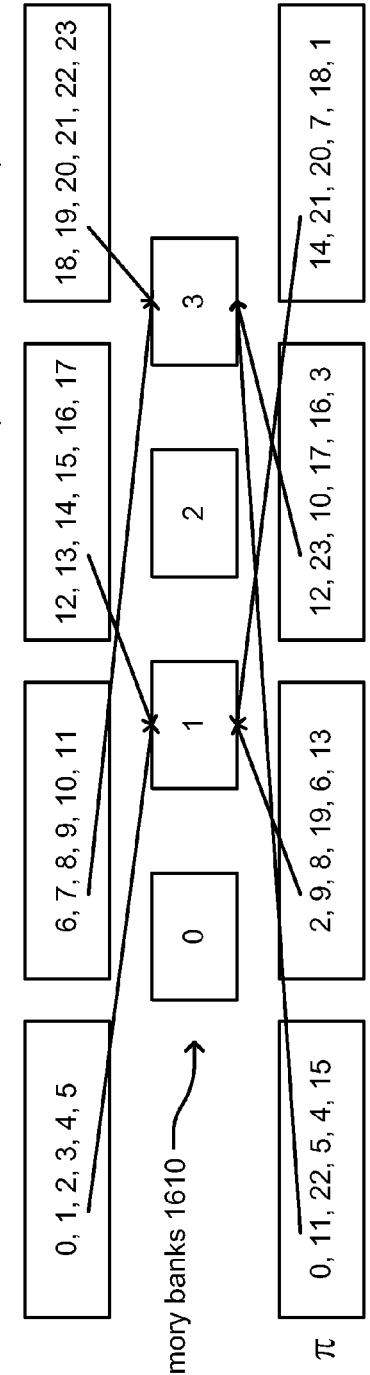
Fig. 16A
Fig. 16B

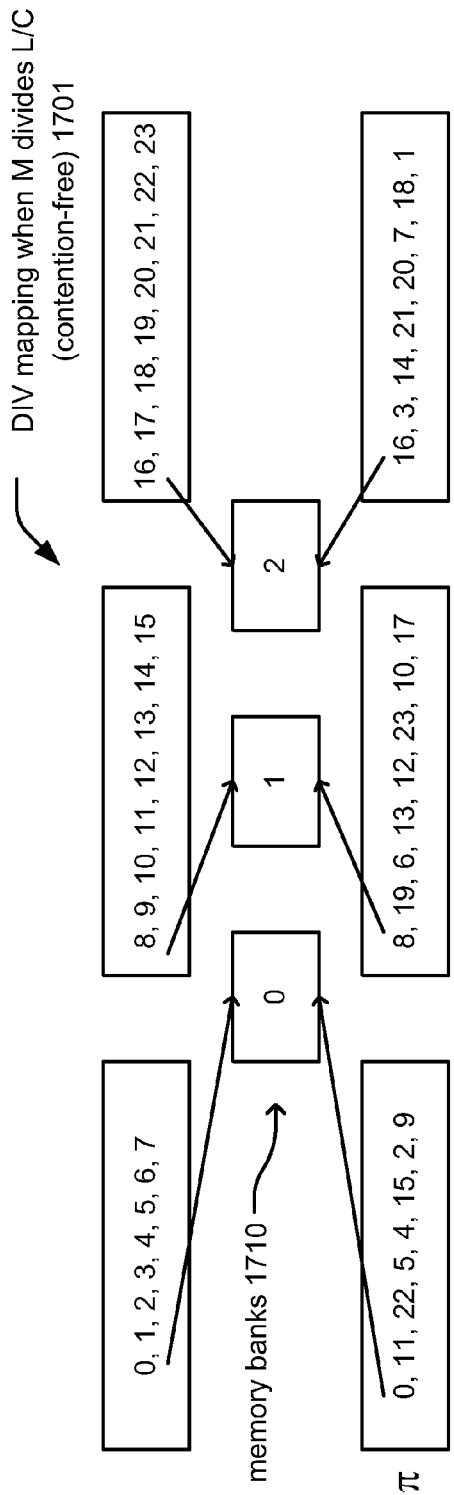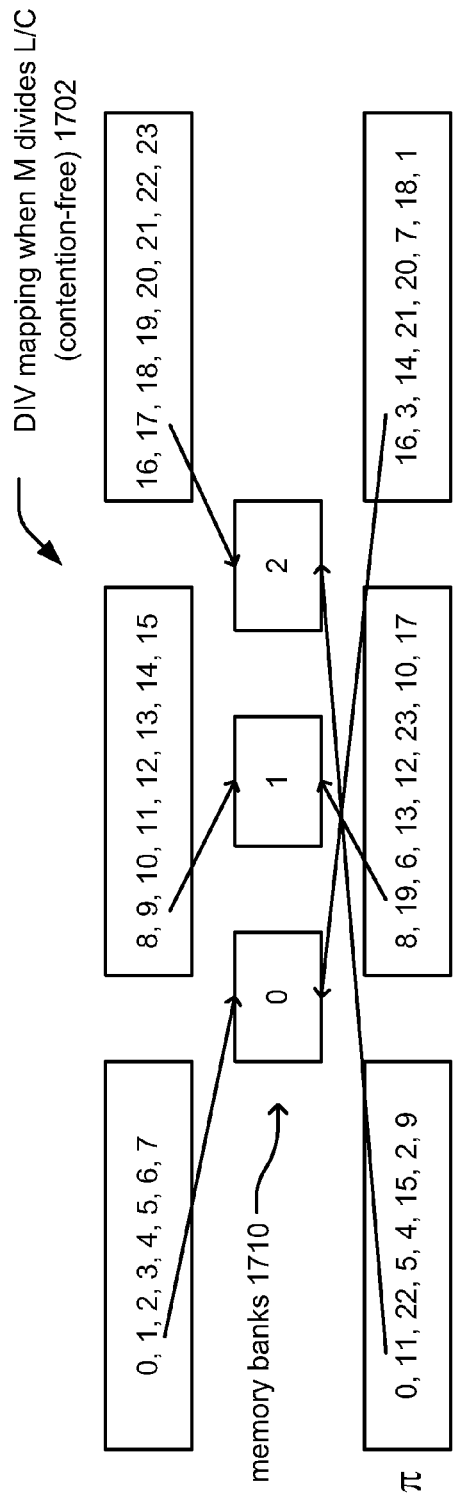
Fig. 17A
Fig. 17B

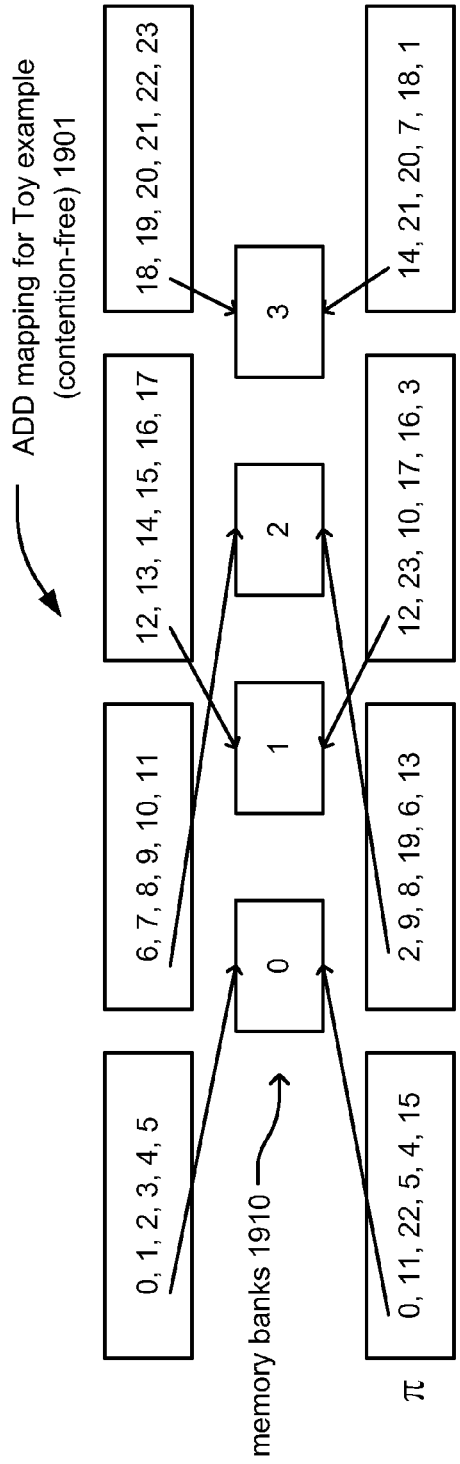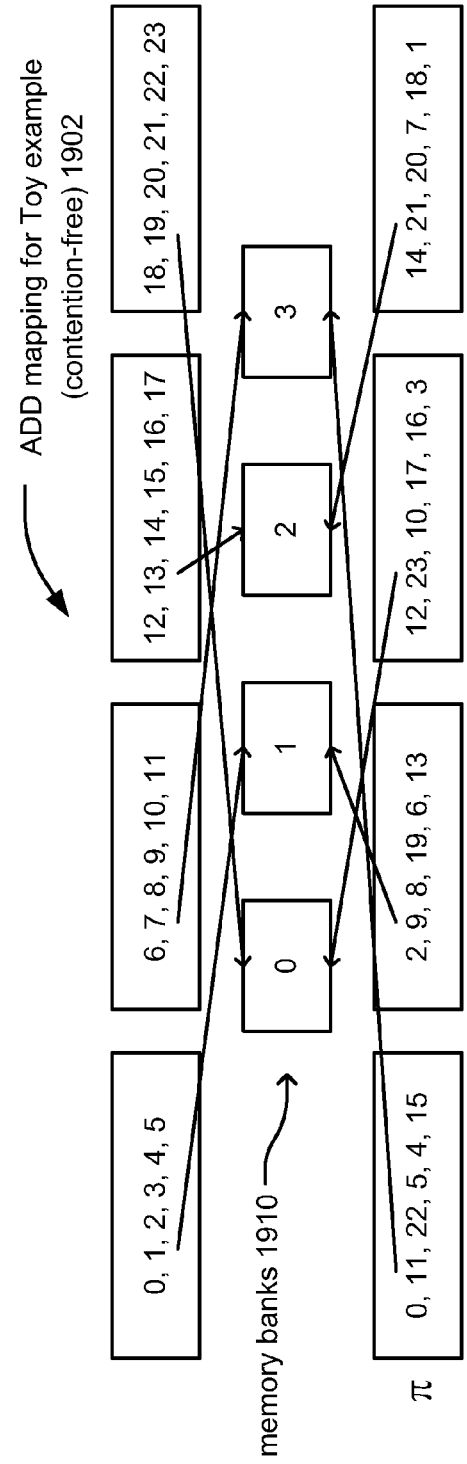

ADDRESS GENERATION FOR CONTENTION-FREE MEMORY MAPPINGS OF TURBO CODES WITH ARP (ALMOST REGULAR PERMUTATION) INTERLEAVES

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility application Ser. No. 11/810,989, entitled "Address generation for contention-free memory mappings of turbo codes with ARP (almost regular permutation) interleaves,"filed Jun. 7, 2007, and scheduled to be issued as U.S. Pat. No. 7,831,894 on Nov. 9, 2010, which claims priority pursuant to 35 U.S.C. §119(e) to the following U.S. Provisional Patent Applications which are hereby incorporated herein by reference in their entirety and made part of the present U.S. Utility patent application for all purposes:
   a. U.S. Provisional Application Ser. No. 60/850,492, entitled "General and algebraic-constructed contention-free memory mapping for parallel turbo decoding with algebraic interleave ARP (almost regular permutation) of all possible sizes,", filed Nov. 10, 2006, now expired.
   b. U.S. Provisional Application Ser. No. 60/872,367, entitled "Turbo decoder employing ARP (almost regular permutation) interleave and inverse thereof as de-interleave," filed Dec. 1, 2006, now expired.
   c. U.S. Provisional Application Ser. No. 60/872,716, entitled "Turbo decoder employing ARP (almost regular permutation) interleave and arbitrary number of decoding processors,"), filed Dec. 4, 2006, now expired.
   d. U.S. Provisional Application Ser. No. 60/861,832, entitled "Reduced complexity ARP (almost regular permutation) interleaves providing flexible granularity and parallelism adaptable to any possible turbo code block size,", filed Nov. 29, 2006, now expired.
   e. U.S. Provisional Application Ser. No. 60/879,301, entitled "Address generation for contention-free memory mappings of turbo codes with ARP (almost regular permutation) interleaves," filed Jan. 8, 2007, now expired.

INCORPORATION BY REFERENCE

The following U.S. Utility patent applications/U.S. patents are hereby incorporated herein by reference in their entirety and made part of the present U.S. Utility patent application for all purposes:

1. U.S. Utility application Ser. No. 11/704,068, entitled "General and algebraic-constructed contention-free memory mapping for parallel turbo decoding with algebraic interleave ARP (almost regular permutation) of all possible sizes," filed Feb. 8, 2007, pending.

2. U.S. Utility application Ser. No. 11/657,819, entitled "Turbo decoder employing ARP (almost regular permutation) interleave and inverse thereof as de-interleave," filed Jan. 25, 2007, pending.

3. U.S. Utility application Ser. No. 11/811,014, entitled "Turbo decoder employing ARP (almost regular permutation) interleave and arbitrary number of decoding processors," filed on Jun. 7, 2007, now U.S. Pat. No. 7,827,473 B2, issued on Nov. 2, 2010.

4. U.S. Utility application Ser. No. 11/811,013, entitled "Reduced complexity ARP (almost regular permutation) interleaves providing flexible granularity and parallelism adaptable to any possible turbo code block size," filed on Jun. 7, 2007, pending.

BACKGROUND OF THE INVENTION

1. Technical Field of the Invention

The invention relates generally to communication systems; and, more particularly, it relates to communication systems employing turbo coding.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 15A and FIG. 15B illustrate embodiments of MOD memory mapping of a plurality of memories memory banks.

FIG. 16A and FIG. 16B illustrate embodiments of MOD memory mapping of a plurality of memories memory banks in accordance with the Toy example, in which collisions occur showing that the memory mapping is not contention-free.

FIG. 17A and FIG. 17B illustrate embodiments of DIV memory mapping of a plurality of memories memory banks.

FIG. 19A and FIG. 19B illustrate embodiments of ADD memory mapping of a plurality of memories memory banks in accordance with the Toy example, in which no collisions occur showing that the memory mapping is contention-free.

DETAILED DESCRIPTION OF THE INVENTION

Many communication systems incorporate the use of a turbo code. While there are many potential applications that can employ turbo codes, means are presented herein that can be applied to the 3GPP channel code to support an arbitrary number of information bits. Some examples of the number of bits that can be supported using the various aspects of the invention presented herein are 40 to 5114 for WCDMA and HSDPA and more for LTE.

Additional information regarding the UTRA-UTRAN Long Term Evolution (LTE) and 3GPP System Architecture Evolution (SAE) can be found at the following Internet web site:

www.3gpp.org

Within the channel coding system in 3GPP LTE, there is a need and desire to supply and provide for a wide range of block sizes (i.e., turbo code block lengths). Furthermore, turbo decoding of this system generally needs to be implemented using a parallel decoding arrangement because of the very high data throughput and large block size desired. The parallel decoding requires the contention-free memory accessing (i.e., any one turbo decoder (of a group of parallel arranged turbo decoders) accesses only one memory (of a group of parallel arranged memories) at any given time).

Turbo coding was suggested for 3GPP LTE channel coding. For this coding system, the algebraic interleave referred to as the "almost regular permutation (ARP)" in reference [1] is considered as one of the candidates.

Figure 1:
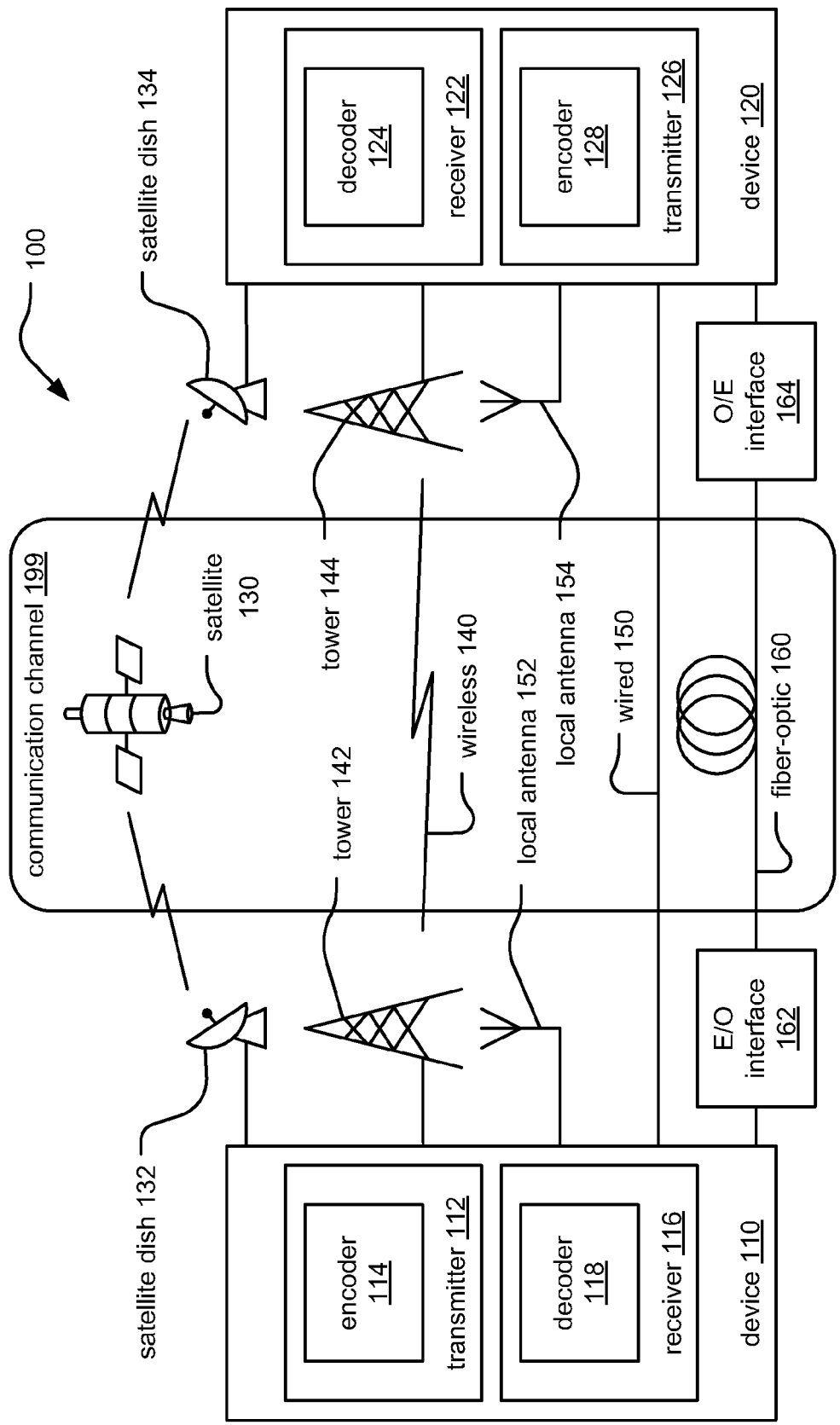
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Figure 2:
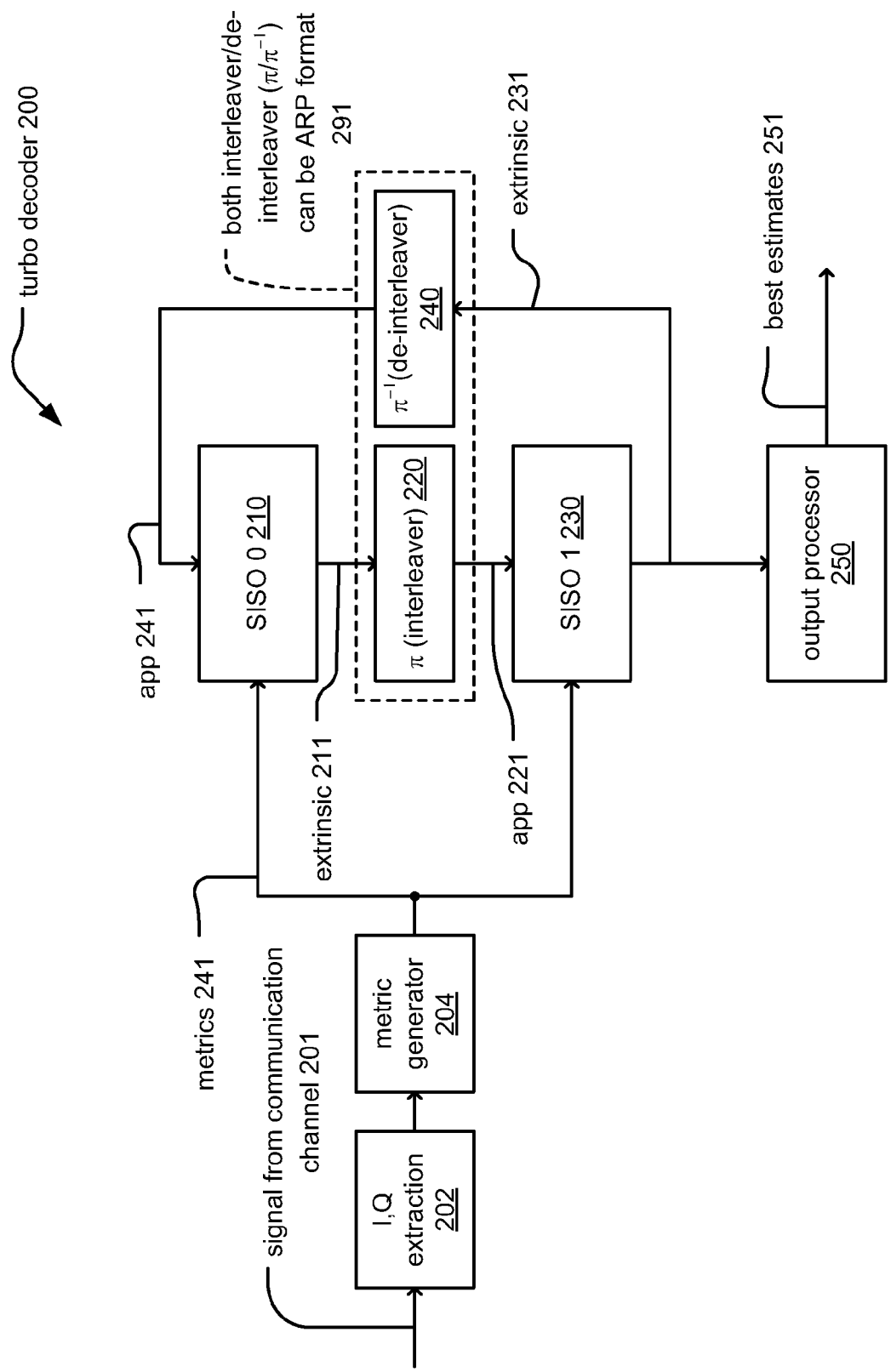
FIG. 2 illustrates an embodiment of a turbo decoder.

FIG. 2 illustrates an embodiment of a turbo decoder 200. A received signal (e.g., typically received from a communication channel) is provided to an I,Q extraction module 202 that extracts the I,Q (in-phase and quadrature) components from the received signal 201. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 204. The metric generator 204 generates the appropriate metrics 241 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 241 that are calculated by the metric generator 204 are then provided simultaneously to a first soft-in/soft-out (SISO 0) decoder 210 and a second SISO 1 decoder 230. In the context of trellis coding (e.g., turbo trellis coded modulation (TTCM)), each of the first SISO 0 decoder 210 and the second SISO 1 decoder 230 calculates forward metrics (alphas) and backward metrics (betas), and extrinsic values according to the trellis employed.

These alphas, betas, and extrinsics are all calculated for each symbol within a frame that is to be decoded. These calculations of alphas, betas, and extrinsics are all based on the trellis.

Starting with the first SISO 0 decoder 210, after the extrinsic values 211 have been calculated, they are passed to an interleaver ($\pi$) 220 after which it is passed to the second SISO 1 decoder 230 as "a priori probability" (app) information 221. Similarly, after extrinsic values 231 have been calculated within the second SISO 1 decoder 230, they are passed to a de-interleaver ($\pi^{-1}$) 240 after which it is passed to the first SISO 0 decoder 210 as "a priori probability" (app) information 241. It is noted that a single decoding iteration, within the iterative decoding process of the turbo decoder 200 consists of performing two SISO operations; that is to say, the iterative decoding process must pass through both the first SISO 0 decoder 210 and through the second SISO 1 decoder 230.

After a significant level of confidence has been achieved and a solution is being converged upon, or after a predetermined number of decoding iterations have been performed, then the output from the second SISO 1 decoder 230 is passed as output to an output processor 250. The operation of the SISOs 210 and 230 may generally be referred to as calculating soft symbol decisions of the symbol contained within the received symbol. These soft symbol decisions may be performed on a true bit level in certain embodiments. The output processor 250 uses these soft symbol decisions to generate best estimates 251 (e.g., hard bit and/or symbol decisions) for the information bits that have been encoded within the original turbo coded signal (e.g., generally within a turbo encoder location at another end of a communication channel into which the signal 201 was originally launched.

It is also noted that each of the interleaving performed within the interleaver ($\pi$) 220 can be performed using an embodiment of an ARP interleave, as shown by reference numeral 291. Also, there are embodiments in which the de-interleaving performed within the de-interleaver ($\pi^{-1}$) 240 can also be performed using an embodiment of an ARP de-interleave.

Many of the embodiments presented herein employ various embodiments of the ARP (almost regular permutation) interleaves. Even more details are provided below with respect to the means by which a structure can be employed to perform both ARP interleaving and ARP de-interleaving. Before doing so, however, a regular permutation is considered for comparative analysis for the reader.

Figure 3:
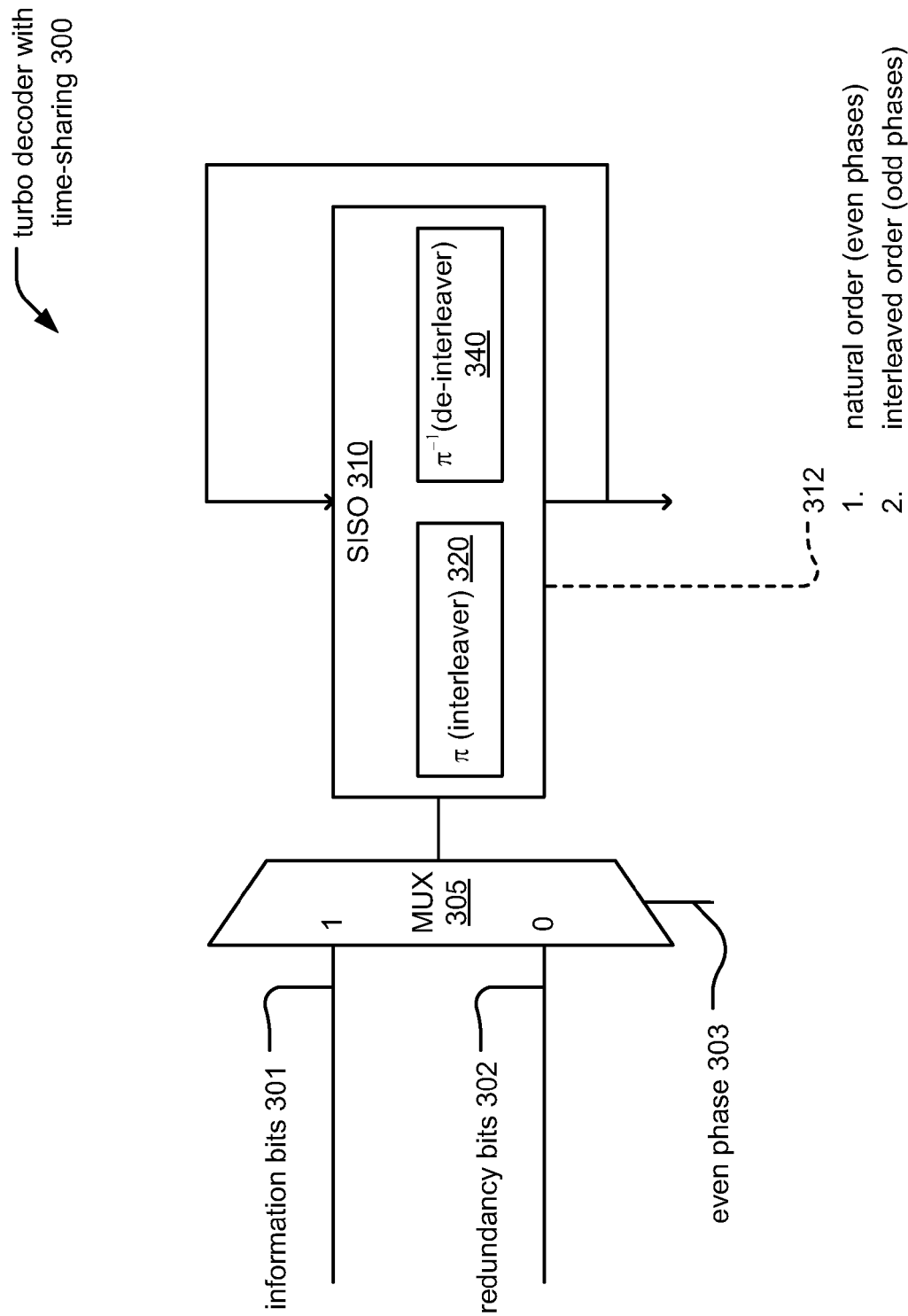
FIG. 3 illustrates an embodiment of a turbo decoder with time-sharing that is operable to employ a single soft-in/soft-out (SISO) decoder or a single array of SISO decoders.

FIG. 3 illustrates an embodiment of a turbo decoder with time-sharing that is operable to employ a single soft-in/soft-out (SISO) decoder or a single array of SISO decoders. This embodiment employs a single SISO decoder or single array of SISO decoders to perform both the SISO 0 and the SISO 1 decoding operations in accordance with turbo decoding processing (or parallel turbo decoding processing). A MUX 305 is operable to receive both information bits 301 and redundancy bits 302 and selectively to provide them to a SISO decoder 310. The SISO decoder 310 of this embodiment also includes an integrated interleaver ($\pi$) 320 and integrated de-interleaver ($\pi^{-1}$) 340. The select signal of the MUX 305 operates according to a signal whose even phase 303 governs the selection of either the information bits 301 or redundancy bits 302 to be provided to the SISO decoder 310 to perform either SISO 0 decoding processing or SISO 1 decoding processing.

In one embodiment, as depicted by reference numeral 312, when performing the natural order phase decoding (e.g., SISO 0 decoding operations), the accessing of memory entries is performed when the select signal 303 indicates an even phase to the MUX 306. Also, when performing the interleaved ($\pi$) order phase decoding (e.g., SISO 1 decoding operations), the accessing of memory entries is performed when the select signal 303 indicates an odd phase to the MUX 306.

Figure 4:
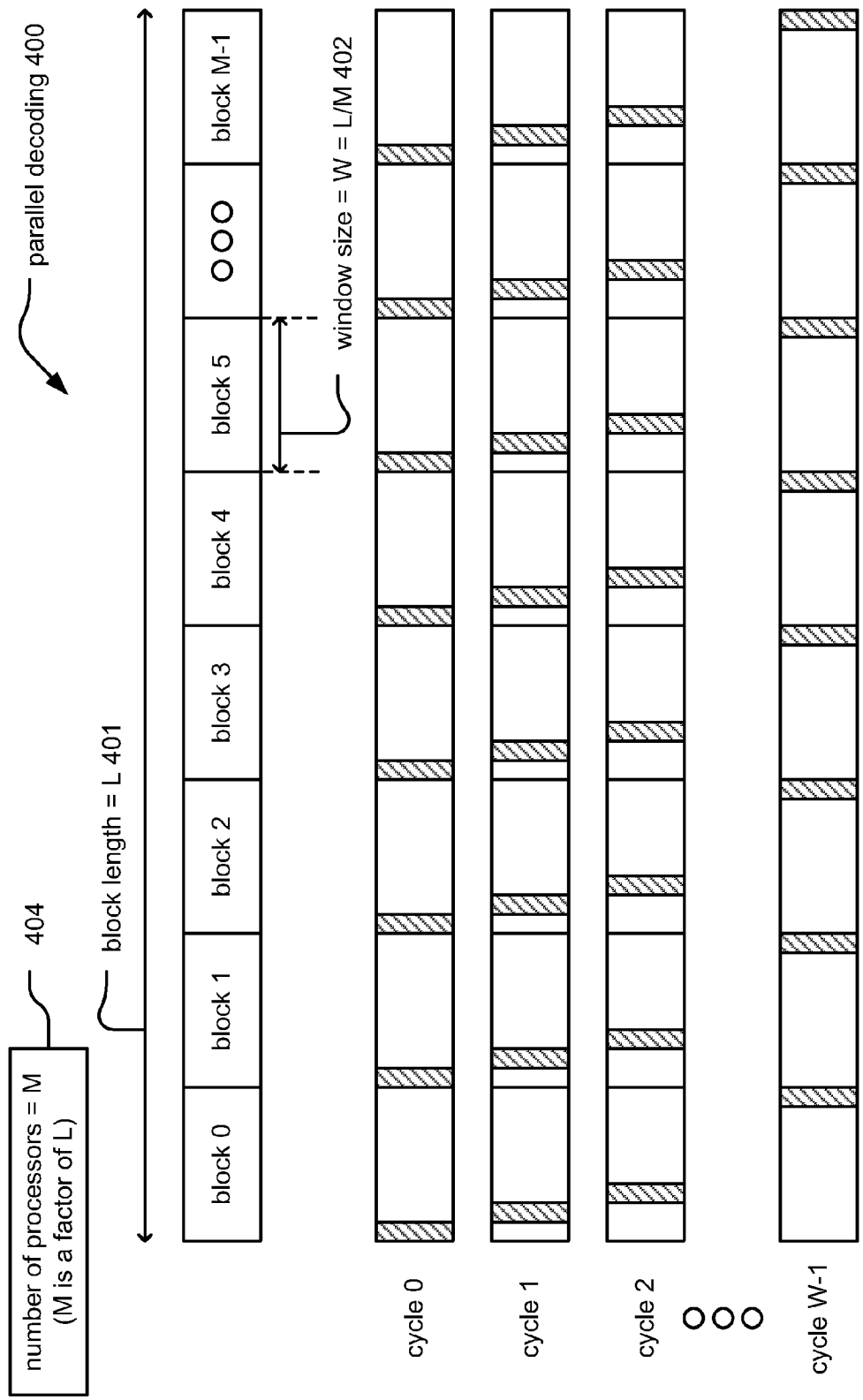
FIG. 4 illustrates an embodiment of a parallel decoding as can be applied within turbo decoding.

FIG. 4 illustrates an embodiment 400 of a parallel decoding as can be applied within turbo decoding. As can be seen, the block length 401 of an information block within the turbo coded signal is shown as L. This can also be referred to as an encoded block which will undergo turbo decoding. The block is subdivided into a plurality of windows, such that each window has size W=L/M, as shown by reference numeral 402. The number of processors arranged in a parallel decoding implementation is shown as M (as shown by reference numeral 404), and it is noted that M is a factor of L (i.e., M divides L with no remainder).

During a cycle 0 (i.e., a first decoding iteration within the iterative decoding processing of turbo decoding), a first portion of each window is processed, as shown by the corresponding shaded portions of each window. Then, during a cycle 1 (i.e., a second decoding iteration within the iterative decoding processing of turbo decoding), a second portion of each window is processed, as shown by the corresponding shaded portions of each window. This continues on until during a cycle W−1 (i.e., a final decoding iteration within the iterative decoding processing of turbo decoding), a final portion of each window is processed, as shown by the corresponding shaded portions of each window.

During each cycle, a given portion of each window is processed using one decoding processor (e.g., one turbo decoder) in a parallel implementation of a plurality of decoding processor (e.g., a plurality of turbo decoders).

Figure 5:
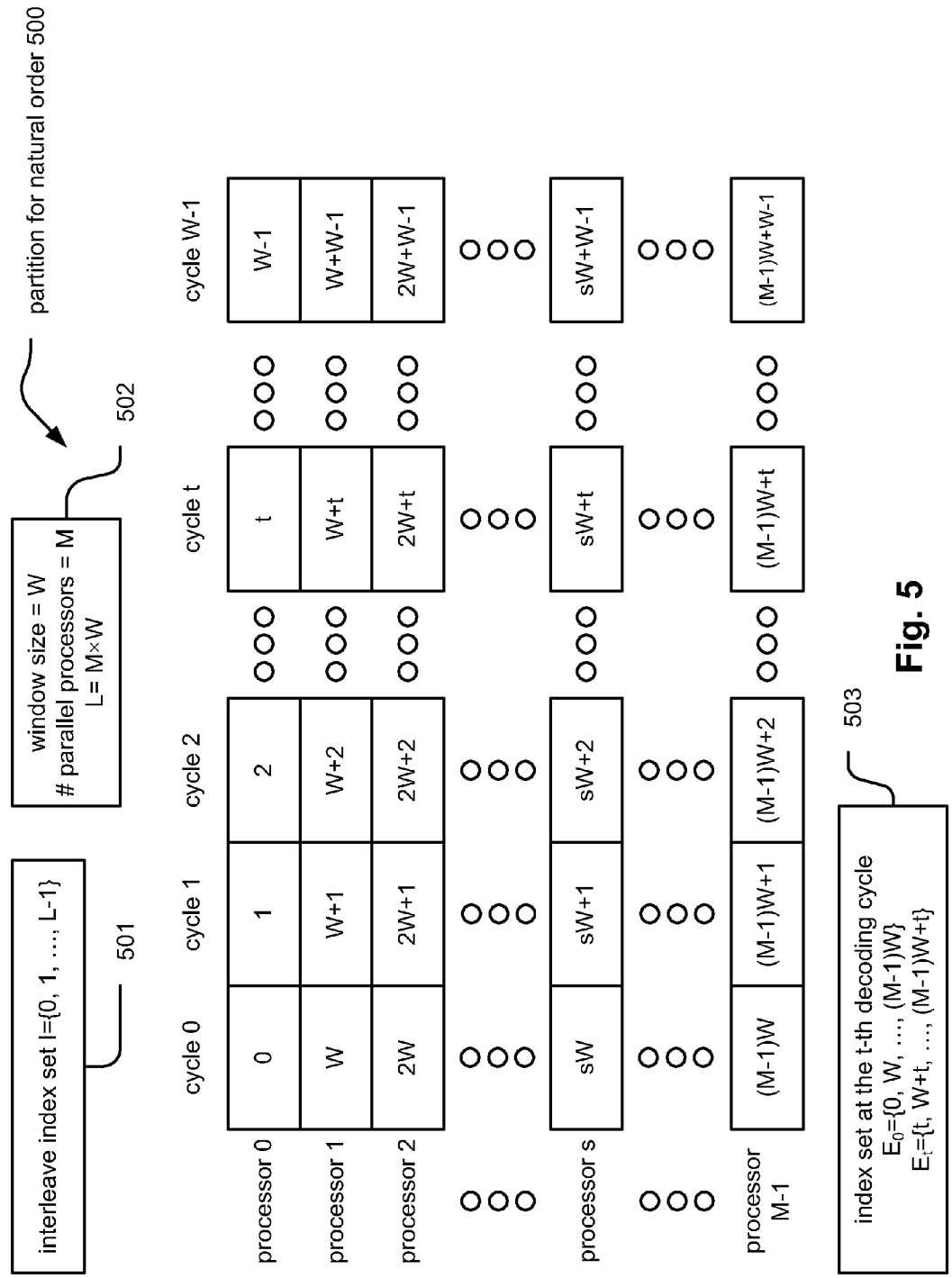
FIG. 5 illustrates an embodiment of a partitioning of decoding processors (as implemented within parallel decoding of turbo coded signals) for natural/non-interleaved order.

FIG. 5 illustrates an embodiment 500 of a partitioning of decoding processors (as implemented within parallel decoding of turbo coded signals) for natural/non-interleaved order. This diagram corresponds to FIG. 4 as well. For example, the window size, W, number of processors, M, and block length, L, conventions are the same as the previous embodiment, as shown by reference numeral 502 (i.e., W=L/M or M·W=L). In addition, the interleave index is shown as reference numeral 501, I={0, 1, . . . , L−1}.

In accordance with the parallel turbo decoding processing which involves employing M decoding processors, during a cycle 0 (i.e., a first decoding iteration within the iterative decoding processing of turbo decoding), the respective first portions of each window that are processed are as follows:

1. processor 0 processes portion 0 of the information block.
2. processor 1 processes portion W of the information block.
3. processor 2 processes portion 2W of the information block.
. . .
s. processor s processes portion 2W of the information block (s is an integer).
. . .
M−1. processor M−1 processes portion (M−1)W of the information block.

During a cycle 1 (i.e., a second decoding iteration within the iterative decoding processing of turbo decoding), the respective second portions of each window that are processed are as follows:

1. processor 0 processes portion 1 of the information block.
2. processor 1 processes portion W+1 of the information block.
3. processor 2 processes portion 2W+1 of the information block.
. . .
s. processor s processes portion sW+1 of the information block (s is an integer).
. . .
M−1. processor M−1 processes portion (M−1)W+1 of the information block.

This process continues on until during a cycle W−1 (i.e., a final decoding iteration within the iterative decoding processing of turbo decoding), the respective second portions of each window that are processed are as follows:

1. processor 0 processes portion W−1 of the information block.
2. processor 1 processes portion W+W−1 of the information block.
3. processor 2 processes portion W+2W−1 of the information block.
. . .
s. processor s processes portion sW+W−1 of the information block (s is an integer).
. . .
M−1. processor M−1 processes portion (M−1)W+−1 of the information block.

The index that is set at the t-th decoding cycle is as follows (as also shown by reference numeral 503):

$$E_0=\{0, W, \ldots, (M-1)W\}, \text{ and}$$

$$E_t=\{t, W+t, \ldots, (M-1)W+t\}.$$

Figure 6:
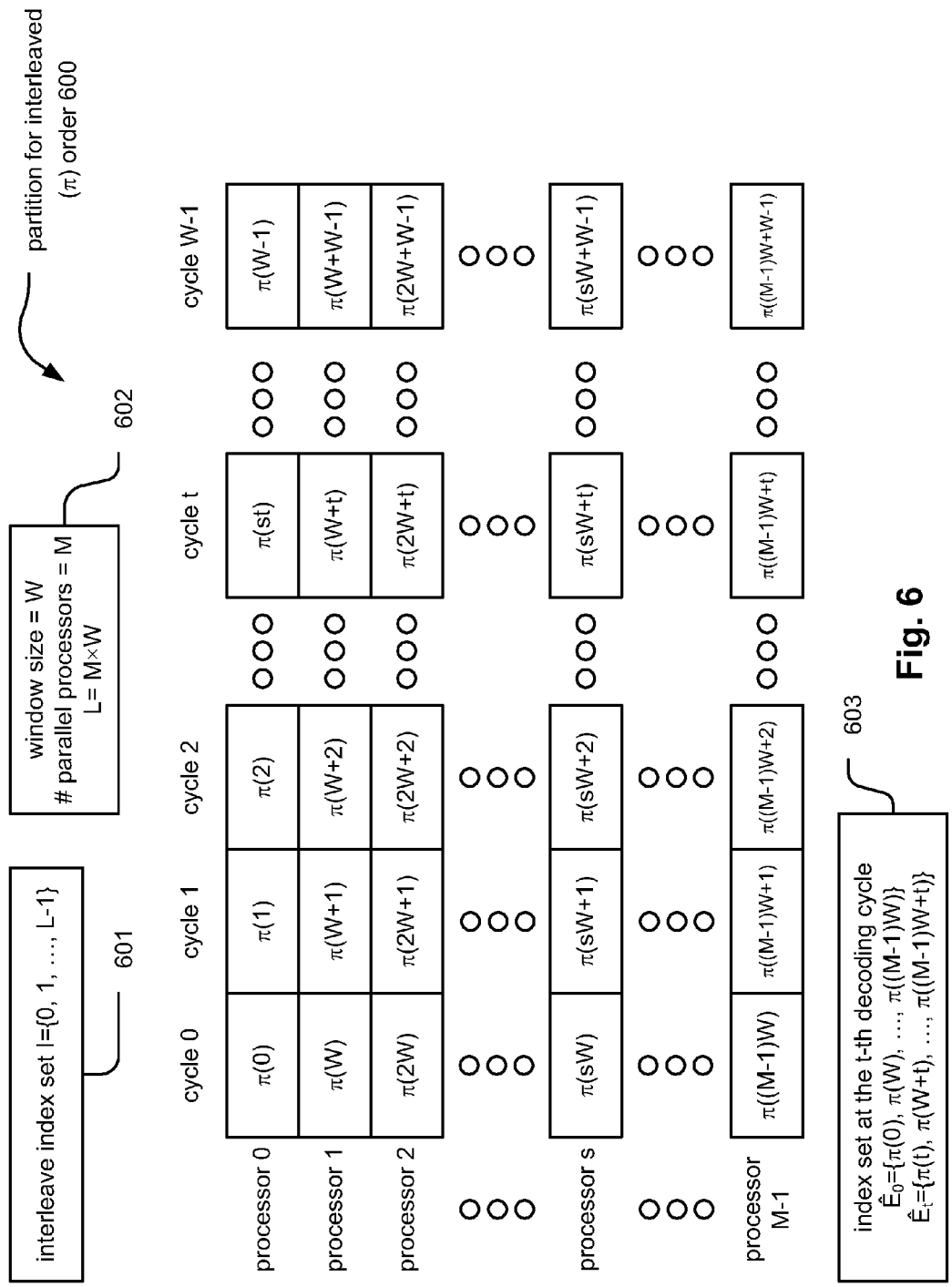
FIG. 6 illustrates an embodiment of a partitioning of decoding processors (as implemented within parallel decoding of turbo coded signals) for interleaved ($\pi$) order.

FIG. 6 illustrates an embodiment of a partitioning of decoding processors 600 (as implemented within parallel decoding of turbo coded signals) for interleaved (π) order. This diagram corresponds to FIG. 4 as well. For example, the window size, W, number of processors, M, and block length, L, conventions are the same as the previous embodiment, as shown by reference numeral 602 (i.e., W=L/M or M·W=L). In addition, the interleave index is shown as reference numeral 601, I={0, 1, . . . , L−1}.

In accordance with the parallel turbo decoding processing which involves employing M decoding processors, during a cycle 0 (i.e., a first decoding iteration within the iterative decoding processing of turbo decoding), the respective first portions of each window that are processed are as follows (note: these are the interleaved (π) portions):

1. processor 0 processes portion π(0) of the information block.
2. processor 1 processes portion π(W) of the information block.
3. processor 2 processes portion π(2W) of the information block.
. . .
s. processor s processes portion π(sW) of the information block (s is an integer).
. . .
M−1. processor M−1 processes portion π((M−1)W) of the information block.

During a cycle 1 (i.e., a second decoding iteration within the iterative decoding processing of turbo decoding), the respective second portions of each window that are processed are as follows:

1. processor 0 processes portion π(1) of the information block.
2. processor 1 processes portion π(W+1) of the information block.
3. processor 2 processes portion π(2W+1) of the information block.
. . .
s. processor s processes portion π(sW+1) of the information block (s is an integer).
. . .
M−1. processor M−1 processes portion π((M−1)W+1) of the information block.

This process continues on until during a cycle W−1 (i.e., a final decoding iteration within the iterative decoding processing of turbo decoding), the respective second portions of each window that are processed are as follows:

1. processor 0 processes portion $\pi(W-1)$ of the information block.
2. processor 1 processes portion $\pi(W+W-1)$ of the information block.
3. processor 2 processes portion $\pi(2W+W-1)$ of the information block.
...
s. processor s processes portion $\pi(sW+W-1)$ of the information block (s is an integer).
...
M−1. processor M−1 processes portion $\pi((M-1)W+W-1)$ of the information block.

The index that is set at the t-th decoding cycle is as follows (as also shown by reference numeral 603):

$$\hat{E}_0 = \{\pi(0), \pi(W), \ldots, \pi((M-1)W)\}, \text{ and}$$

$$\hat{E}_t = \{\pi(t), \pi(W+t), \ldots, \pi((M-1)W+t)\}.$$

Memory mapping $\mathcal{M}$ is contention-free is the following relationship holds:

$$i, i' \in \hat{E}_t, i \neq i' \Rightarrow \mathcal{M}(i) \neq \mathcal{M}(i')$$

$$j, j', j \neq j' \in \hat{E}_t \Rightarrow \mathcal{M}(j) \neq \mathcal{M}(j')$$

It is noted that the elements in the index set of the t-th cycle should be mapped to different memory banks (e.g., different memories within a plurality of memories provisioned to service a plurality of parallel arranged turbo decoders).

Figure 7A:
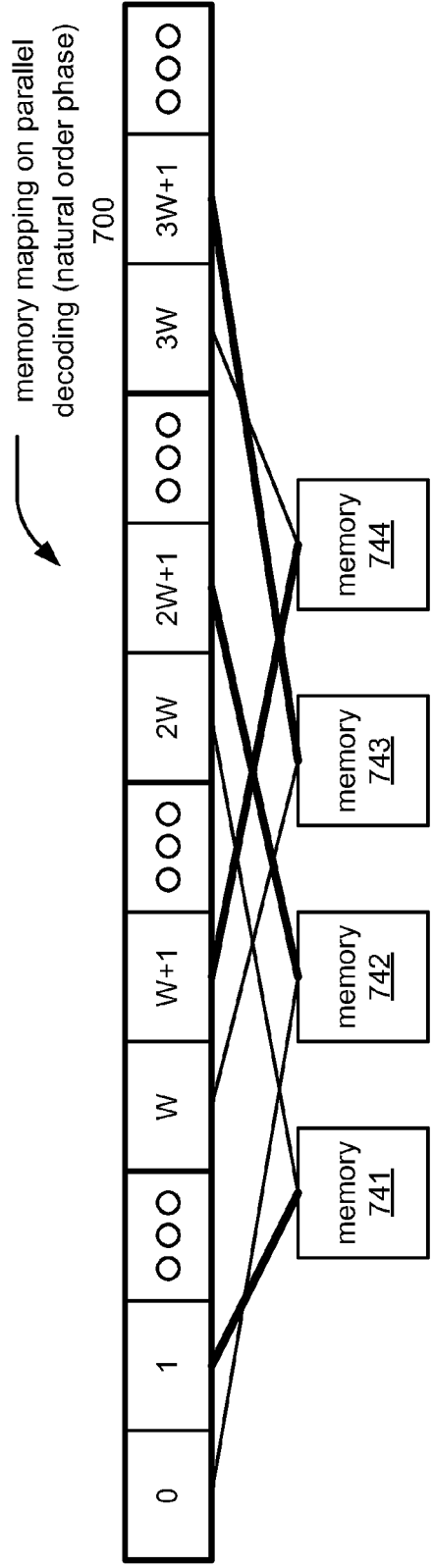
FIG. 7A illustrates an embodiment of memory mapping on parallel decoding for natural/non-interleaved order phase.

FIG. 7A illustrates an embodiment of memory mapping on parallel decoding 700 for natural/non-interleaved order phase.

Figure 7B:
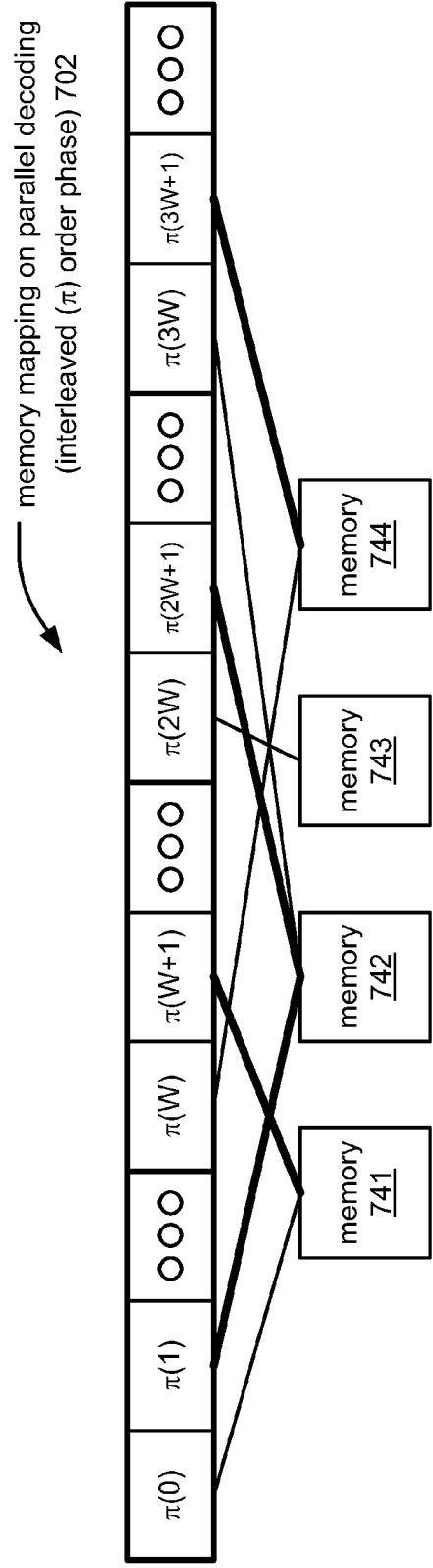
FIG. 7B illustrates an embodiment of memory mapping on parallel decoding for interleaved ($\pi$) order (showing contention in one of the memories.

FIG. 7B illustrates an embodiment of memory mapping on parallel decoding 702 for interleaved ($\pi$) order (showing contention in one of the memories.

FIG. 7A and FIG. 7B should be considered in conjunction with one another. Each of these embodiments 700 and 702 employ 4 memory banks (as depicted by memory 741, memory 743, memory 743, and memory 744). An encoded block is shown as being partitioned into a plurality of sub-blocks. This particular encoded block includes 4W data locations.

In the natural-order phase, the first sub-block begins with data location 0, 1, and up to W−1. The second sub-block begins with data location W, W+1, and continues up to 2W−1. The third sub-block begins with data location 2W, 2W+1, and continues up to 3W−1. The third sub-block begins with data location 2W, 2W+1, and continues up to 3W−1. The fourth sub-block begins with data location 3W, 3W+1, and continues up to 4W−1.

In cycle 0, the first data of the first sub-block (i.e., the data in location 0) is stored in the first location of memory 742.

In cycle 0, the first data of the second sub-block (i.e., the data in location W) is stored in the first location of memory 743.

In cycle 0, the first data of the third sub-block (i.e., the data in location 2W) is stored in the first location of memory 741.

In cycle 0, the first data of the fourth sub-block (i.e., the data in location 3W) is stored in the first location of memory 744.

In cycle 1, the second data of the first sub-block (i.e., the data in location 1) is stored in the second location of memory 741.

In cycle 1, the second data of the second sub-block (i.e., the data in location W+1) is stored in the second location of memory 744.

In cycle 1, the second data of the third sub-block (i.e., the data in location 2W+1) is stored in the second location of memory 742.

In cycle 1, the second data of the fourth sub-block (i.e., the data in location 3W+1) is stored in the second location of memory 743.

This process continues until all data elements of the encoded block have been stored into corresponding memory locations within each of the 4 memory banks. The placement of into which memory bank a particular data element is to be stored depends on the mapping employed.

After undergoing interleaving ($\pi$), the interleaved encoded block also is shown as being partitioned into a plurality of sub-blocks. This particular encoded block includes 4W data locations.

In the interleaved-order phase, the first sub-block begins with data location $\pi(0)$, $\pi(1)$, and up to $\pi(W-1)$. The second sub-block begins with data location $\pi(W)$, $\pi(W+1)$, and continues up to $\pi(2W-1)$. The third sub-block begins with data location $\pi(2W)$, $\pi(2W+1)$, and continues up to $\pi(3W-1)$. The third sub-block begins with data location $\pi(2W)$, $\pi(2W+1)$, and continues up to $\pi(3W-1)$. The fourth sub-block begins with data location $\pi(3W)$, $\pi(3W+1)$, and continues up to $\pi(4W-1)$.

In cycle 0, the first data of the first sub-block (i.e., the data in location $\pi(0)$) is stored in the a location of memory 741 as governed by the particular interleave and mapping employed.

In cycle 0, the first data of the second sub-block (i.e., the data in location $\pi(W)$) is stored in a location of memory 744 as governed by the particular interleave and mapping employed.

In cycle 0, the first data of the third sub-block (i.e., the data in location $\pi(2W)$) is stored in a location of memory 743 as governed by the particular interleave and mapping employed.

In cycle 0, the first data of the fourth sub-block (i.e., the data in location $\pi(3W)$) is stored in the a of memory 742 as governed by the particular interleave and mapping employed.

In cycle 1, the second data of the first sub-block (i.e., the data in location $\pi(1)$) is stored in a location of memory 742 as governed by the particular interleave and mapping employed.

In cycle 1, the second data of the second sub-block (i.e., the data in location $\pi(W+1)$) is stored in a location of memory 741 as governed by the particular interleave and mapping employed.

In cycle 1, the second data of the third sub-block (i.e., the data in location $\pi(2W+1)$) is stored in a location of memory 742 as governed by the particular interleave and mapping employed.

In cycle 1, the second data of the fourth sub-block (i.e., the data in location $\pi(3W+1)$) is stored in a location of memory 744 as governed by the particular interleave and mapping employed.

This process continues until all data elements of the elements of the interleaved encoded block have been stored into corresponding memory locations within each of the 4 memory banks. The placement of into which memory bank a particular data element is to be stored depends on the mapping employed.

Note that this mapping is not contention-free since in cycle 1 of the interleaved-order phase, the second data of the first sub-block (i.e., the data in location {pi}(1)) and the second data of the third sub-block (i.e., the data in location {pi}(2W+1)) both map to the same memory 742.

Figure 8:
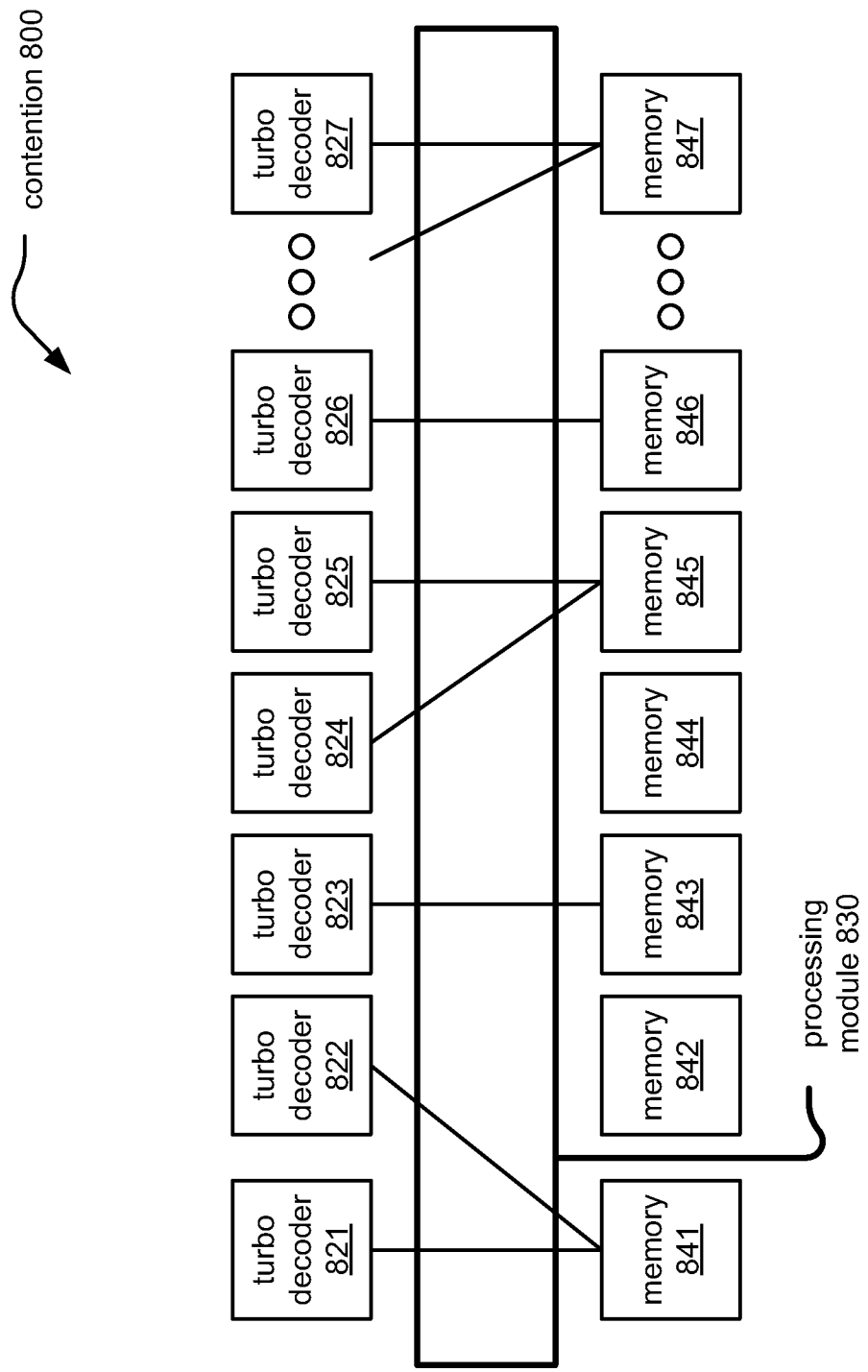
FIG. 8 illustrates an embodiment of a turbo decoder that performs parallel decoding in which contention occurs because of a lack of contention-free memory mapping between turbo decoders and memories.

FIG. 8 illustrates an embodiment of a turbo decoder 800 that performs parallel decoding in which contention occurs because of a lack of contention-free memory mapping between turbo decoders and memories.

This turbo decoder 800 includes a plurality of turbo decoders 821-827, a plurality of memories 841-847, and a processing module 830 that is operable to perform the memory mapping between the plurality of turbo decoders 821-827 and the plurality of memories 841-847. As can be seen, more than one turbo decoders tries to access a same memory at a given time. Specifically, turbo decoder 821 and turbo decoder 822 are trying to access memory 841, and turbo decoder 824 and turbo decoder 825 are trying to access memory 845. Also, turbo decoder 827 and another turbo decoder (included in the region as shown by the ellipsis . . . ) are trying to access memory 847. This creates conflicts and incurs deleterious performance.

Figure 9:
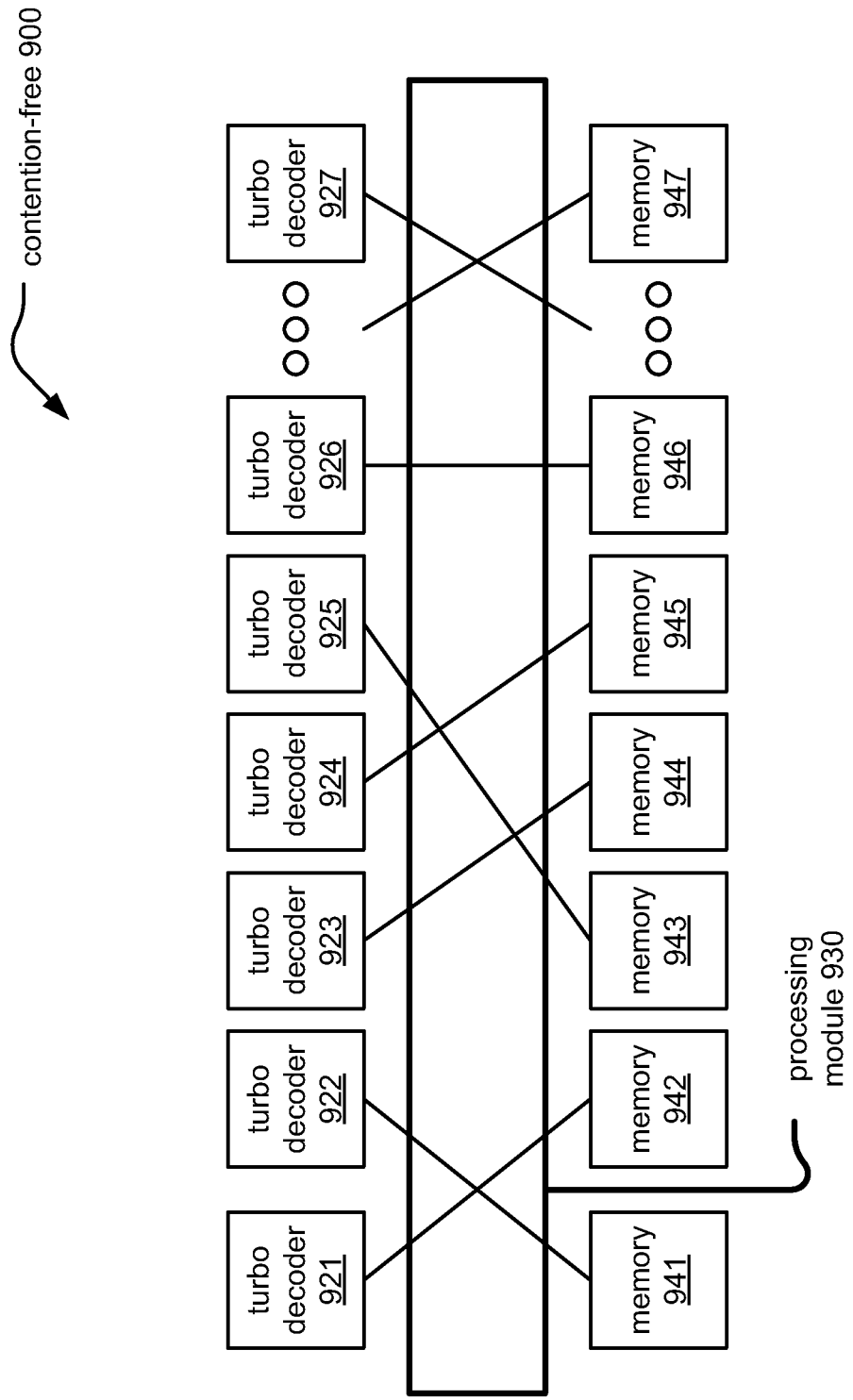
FIG. 9 illustrates an embodiment of a turbo decoder that performs parallel decoding in which no contention occurs because of contention-free memory mapping between turbo decoders and memories.

FIG. 9 illustrates an embodiment of a turbo decoder 900 that performs parallel decoding in which no contention occurs because of contention-free memory mapping between turbo decoders and memories.

This turbo decoder 900 includes a plurality of turbo decoders 921-927, a plurality of memories 941-947, and a processing module 930 that is operable to perform contention-free memory mapping between the plurality of turbo decoders 921-927 and the plurality of memories 941-947. As can be seen, only one turbo decoder accesses any one memory at a given time. This is a truly contention-free memory mapping between the plurality of turbo decoders 921-927 and the plurality of memories 941-947.

Figure 10:
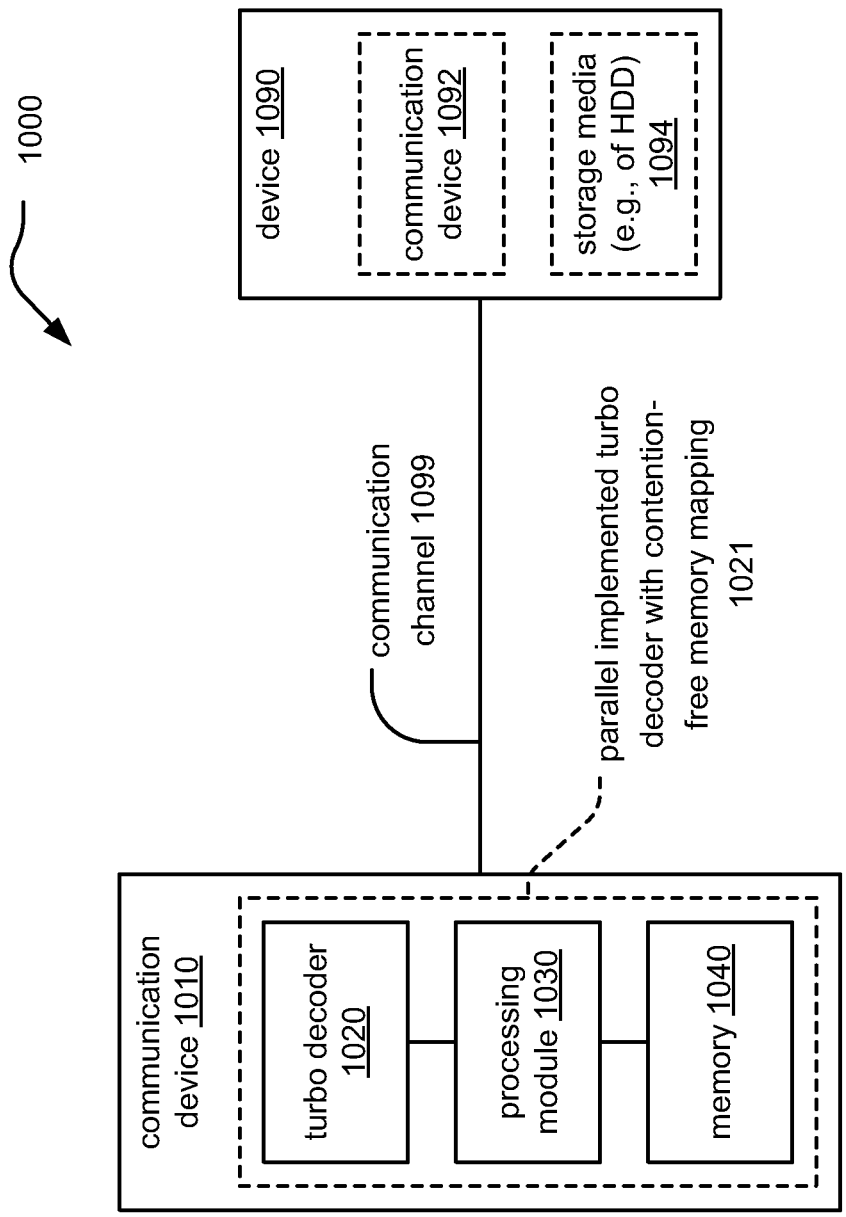
FIG. 10 and FIG. 11 illustrate other embodiments of a communication system.
Figure 11:
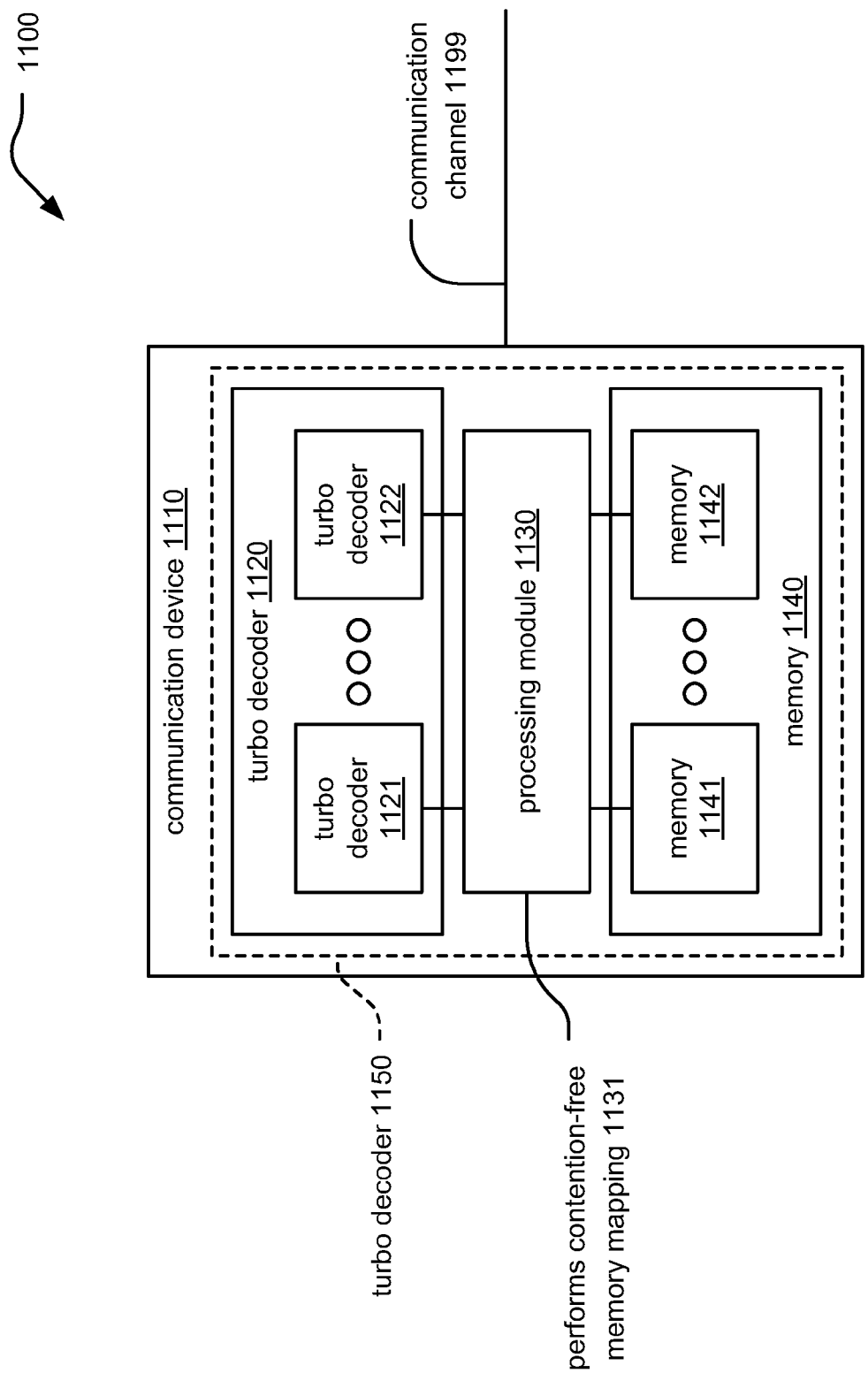
Figures 12A, 12B, 12C, 12D:
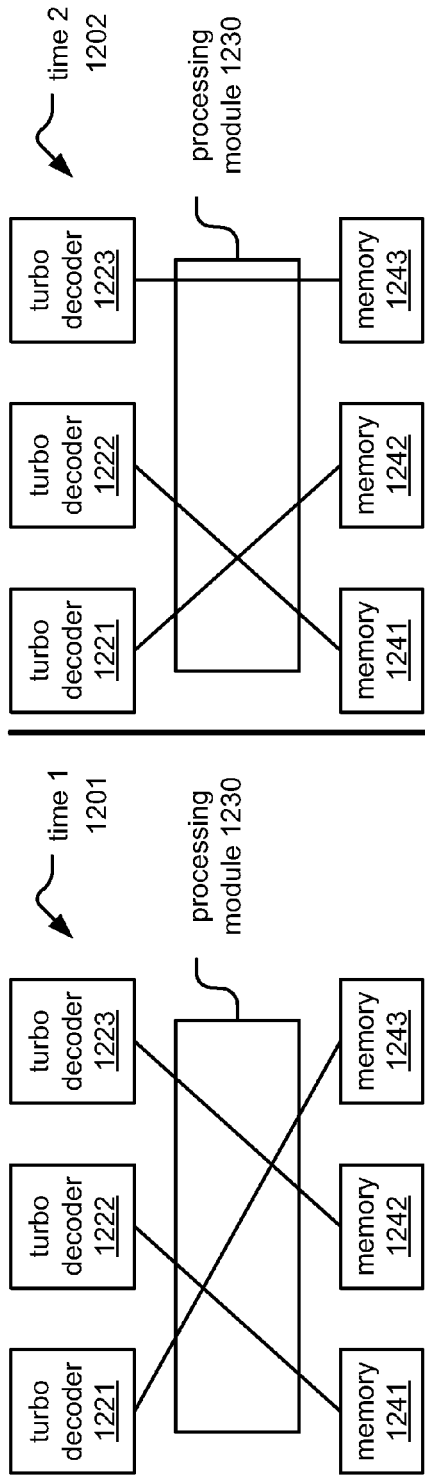
FIG. 12A, FIG. 12B, FIG. 12C, and FIG. 12D illustrates various, successive contention-free memory mappings between turbo decoders and memories.

FIG. 10 and FIG. 11 illustrate other embodiments of a communication system. Referring to the communication system 1000 of FIG. 10, the communication system 1000 includes a communication device 1010 that is coupled to another device 1090 via a communication channel 1099. The communication device 1010 includes a decoder 1021 that is implemented as a parallel implemented turbo decoder that is operable to employ contention-free memory mapping.

The other device 1090 to which the communication device 1010 is coupled via the communication channel 1099 can be another communication device 1092, a storage media 1094 (e.g., such as within the context of a hard disk drive (HDD)), or any other type of device that is capable to receive and/or transmit signals. In some embodiments, the communication channel 1099 is a bi-directional communication channel that is operable to perform transmission of a first signal during a first time and receiving of a second signal during a second time. If desired, full duplex communication may also be employed, in which each of the communication device 1010 and the device 1090 can be transmitted and/or receiving from one another simultaneously.

The decoder 1021 of the communication device 1010 includes a turbo decoder 1020, a processing module 1030, and a memory 1040. The processing module 1030 can be coupled to the memory 1040 so that the memory is operable to store operational instructions that enable to the processing module 1030 to perform certain functions.

Generally speaking, the processing module 1030 is operable to perform contention-free memory mapping between the turbo decoder 1020 and the memory 1040 during iterative decoding processing.

It is also noted that the processing module 1030, as well as any other processing module described herein, can be implemented in any number of ways as described below. In one embodiment, the processing module 1030 can be implemented strictly as circuitry. Alternatively, the processing module 1030 can be implemented strictly in software such as can be employed within a digital signal processor (DSP) or similar type device. In even another embodiment, the processing module 1030 can be implemented as a combination of hardware and software as well without departing from the scope and spirit of the invention.

In even other embodiments, the processing module 1030 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 1030 can be coupled to the memory 1040 that is operable to store operational instructions that enable to processing module 1030 to perform the appropriate contention-free memory mapping between the turbo decoder 1020 and the memory 1040.

Such a memory 1040 may be a single memory device or a plurality of memory devices. Such a memory 1040 may be a read-only memory, random access memory, volatile memory, non-volatile memory, static memory, dynamic memory, flash memory, and/or any device that stores digital information. Note that when the processing module 1030 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Referring to the communication system 1100 of FIG. 11, this embodiment is somewhat analogous to the previous embodiment. The communication system 1100 includes a communication device 1110 that can be coupled to another device via a communication channel 1199. The communication device 1110 includes a turbo decoder 1120 that is itself composed of a plurality of turbo decoders 1121-1122. The communication device 1110 also includes a memory 1140 that is itself composed of a plurality of memories 1141-1142. A processing module 1130 is operable to perform contention-free memory mapping between the plurality of turbo decoders 1121-1122 and the plurality of memories 1141-1142 during iterative decoding processing of a turbo coded signal.

FIG. 12A, FIG. 12B, FIG. 12C, and FIG. 12D illustrates various, successive contention-free memory mappings between turbo decoders and memories. These 4 diagrams should be considered in conjunction with one another.

A communication device includes a turbo decoder that is itself composed of a plurality of turbo decoders 1221, 1222, and 1223. Such a communication device also includes a memory that is itself composed of a plurality of memories 1241, 1242, and 1243. A processing module 1230 is operable to perform contention-free memory mapping between the plurality of turbo decoders 1221, 1222, and 1223 and the plurality of memories 1241, 1242, and 1243 during iterative decoding processing of a turbo coded signal.

At any given time, the processing module 1230 is operable to ensure that only one turbo decoder accesses a given memory at a given time. For example, a processing module 1230 is operable to perform a first contention-free memory mapping at a time 1, as shown by reference numeral 1201. The processing module 1230 is operable to perform a second contention-free memory mapping at a time 2, as shown by reference numeral 1202. The processing module 1230 is operable to perform a third contention-free memory mapping at a time 3, as shown by reference numeral 1203. The processing module 1230 is operable to perform a fourth contention-free memory mapping at a time 4, as shown by reference numeral 1204. As can be seen, only one turbo decoder is connected to any one memory at any given time in each of these 4 diagrams.

As can be seen, the contention-free memory mapping between the turbo decoders 1221, 1222, and 1223 and the plurality of memories 1241, 1242, and 1243 changes as a function of time during iterative decoding processing of a turbo coded signal.

Figures 13A, 13B:
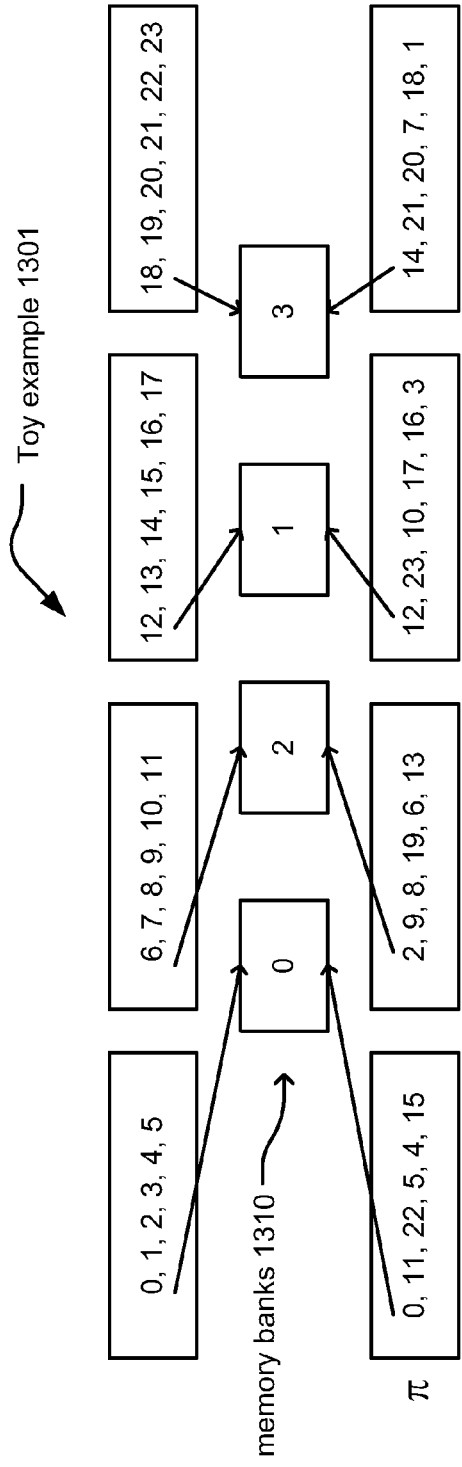
FIG. 13A and FIG. 13B illustrate embodiments of the Toy example of a plurality of processors and a plurality of memories memory banks employed to perform parallel turbo decoding processing.

FIG. 13A and FIG. 13B illustrate embodiments of the Toy example, 1301 and 1302, respectively, of a plurality of processors and a plurality of memories memory banks employed to perform parallel turbo decoding processing.

Each of these embodiments 1301 and 1302 employ a plurality of memory banks 1310 that includes 4 memory banks.

During a first decoding cycle, the memory mapping as shown in embodiment 1301 is as follows for the natural order when performing turbo decoding processing.

$E_0=\{0,6,12,18\} \rightarrow \{0,2,1,3\}$

Also during the first decoding cycle, the memory mapping as shown in embodiment 1301 is as follows for the interleaved ($\pi$) order when performing turbo decoding processing.

$\hat{E}_0=\{0,2,12,14\} \rightarrow \{0,2,1,3\}$

During a second decoding cycle, the memory mapping as shown in embodiment 1302 is as follows for the natural order when performing turbo decoding processing.

$E_1=\{1,7,13,19\} \rightarrow \{1,3,2,0\}$

Also during the second decoding cycle, the memory mapping as shown in embodiment 1302 is as follows for the interleaved ($\pi$) order when performing turbo decoding processing.

$\hat{E}_1=\{11,9,23,21\} \rightarrow \{3,1,0,2\}$

During subsequent decoding cycles (e.g., decoding iterations), the memory mapping between processors and memories is as follows:

Third decoding cycle (natural order/interleaved order) is $E_2=\{2,8,14,20\} \rightarrow \{2,0,3,1\}/\hat{E}_2=\{22,8,10,20\} \rightarrow \{3,0,2,1\}$.

Fourth decoding cycle (natural order/interleaved order) is $E_3=\{3,9,15,21\} \rightarrow \{3,1,0,2\}/\hat{E}_3=\{5,19,17,7\} \rightarrow \{1,0,2,3\}$.

Fifth decoding cycle (natural order/interleaved order) is $E_4=\{4,10,16,22\} \rightarrow \{0,2,1,3\}/\hat{E}_4=\{4,6,16,18\} \rightarrow \{0,2,1,3\}$.

Sixth decoding cycle (natural order/interleaved order) is $E_5=\{5,11,17,23\} \rightarrow \{1,3,2,0\}/\hat{E}_5=\{15,13,3,1\} \rightarrow \{0,2,3,1\}$.

As can be seen, the natural order and the interleaved order are both contention-free.

Figure 14:
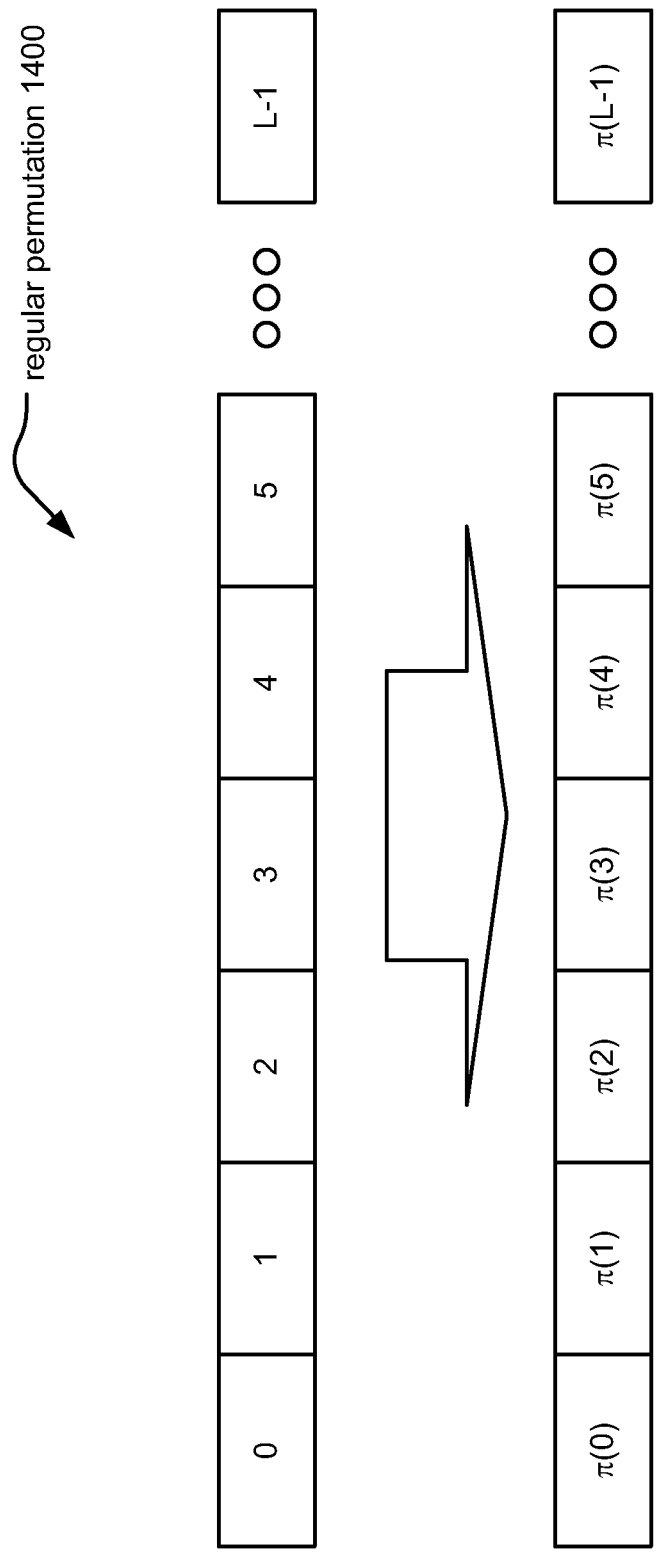
FIG. 14 illustrates an embodiment of a regular permutation.

FIG. 14 illustrates an embodiment of a regular permutation 1400. This regular permutation 1400 can alternatively be referred to as a circular permutation. For example, this regular (circular) permutation 1400 can be defined as follows:

$i=\pi(j)=Pj \bmod L$, $0 \leq i, j \leq L-1$

L is the frame size, and gcd(P,L)=1, which then implies that $\pi(j) \neq \pi(j')$ if $j \neq j'$.

The implementation of the regular permutation 1400 is relatively straight-forward, but the performance is not very good.

An ARP (almost regular permutation) of information block size L=CW (i.e. C is a divider of L) introduced in reference [1] is defined by $i=\pi(j)=jP+\theta+A(j \bmod C)P+B(j \bmod C)\bmod L$ where P is relative prime to L, $\theta$ is a constant and A(x) and B(x) are integer function defined on $\{0, 1, \ldots, C-1\}$. To insure the function defined the function is a permutation (i.e. one to one and on to), in reference [1] A(x) and B(x) are further restricted to $A(i)P+B(i)=C[\alpha(i)P+\beta(i)], i=0, \ldots, C-1$ where $\alpha$ and $\beta$ are integer functions. In this document, we call C the dithering cycle of the ARP.

As can be seen, C|L (thus gcd(C,P)=1), and therefore $\pi(j) \neq \pi(j')$, if $j \neq j'$.

Example: C=4

$$4[\alpha(4l+u)P+\beta(4l+u)] = \begin{cases} 0 & \text{if } u=0 \\ 4P+4\beta_1 & \text{if } u=1 \\ 4\beta_2 & \text{if } u=2 \\ 4P+4\beta_3 & \text{if } u=3 \end{cases}$$

A first example of an ARP interleave is provided here:

$$y = \pi(x) = Px + C[\alpha(x \bmod C)P + \beta(x \bmod C)](\bmod L)$$

$L = 24, C = 4, P = 7$ $$\alpha(u) = \begin{cases} 0 & \text{if } u=0 \\ 0 & \text{if } u=1 \\ 1 & \text{if } u=2 \\ 1 & \text{if } u=3 \end{cases}, \text{ and } \beta(u) = \begin{cases} 0 & \text{if } u=0 \\ 1 & \text{if } u=1 \\ 1 & \text{if } u=2 \\ 1 & \text{if } u=3 \end{cases},$$

which indicates that $$\pi(x) = \begin{cases} xP \bmod L & \text{if } x = 0 \bmod 4 \\ (xP+4) \bmod L & \text{if } x = 1 \bmod 4 \\ (xP+4P+4) \bmod L & \text{if } x = 2 \bmod 4 \\ (xP+4P+4) \bmod L & \text{if } x = 3 \bmod 4 \end{cases}$$

If the inputs of the following are provided to such an ARP interleave ($\pi$), 0, 1, 2, 3, ×4, 5, 6, 7, ×8, 9, 10, 11, ×12, 13, 14, 15, ×16, 17, 18, 19, ×20, 21, 22, 23, then the output thereof is as follows:

0, 11, 22, 5, ×4, 15, 2, 9, ×8, 19, 6, 13, ×12, 23, 10, 17, ×16, 3, 14, 21, ×20, 7, 18, 1.

Another example of an ARP interleave is provided here:

$$y = \pi(x) = Px + C[\alpha(x \bmod C)P + \beta(x \bmod C)](\bmod L)$$

$L = 20, C = 4, P = 3$ $$A(u) = \begin{cases} 0 & \text{if } u=0 \\ 0 & \text{if } u=1 \\ 3 & \text{if } u=2 \\ 1 & \text{if } u=3 \end{cases}, \text{ and } B(u) = \begin{cases} 0 & \text{if } u=0 \\ 2 & \text{if } u=1 \\ 0 & \text{if } u=2 \\ 2 & \text{if } u=3 \end{cases}, \text{ and } \theta = 1.$$

$$\pi(x) = \begin{cases} xP+1 \bmod L & \text{if } x = 0 \bmod 4 \\ (xP+2+1) \bmod L & \text{if } x = 1 \bmod 4 \\ (xP+3P+1) \bmod L & \text{if } x = 2 \bmod 4 \\ (xP+1P+2+1) \bmod L & \text{if } x = 3 \bmod 4 \end{cases}$$

If the inputs of the following are provided to such an ARP interleave (π), 0, 1, 2, 3,×4, 5, 6, 7,×8, 9, 10, 11,×12, 13, 14, 15,×16, 17, 18, 19 then the output thereof is as follows:
1, 6, 16, 15,×13, 18, 8, 7,×5, 10, 0, 19,×17, 2, 12, 11,×9, 14, 4, 3.

There are some special cases for ARP as well.

Case 1:

$$A(x)=C\alpha(x), \text{ and } B(x)=C\beta(x)$$

When θ=0, equations (10), (11) and (12) in reference [1].

When θ=3, C=4, [2] France Telecom, GET, "Enhancement of Rel. 6 turbo Code," 3GPP TSG RAN WG1#43, R1-051310, 2005

When θ=3, C=4 and 8, Table 1, [3] Motorola, "A contention-free interleaver design for LTE codes,", 3GPP TSG RAN WG1#47.

Case 2:

equations (13) in reference [1].

In addition, certain properties of ARP are also provided below:

Property 1:
$x_0 \equiv x_1 \mod C$, which implies that $\pi(x_0) \equiv \pi(x_1) \mod C$.
Proof Set $x_1 = x_0 + kC$. Then $\pi(x_1) - \pi(x_0) = PkC \equiv 0 \mod C$.

Property 2:
Define $\Psi: \{0, 1, \ldots C-1\} \mapsto \{0, 1, \ldots C-1\}$ by $\psi(u) = \pi(u) \mod C$.

π is a permutation, which implies that Ψ is a bijection.

Proof: Assume $u_0, u_1 \in \{0, 1, \ldots C-1\}$, $u_0 \neq u_1$, but $\Psi(u_0) = \Psi(u_1)$. There are L/C elements in $\{0, 1, \ldots L-1\}$ congruent $u_0$ modulo C and another L/C elements congruent $u_1$ modulo C. So, by property 1, there are 2L/C elements u such that π(u) have the same congruence module C. This contradicts the hypothesis that π is a permutation.

Property 3:
Define $\Psi: \{0, 1, \ldots C-1\} \mapsto \{0, 1, \ldots C-1\}$ by $\psi(u) = \pi(u) \mod C$.

Ψ is a bijection, then π is a permutation.

Proof Assume $x_0, x_1 \in \{0, 1, \ldots L-1\}$, $x_0 < x_1$, but $\pi(x_0) = \pi(x_1)$. Let $u_0 = x_0 \mod C$ and $u_1 = x_1 \mod C$. If $u_0 \neq u_1$, then $\pi(x_0) \mod C \neq \pi(x_1) \mod C$ since Ψ is a bijection. If $u_0 = u_1$, then let $x_1 = x_0 + kC$ for a $k \in \{0, 1, \ldots, L/C-1\}$. So, $\pi(x_1) - \pi(x_0) = PkC \mod L$. Since $\gcd(P,L)=1$ and $C|L$, $PkC \mod L = 0$ implies $k=0$ or k divides L/C. By the range on k, a contradiction cannot be avoided; so, $\pi(x_0) = \pi(x_1)$ can only occur if $x_0 = x_1$.

Property 4:
If π(x) is an ARP interleave (π) with period C, then π(x) is also an ARP interleave (π) with period $\tilde{C} = mC$ provided $\tilde{C}|L$.

Proof Let $\pi(x) = [Px + A(x \mod C)P + B(x \mod C) + \theta] \mod L$.
Clearly, π(x) can also be written as follows:

$$\pi(x) = [Px + \tilde{A}(x \mod \tilde{C})P + \tilde{B}(x \mod \tilde{C}) + \theta] \mod L, \text{ where}$$

$$\tilde{A}(x \mod \tilde{C}) \stackrel{def}{=} A(x \mod C) \text{ and } \tilde{B}(x \mod \tilde{C}) \stackrel{def}{=} B(x \mod C).$$

So, if $\tilde{C}|L$, then π(x) is an ARP interleave (π) with period $\tilde{C}$.

FIG. 15A and FIG. 15B illustrate embodiments of MOD memory mapping of a plurality of memories memory banks.

Continuing with another form of memory mapping, there is another form of memory mapping, referred to as modular mapping (i.e., MOD mapping for short) that has been defined in reference [1] and [2] cited below.

According to this MOD mapping approach (again, M is the number of decoding processors), $$\mathcal{M}_{MOD}: i \mapsto i \mod M, \text{ where}$$

M is the number of decoding processors,
C is the period of the ARP interleave (π), and
M is a multiple of C.

This MOD mapping approach embodiment is only contention-free if $\gcd(W,M)=1$.

Each of these embodiments 1501 and 1502 correspond to the situation of MOD mapping when $\gcd(W,M)=1$. Also, these embodiments 1501 and 1502 employ MOD mapping on index sets (W=5, C=4, M=4 and $\gcd(W,M)=1$).

Each of these embodiments 1501 and 1502 employ a plurality of memory banks 1510 that includes 4 memory banks.

During a first decoding cycle, the memory mapping as shown in embodiment 1501 is as follows for the natural order when performing turbo decoding processing.

$$E_0 = \{0,5,10,15\} \rightarrow \{0,1,2,3\}$$

Also during the first decoding cycle, the memory mapping as shown in embodiment 1501 is as follows for the interleaved (π) order when performing turbo decoding processing.

$$\hat{E}_0 = \{0,19,2,17\} \rightarrow \{0,3,2,1\}$$

During a second decoding cycle, the memory mapping as shown in embodiment 1502 is as follows for the natural order when performing turbo decoding processing.

$$E_1 = \{1,6,11,16\} \rightarrow \{1,2,3,0\}$$

Also during the second decoding cycle, the memory mapping as shown in embodiment 1502 is as follows for the interleaved (π) order when performing turbo decoding processing.

$$\hat{E}_1 = \{11,14,9,12\} \rightarrow \{3,2,1,0\}$$

During subsequent decoding cycles (e.g., decoding iterations), the memory mapping between processors and memories is as follows:

Third decoding cycle (natural order/interleaved order) is $E_2 = \{2,7,12,17\} \rightarrow \{2,3,0,1\} / \hat{E}_2 = \{6,1,4,3\} \rightarrow \{2,1,0,3\}$.

Fourth decoding cycle (natural order/interleaved order) is $E_3 = \{3,8,13,18\} \rightarrow \{3,0,1,2\} / \hat{E}_3 = \{13,16,15,18\} \rightarrow \{1,0,3,2\}$.

Fifth decoding cycle (natural order/interleaved order) is $E_4 = \{4,9,14,19\} \rightarrow \{0,1,2,3\} / \hat{E}_4 = \{8,7,10,5\} \rightarrow \{0,3,2,1\}$.

As can be seen in this embodiment, the natural order and the interleaved order are both contention-free.

However, many of the previous embodiments, particular those that employs an ARP interleave (π) within the turbo encoding and turbo decoding, there is a restriction in the number of decoding processors, M, that can be employed. For example, these previous embodiments necessitate that the number of decoding processors, M, be a factor of the length of the information block, L.

The following provides a means by which an arbitrarily selected number (M) of decoding processors can be employed for performing parallel turbo decoding processing.

In doing so, a scheduled block length, L', is judiciously chosen such that the arbitrarily selected number (M) of decoding processors can be employed in conjunction with an appropriate memory mapping that is contention-free.

FIG. 16A and FIG. 16B illustrate embodiments of MOD memory mapping of a plurality of memories memory banks in accordance with the Toy example, in which collisions occur showing that the memory mapping is not contention-free. Also, these embodiments 1601 and 1602 employ MOD mapping on index sets (W=6, C=4, M=4 and $\gcd(W,M) \neq 1$).

Each of these embodiments 1601 and 1602 employ a plurality of memory banks 1610 that includes 4 memory banks.

During a first decoding cycle, the memory mapping as shown in embodiment 1601 is as follows for the natural order when performing turbo decoding processing.

$$E_0=\{0,6,12,18\} \rightarrow \{0,2,0,2\}$$

Also during the first decoding cycle, the memory mapping as shown in embodiment 1601 is as follows for the interleaved ($\pi$) order when performing turbo decoding processing.

$$\hat{E}_0=\{0,2,12,14\} \rightarrow \{0,2,0,2\}$$

During a second decoding cycle, the memory mapping as shown in embodiment 1602 is as follows for the natural order when performing turbo decoding processing.

$$E_1=\{1,7,13,19\} \rightarrow \{1,3,1,3\}$$

Also during the second decoding cycle, the memory mapping as shown in embodiment 1602 is as follows for the interleaved ($\pi$) order when performing turbo decoding processing.

$$\hat{E}_1=\{11,9,23,21\} \rightarrow \{3,1,3,1\}$$

During subsequent decoding cycles (e.g., decoding iterations), the memory mapping between processors and memories is as follows:

Third decoding cycle (natural order/interleaved order) is $E_2=\{2,8,14,20\} \rightarrow \{2,0,2,0\}/\hat{E}_2=\{22,8,10,20\} \rightarrow \{2,0,2,0\}$.

Fourth decoding cycle (natural order/interleaved order) is $E_3=\{3,9,15,21\} \rightarrow \{3,1,3,1\}/\hat{E}_3=\{5,19,17,7\} \rightarrow \{1,3,1,3\}$.

Fifth decoding cycle (natural order/interleaved order) is $E_4=\{4,10,16,22\} \rightarrow \{0,2,0,2\}/\hat{E}_4=\{4,6,16,18\} \rightarrow \{0,2,0,2\}$.

Sixth decoding cycle (natural order/interleaved order) is $E_5=\{5,11,17,23\} \rightarrow \{1,3,1,3\}/\hat{E}_5=\{15,13,3,1\} \rightarrow \{3,1,3,1\}$.

As can be seen in this embodiment, both the natural order and the interleaved order are not contention-free.

There is another form of memory mapping, referred to as division mapping (i.e., DIV mapping for short) that has been defined in reference [4] cited below.

According to this DIV mapping approach, $\mathcal{M}_{DIV}:i \mapsto \lfloor i/W \rfloor$, where W is the window size of the parallel decoding architecture.

The index set at the i-th decoding cycle is as follows:

$$E_i=\{i, W+i, \ldots, (M-1)W+i\}, \text{ where}$$

M is the number of processors, and C is the period of the ARP interleave ($\pi$).

Also, if M is a factor of the ratio, L/C, then the map on an ARP interleave ($\pi$) is in fact contention-free.

It is noted, however, that examples in the reference [3] and reference [4] cited below do not have this property.

FIG. 17A and FIG. 17B illustrate embodiments of DIV memory mapping of a plurality of memories memory banks. Each of these embodiments 1701 and 1702 correspond to the situation when M divides L/C. Also, these embodiments 1701 and 1702 employ DIV mapping on index sets (C=4, M=3 in fact is a factor of L/C=6, and W=8).

Each of these embodiments 1701 and 1702 employ a plurality of memory banks 1710 that includes 3 memory banks.

During a first decoding cycle, the memory mapping as shown in embodiment 1701 is as follows for the natural order when performing turbo decoding processing.

$$E_0=\{0,8,16\} \rightarrow \{0,1,2\}$$

Also during the first decoding cycle, the memory mapping as shown in embodiment 1701 is as follows for the interleaved ($\pi$) order when performing turbo decoding processing.

$$\hat{E}_0=\{0,8,16\} \rightarrow \{0,1,2\}$$

During a second decoding cycle, the memory mapping as shown in embodiment 1202 is as follows for the natural order when performing turbo decoding processing.

$$E_1=\{1,9,17\} \rightarrow \{0,1,2\}$$

Also during the second decoding cycle, the memory mapping as shown in embodiment 1702 is as follows for the interleaved ($\pi$) order when performing turbo decoding processing.

$$\hat{E}_1=\{11,19,3\} \rightarrow \{2,1,0\}$$

During subsequent decoding cycles (e.g., decoding iterations), the memory mapping between processors and memories is as follows:

Third decoding cycle (natural order/interleaved order) is $E_2=\{2,10,18\} \rightarrow \{0,1,2\}/\hat{E}_2=\{22,6,14\} \rightarrow \{1,0,2\}$.

Fourth decoding cycle (natural order/interleaved order) is $E_3=\{3,11,19\} \rightarrow \{0,1,2\}/\hat{E}_3=\{5,13,21\} \rightarrow \{2,1,0\}$.

Fifth decoding cycle (natural order/interleaved order) is $E_4=\{4,12,20\} \rightarrow \{0,1,2\}/\hat{E}_4=\{4,12,20\} \rightarrow \{1,0,2\}$.

Sixth decoding cycle (natural order/interleaved order) is $E_5=\{5,13,21\} \rightarrow \{0,1,2\}/\hat{E}_5=\{15,23,7\} \rightarrow \{0,2,1\}$.

Seventh decoding cycle (natural order/interleaved order) is $E_6=\{6,14,22\} \rightarrow \{0,1,2\}/\hat{E}_6=\{2,10,18\} \rightarrow \{2,1,0\}$.

Eighth decoding cycle (natural order/interleaved order) is $E_7=\{7,15,23\} \rightarrow \{0,1,2\}/\hat{E}_7=\{9,17,1\} \rightarrow \{0,2,1\}$.

As can be seen, the natural order and the interleaved order are both contention-free.

Figure 18A:
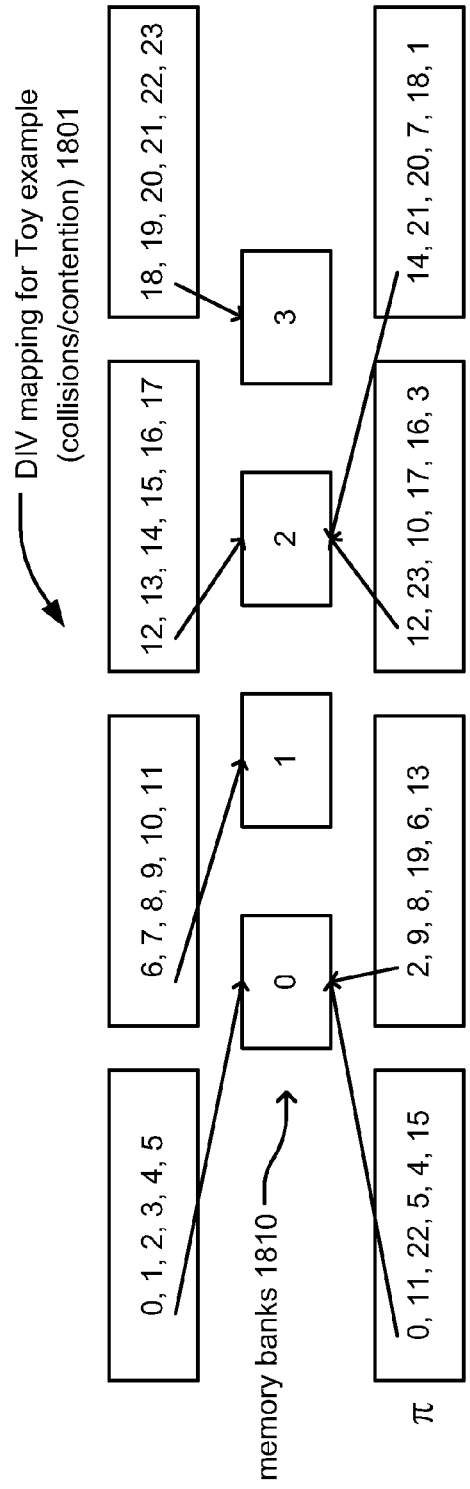
FIG. 18A and FIG. 18B illustrate embodiments of DIV memory mapping of a plurality of memories memory banks in accordance with the Toy example, in which collisions occur showing that the memory mapping is not contention-free.
Figure 18B:
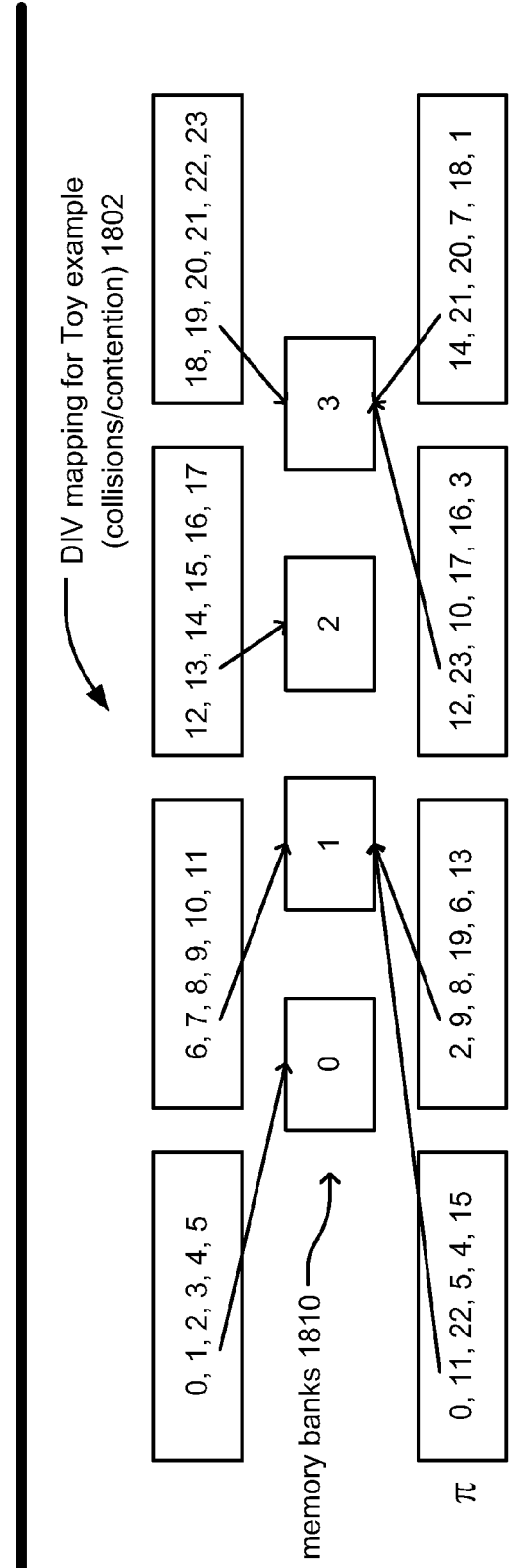

FIG. 18A and FIG. 18B illustrate embodiments of DIV memory mapping of a plurality of memories memory banks in accordance with the Toy example, in which collisions occur showing that the memory mapping is not contention-free.

Each of these embodiments 1801 and 1802 correspond to the situation when M is not a factor of L/C; in other words, M does not divide into L/C. Also, these embodiments 1801 and 1802 employ DIV mapping on index sets (C=4, M=4 which is not a factor of L/C=6, and the window size, W=6).

Each of these embodiments 1801 and 1802 employ a plurality of memory banks 1810 that includes 4 memory banks.

During a first decoding cycle, the memory mapping as shown in embodiment 1701 is as follows for the natural order when performing turbo decoding processing.

$$E_0=\{0,6,12,18\} \rightarrow \{0,1,2,3\}$$

Also during the first decoding cycle, the memory mapping as shown in embodiment 1801 is as follows for the interleaved ($\pi$) order when performing turbo decoding processing.

$$\hat{E}_0=\{0,2,12,14\} \rightarrow \{0,0,2,2\}$$

During a second decoding cycle, the memory mapping as shown in embodiment 1802 is as follows for the natural order when performing turbo decoding processing.

$$E_1=\{1,7,13,19\} \rightarrow \{0,1,2,3\}$$

Also during the second decoding cycle, the memory mapping as shown in embodiment 1802 is as follows for the interleaved ($\pi$) order when performing turbo decoding processing.

$$\hat{E}_1=\{11,9,23,21\} \rightarrow \{1,1,3,3\}$$

During subsequent decoding cycles (e.g., decoding iterations), the memory mapping between processors and memories is as follows:

Third decoding cycle (natural order/interleaved order) is $E_2=\{2,8,14,20\} \rightarrow \{0,1,2,3\}/\hat{E}_2=\{22,8,10,20\} \rightarrow \{3,1,1,3\}$.

Fourth decoding cycle (natural order/interleaved order) is $E_3=\{3,9,15,21\} \rightarrow \{0,1,2,3\}/\hat{E}_3=\{5,19,17,7\} \rightarrow \{0,3,2,1\}$.

Fifth decoding cycle (natural order/interleaved order) is $E_4=\{4,10,16,22\} \to \{0,1,2,3\}/\hat{E}_4=\{4,6,16,18\} \to \{0,1,2,3\}$.

Sixth decoding cycle (natural order/interleaved order) is $E_5=\{5,11,17,23\} \to \{0,1,2,3\}/\hat{E}_5=\{15,13,3,1\} \to \{2,2,0,0\}$.

As can be seen in this embodiment, the natural order is contention-free, but the interleaved order is not contention-free.

In accordance with the ARP interleave ($\pi$) described above, a novel contention-free memory mapping for the ARP interleave ($\pi$) is presented below (depicted as $\mathcal{M}_{ADD}$ or ADD mapping). For an ARP interleave ($\pi$) of arbitrary size, the following memory mapping is contention-free:

$$\mathcal{M}_{ADD}: x \mapsto \left(x + \left\lfloor \frac{x}{qW} \right\rfloor\right) \bmod M,$$

where

C: period of ARP;

M: # of processors, where M is a multiple of C (i.e., M=mC, where m is an integer);

W: window size of parallel decoding; and q: the smallest positive integer with property qW=0 mod (M).

It is asserted that this ADD mapping is contention-free between a plurality of processors and a plurality of memories (e.g., memory banks) for an ARP interleave ($\pi$) of arbitrary size and when employing any number M of parallel implemented decoders.

This ADD mapping maps the index sets at the t-th decoding cycle to different memories (e.g., memory banks) as follows:

$E_t = \{t, W+t, \ldots, (M-1)W+t\}$, and $\hat{E}_t = \{\pi(t), \pi(W+t), \ldots, \pi((M-1)W+t)\}$.

FIG. 19A and FIG. 19B illustrate embodiments of ADD memory mapping 1901 and 1902 of a plurality of memories memory banks in accordance with the Toy example, in which no collisions occur showing that the memory mapping is contention-free.

Each of these embodiments 1901 and 1902 correspond to the situation C=4, the window size, W=6, q=2, and qW=12.

Each of these embodiments 1901 and 1902 employ a plurality of memory banks 1910 that includes 4 memory banks.

During a first decoding cycle, the memory mapping as shown in embodiment 1901 is as follows for the natural order when performing turbo decoding processing.

$E_0 = \{0, 6, 12, 18\} \xrightarrow{mod 4} \{0, 2, 0, 2\}$ $E_0 = \{0, 6, 12, 18\} \xrightarrow{\lfloor \frac{x}{12} \rfloor} \{0, 0, 1, 1\}$ $E_0 = \{0, 6, 12, 18\} \xrightarrow{x+\lfloor \frac{x}{12} \rfloor} \{0, 2, 1, 3\}$.

Also during the first decoding cycle, the memory mapping as shown in embodiment 1901 is as follows for the interleaved ($\pi$) order when performing turbo decoding processing.

$\hat{E}_0 = \{0, 2, 12, 14\} \xrightarrow{mod 4} \{0, 2, 0, 2\}$ $\hat{E}_0 = \{0, 2, 12, 14\} \xrightarrow{\lfloor \frac{x}{12} \rfloor} \{0, 0, 1, 1\}$ $\hat{E}_0 = \{0, 2, 12, 14\} \xrightarrow{x+\lfloor \frac{x}{12} \rfloor} \{0, 2, 1, 3\}$ During a second decoding cycle, the memory mapping as shown in embodiment 1902 is as follows for the natural order when performing turbo decoding processing.

$E_1 = \{1, 7, 13, 19\} \xrightarrow{mod 4} \{1, 3, 1, 3\}$ $E_1 = \{1, 7, 13, 19\} \xrightarrow{\lfloor \frac{x}{12} \rfloor} \{0, 0, 1, 1\}$ $E_1 = \{1, 7, 13, 19\} \xrightarrow{x+\lfloor \frac{x}{12} \rfloor} \{1, 3, 2, 0\}$ Also during the second decoding cycle, the memory mapping as shown in embodiment 1902 is as follows for the interleaved ($\pi$) order when performing turbo decoding processing.

$\hat{E}_1 = \{11, 9, 23, 21\} \xrightarrow{mod 4} \{3, 1, 3, 1\}$ $\hat{E}_1 = \{11, 9, 23, 21\} \xrightarrow{\lfloor \frac{x}{12} \rfloor} \{0, 0, 1, 1\}$ $\hat{E}_1 = \{11, 9, 23, 21\} \xrightarrow{x+\lfloor \frac{x}{12} \rfloor} \{3, 1, 0, 2\}$ During subsequent decoding cycles (e.g., decoding iterations), the memory mapping between processors and memories is as follows:

Third decoding cycle (natural order) is:

$E_2 = \{2, 8, 14, 20\} \xrightarrow{mod 4} \{2, 0, 2, 0\}$ $E_2 = \{2, 8, 14, 20\} \xrightarrow{\lfloor \frac{x}{12} \rfloor} \{0, 0, 1, 1\}$ $E_2 = \{2, 8, 14, 20\} \xrightarrow{x+\lfloor \frac{x}{12} \rfloor} \{2, 0, 3, 1\}$.

Third decoding cycle (interleaved order) is:

$\hat{E}_2 = \{22, 8, 10, 20\} \xrightarrow{mod 4} \{2, 0, 2, 0\}$ $\hat{E}_2 = \{22, 8, 10, 20\} \xrightarrow{\lfloor \frac{x}{12} \rfloor} \{1, 0, 0, 1\}$ $\hat{E}_2 = \{22, 8, 10, 20\} \xrightarrow{x+\lfloor \frac{x}{12} \rfloor} \{3, 0, 2, 1\}$.

Fourth decoding cycle (natural order) is:

$E_3 = \{3, 9, 15, 21\} \xrightarrow{mod 4} \{3, 1, 3, 1\}$ $E_3 = \{3, 9, 15, 21\} \xrightarrow{\lfloor \frac{x}{12} \rfloor} \{0, 0, 1, 1\}$ $E_3 = \{3, 9, 15, 21\} \xrightarrow{x+\lfloor \frac{x}{12} \rfloor} \{3, 1, 0, 2\}$.

Fourth decoding cycle (interleaved order) is:

$$\hat{E}_3 = \{5, 19, 17, 7\} \xrightarrow{mod4} \{1, 3, 1, 3\}$$

$$\hat{E}_3 = \{5, 19, 17, 7\} \xrightarrow{\lfloor \frac{x}{12} \rfloor} \{0, 1, 1, 0\}$$

$$\hat{E}_3 = \{5, 19, 17, 7\} \xrightarrow{x + \lfloor \frac{x}{12} \rfloor} \{1, 0, 2, 3\}.$$

Fifth decoding cycle (natural order) is:

$$E_4 = \{4, 10, 16, 22\} \xrightarrow{mod4} \{0, 2, 0, 2\}$$

$$E_4 = \{4, 10, 16, 22\} \xrightarrow{\lfloor x/12 \rfloor} \{0, 0, 1, 1\}$$

$$E_4 = \{4, 10, 16, 22\} \xrightarrow{x + \lfloor x/12 \rfloor} \{0, 2, 1, 3\}.$$

Fifth decoding cycle (interleaved order) is:

$$\hat{E}_4 = \{4, 6, 16, 18\} \xrightarrow{mod4} \{0, 2, 0, 2\}$$

$$\hat{E}_4 = \{4, 6, 16, 18\} \xrightarrow{\lfloor x/12 \rfloor} \{0, 0, 1, 1\}$$

$$\hat{E}_4 = \{4, 6, 16, 18\} \xrightarrow{x + \lfloor x/12 \rfloor} \{0, 2, 1, 3\}.$$

Sixth decoding cycle (natural order) is:

$$E_5 = \{5, 11, 17, 23\} \xrightarrow{mod4} \{1, 3, 1, 3\}$$

$$E_5 = \{5, 11, 17, 23\} \xrightarrow{\lfloor x/12 \rfloor} \{0, 0, 1, 1\}$$

$$E_5 = \{5, 11, 17, 23\} \xrightarrow{x + \lfloor x/12 \rfloor} \{1, 3, 2, 0\}.$$

Sixth decoding cycle (interleaved order) is:

$$\hat{E}_5 = \{15, 13, 3, 1\} \xrightarrow{mod4} \{3, 1, 3, 1\}$$

$$\hat{E}_5 = \{15, 13, 3, 1\} \xrightarrow{\lfloor x/12 \rfloor} \{1, 1, 0, 0\}$$

$$\hat{E}_5 = \{15, 13, 3, 1\} \xrightarrow{x + \lfloor x/12 \rfloor} \{0, 2, 3, 1\}.$$

As can be seen, the natural order and the interleaved order are both contention-free.

Figure 20:
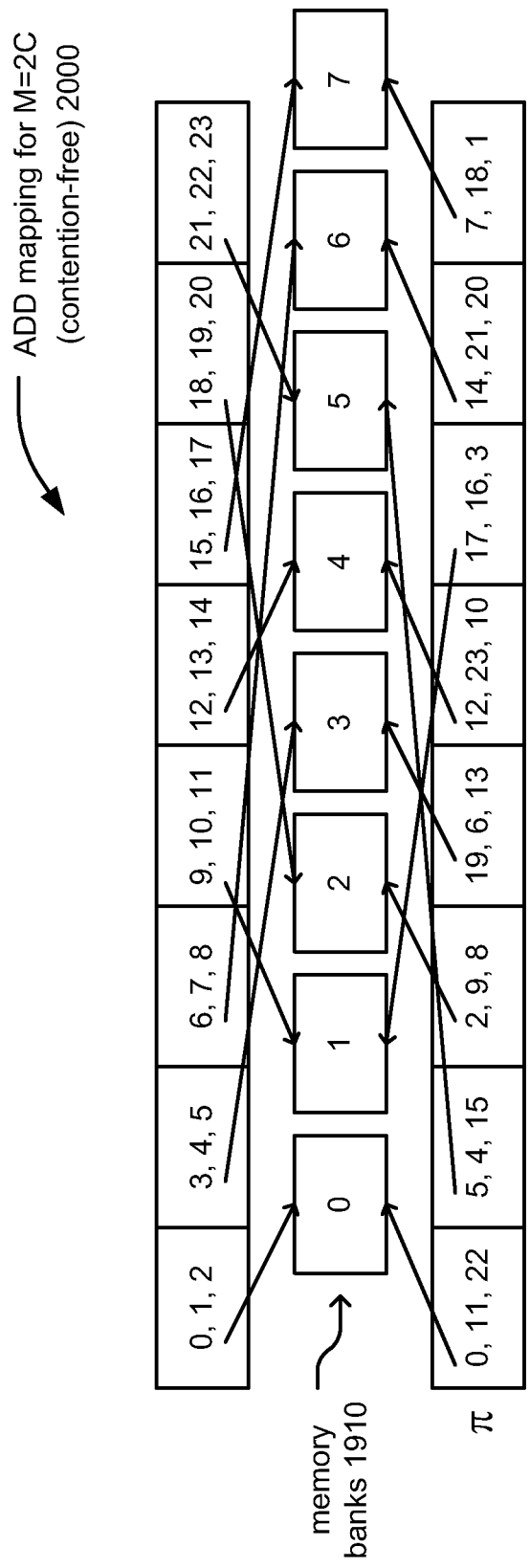
FIG. 20 illustrates an embodiment of ADD memory mapping of a plurality of memories memory banks for which M=2C, in which no collisions occur showing that the memory mapping is contention-free.

FIG. 20 illustrates an embodiment of ADD memory mapping 2000 of a plurality of memories memory banks for which M=2C, in which no collisions occur showing that the memory mapping is contention-free.

This embodiment 2000 corresponds to the situation C=4, m=2, the window size, W=3, q=8, and qW=24.

Since qW>L−1, we have the following $\lfloor x/24 \rfloor = 0, x<L$, which then implies:

$$\mathcal{M}_{ADD}: x \mapsto x \bmod(8)$$

This embodiment 2000 employs a plurality of memory banks 2010 that includes 8 memory banks.

During a first decoding cycle, the memory mapping as shown in embodiment 2001 is as follows for the natural order when performing turbo decoding processing.

$$E_0 = \{0, 3, 6, 9, 12, 15, 18, 21\} \xrightarrow{mod8} \{0, 3, 6, 1, 4, 7, 2, 5\}.$$

Also during the first decoding cycle, the memory mapping as shown in embodiment 2001 is as follows for the interleaved ($\pi$) order when performing turbo decoding processing.

$$\hat{E}_0 = \{0, 5, 2, 19, 12, 17, 14, 7\} \xrightarrow{mod8} \{0, 5, 2, 3, 4, 1, 6, 7\}.$$

During subsequent decoding cycles (e.g., decoding iterations), the memory mapping between processors and memories is as follows:

Second decoding cycle (natural order) is:

$$E_1 = \{1, 4, 7, 10, 13, 16, 19, 22\} \xrightarrow{mod8} \{1, 4, 7, 2, 5, 0, 3, 6\}.$$

Second decoding cycle (interleaved order) is:

$$\hat{E}_1 = \{11, 4, 9, 6, 23, 16, 21, 18\} \xrightarrow{mod8} \{3, 4, 1, 6, 7, 0, 5, 2\}.$$

Third decoding cycle (natural order) is:

$$E_2 = \{2, 5, 8, 11, 14, 17, 20, 23\} \xrightarrow{mod8} \{2, 5, 0, 3, 6, 1, 4, 7\}.$$

Third decoding cycle (interleaved order) is:

$$\hat{E}_2 = \{22, 15, 8, 13, 10, 3, 20, 1\} \xrightarrow{mod8} \{6, 7, 0, 5, 2, 3, 4, 1\}.$$

As can be seen, the natural order and the interleaved order are both contention-free.

Figure 21:
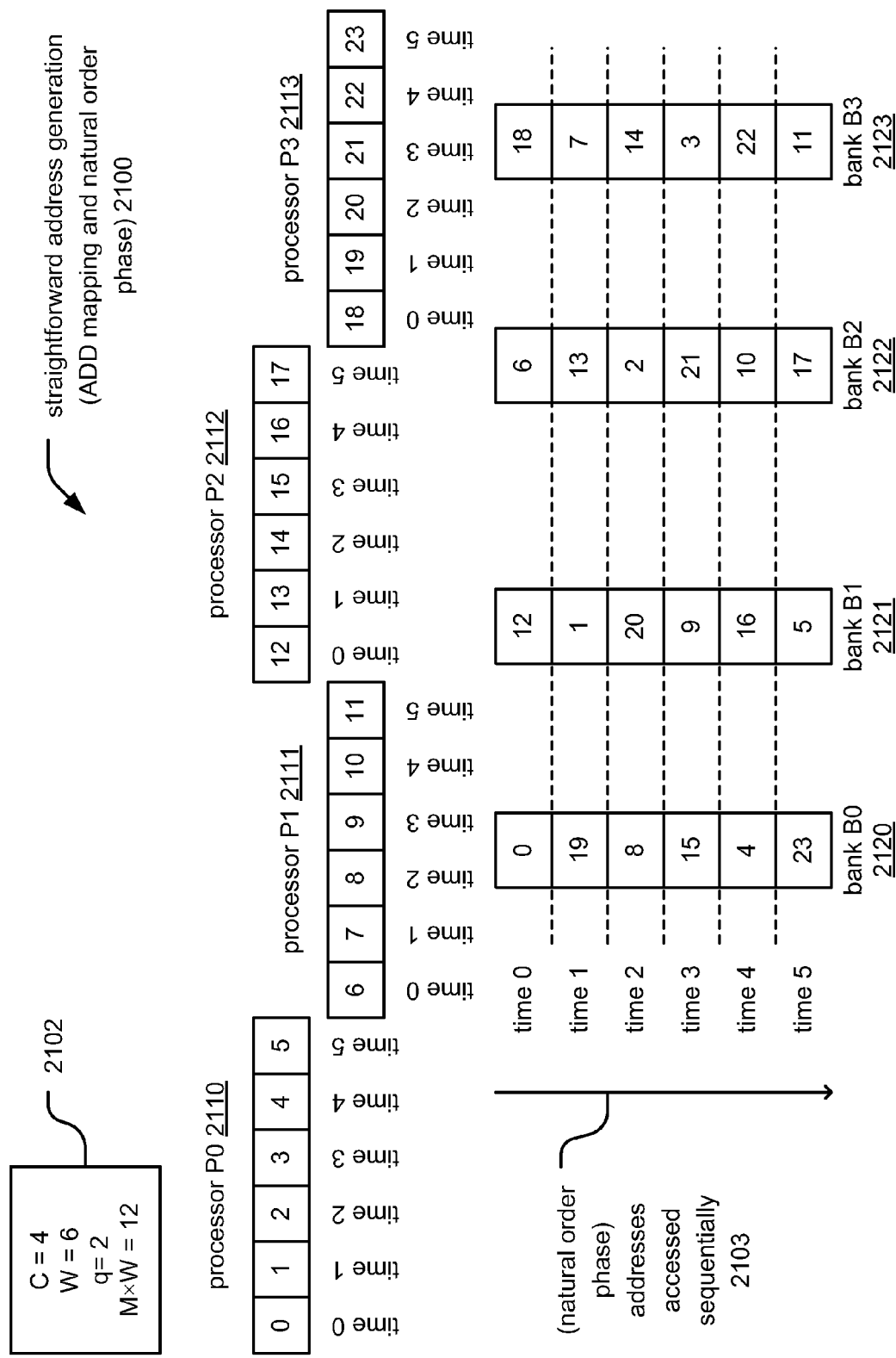
FIG. 21 illustrates an embodiment of straightforward address generation for ADD mapping and natural order phase of parallel turbo decoding processing.

FIG. 21 illustrates an embodiment of straightforward address generation 2100 for ADD mapping and natural order phase of parallel turbo decoding processing. The straightforward address generation using the natural order is as follows:

$$\mathcal{A}_N: x \mapsto x \bmod(W).$$

This straightforward address generation 2100 can be applied to a variety of types of memory mapping, but it will be seen that the subsequent complexity in implementation is sometimes undesirable and sometimes can incur certain deleterious effects such as a reduction in decoding speed.

Referring specifically to the FIG. 21, this embodiment employs the ADD mapping (i.e., memory mapping of $\mathcal{M} = \mathcal{M}_{ADD}$); in addition, this embodiment 2100 corresponds to the situation C=4, the window size, W=6, q=2, and qW=12, as depicted by reference numeral 2102. Moreover, 4 processors (shown by processor P0 2110, processor P1 2111, processor P2 2112, and processor P3 2113) and 4 memory banks (shown by processor B0 2120, processor B1 2121, processor B2 2122, and processor B3 2123).

In accordance with the natural order phase of turbo decoding processing (e.g., the SISO 0 decoding operations), the addresses are accessed sequentially, as indicated by reference numeral 2103. The mapping (in this case the ADD mapping) determines which data from which particular memory bank is provided which processor. Nevertheless, the following can be seen:

1. The top data entry of each memory bank is accessed at time 0.
2. The $2^{nd}$ to top data entry of each memory bank is accessed at time 1.
3. The $3^{rd}$ to top data entry of each memory bank is accessed at time 2.
4. The $4^{th}$ to top data entry of each memory bank is accessed at time 3.
5. The $2^{nd}$ to bottom data entry of each memory bank is accessed at time 4.
6. The bottom data entry of each memory bank is accessed at time 5.

Figure 22:
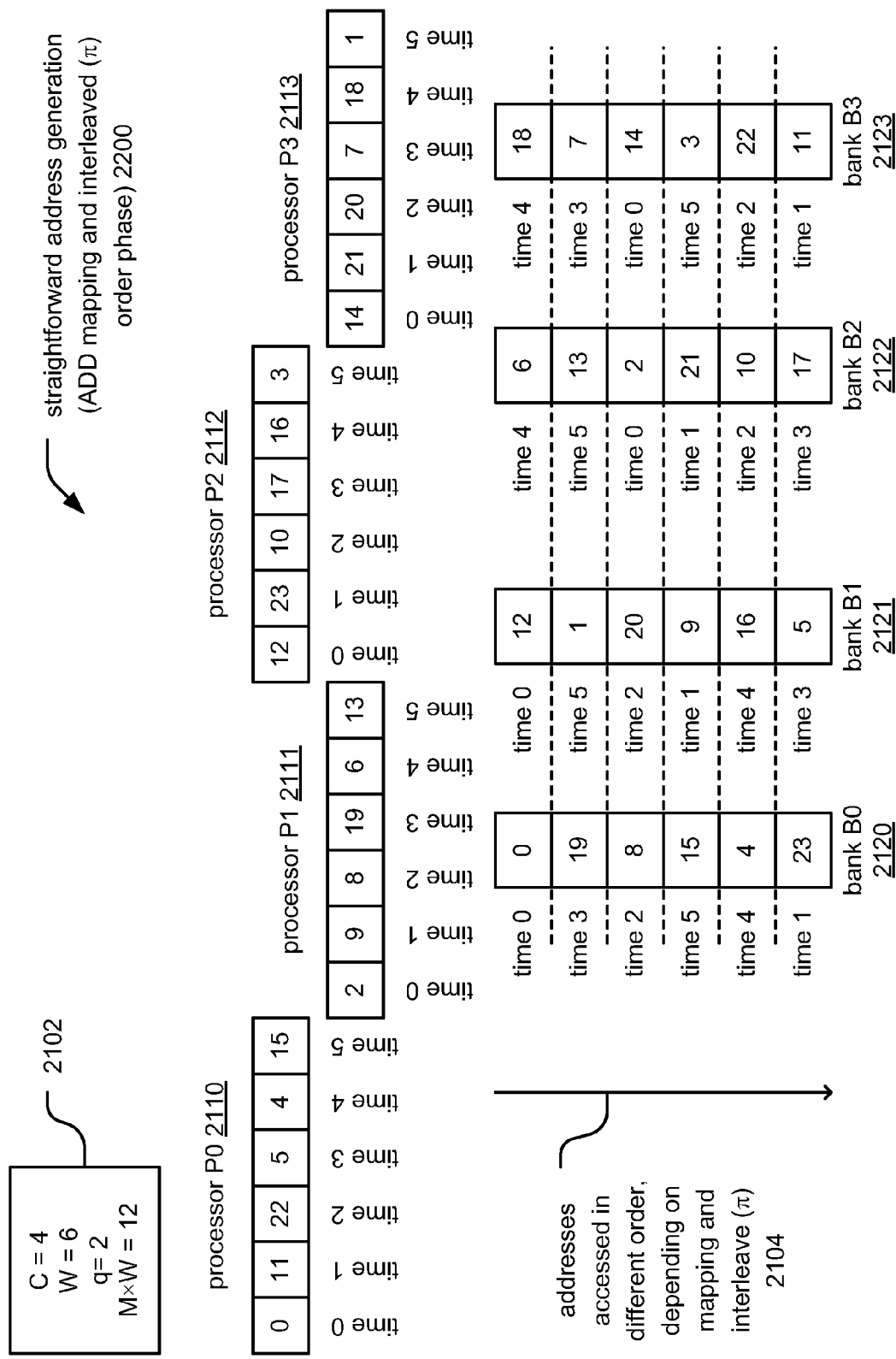
FIG. 22 illustrates an embodiment of straightforward address generation for ADD mapping and interleaved ($\pi$) order phase of parallel turbo decoding processing.

FIG. 22 illustrates an embodiment of straightforward address generation for ADD mapping and interleaved ($\pi$) order phase of parallel turbo decoding processing. This diagram should be considered in conjunction with FIG. 21.

In accordance with the interleaved ($\pi$) order phase of turbo decoding processing (e.g., the SISO 1 decoding operations), the addresses are accessed in a different order (i.e., not necessarily sequentially), depending on the memory mapping ($\mathcal{M}$) and the interleave ($\pi$) employed, as indicated by reference numeral 2104. The mapping (in this case the ADD mapping) determines which data from which particular memory bank is provided which processor. Nevertheless, the following can be seen when considering each of the memory banks.

Considering memory bank B0 2120:
1. The top data entry of memory bank B0 2120 is accessed at time 0.
2. The bottom data entry of memory bank B0 2120 is accessed at time 1.
3. The $3^{rd}$ to top data entry of memory bank B0 2120 is accessed at time 2.
4. The $2^{nd}$ to top data entry of memory bank B0 2120 is accessed at time 3.
5. The $2^{nd}$ to bottom data entry of memory bank B0 2120 is accessed at time 4.
6. The $4^{th}$ to top data entry of memory bank B0 2120 is accessed at time 5.

Considering memory bank B1 2121:
1. The top data entry of memory bank B1 2121 is accessed at time 0.
2. The $4^{th}$ to top data entry of memory bank B1 2121 is accessed at time 1.
3. The $3^{rd}$ to top data entry of memory bank B1 2121 is accessed at time 2.
4. The bottom data entry of memory bank B1 2121 is accessed at time 3.
5. The $2^{nd}$ to bottom data entry of memory bank B1 2121 is accessed at time 4.
6. The $2^{nd}$ to top data entry of memory bank B1 2121 is accessed at time 5.

Analogous observations can be made when considering memory bank B2 2122 and memory bank B3 2123.

Figure 23:
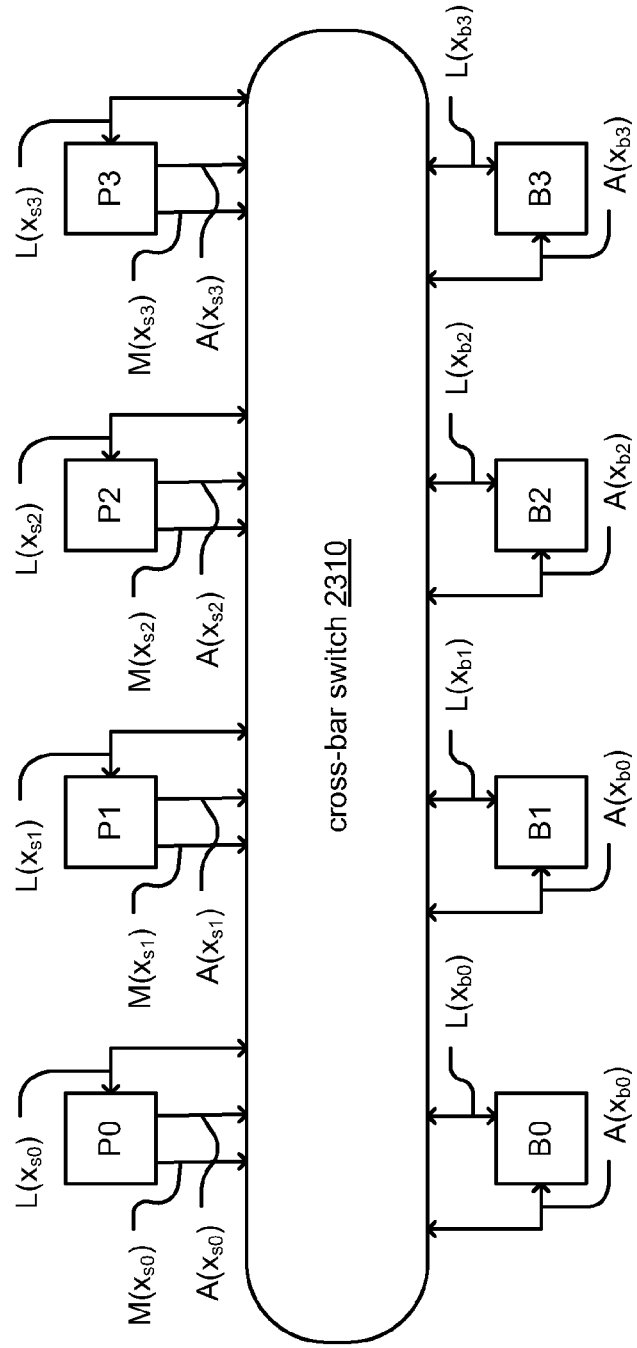
FIG. 23 illustrates an embodiment of a decoding architecture implemented for straightforward address generation for ADD mapping.

FIG. 23 illustrates an embodiment of a decoding architecture 2300 implemented for straightforward address generation for ADD mapping. This diagram should be considered in conjunction with FIG. 21 and FIG. 22. A cross-bar switch 2310 is employed to perform the appropriate providing of data values from each memory bank to the appropriate processor. This appropriate providing is again a function of the memory mapping ($\mathcal{M}$) and the interleave ($\pi$) that is employed. Depending on the mapping of each of the memory banks (e.g., to which processor each data entry within a particular memory bank is to be provided during a given decoding time) (these memory mappings of the 4 memory banks are depicted as $\mathcal{M}(x_{s0})$, $\mathcal{M}(x_{s1})$, $\mathcal{M}(x_{s2})$, and $\mathcal{M}(x_{s3})$) then the processor indices $\{s0, s1, s2, s3\}$ are mapped to the appropriate memory bank indices $\{b0, b1, b2, b3\}$ by sm→bn if ($\mathcal{M}(x_{sm})$=bn) for both the memory bank address and the data value at that particular location within the memory bank.

Referring to FIG. 23, the operations can be described as follows:

1. At a cycle t, processor Ps computes bit position xs (sW+t in natural order phase; $\pi$(sW+t) in interleaved ($\pi$) order phase).
2. Ps computes $\mathcal{M}$(xs) (e.g., which memory bank) and $\mathcal{A}$(xs) (e.g., which location within the memory bank) for bank and address of memory location for xs.
3. The cross-bar switch 2310 is configured according to the set of $\mathcal{M}$(xs)'s to connect each processor Ps with the corresponding bank $\mathcal{M}$(xs).
4. The address $\mathcal{A}$(xs) from processor Ps is sent to the corresponding bank $\mathcal{M}$(xs) so that $\mathcal{L}$(xs), the value at bit position xs, can be accessed.

Described another way, if the address mapping is as follows:

$$\mathcal{A}_N : x \mapsto x \bmod(W).$$

In the natural order phase of parallel turbo decoding processing, the addresses are accessed sequentially, which is a relatively quick and easy implementation.

In the interleaved ($\pi$) order phase of parallel turbo decoding processing, the addresses are calculated by the processors and then sent to the appropriate memory bank. This has a very long cycle time and the cross-bar switch 2310 is required for both providing of and translating of the memory addresses and the data values between the memory banks and processors.

Figure 24:
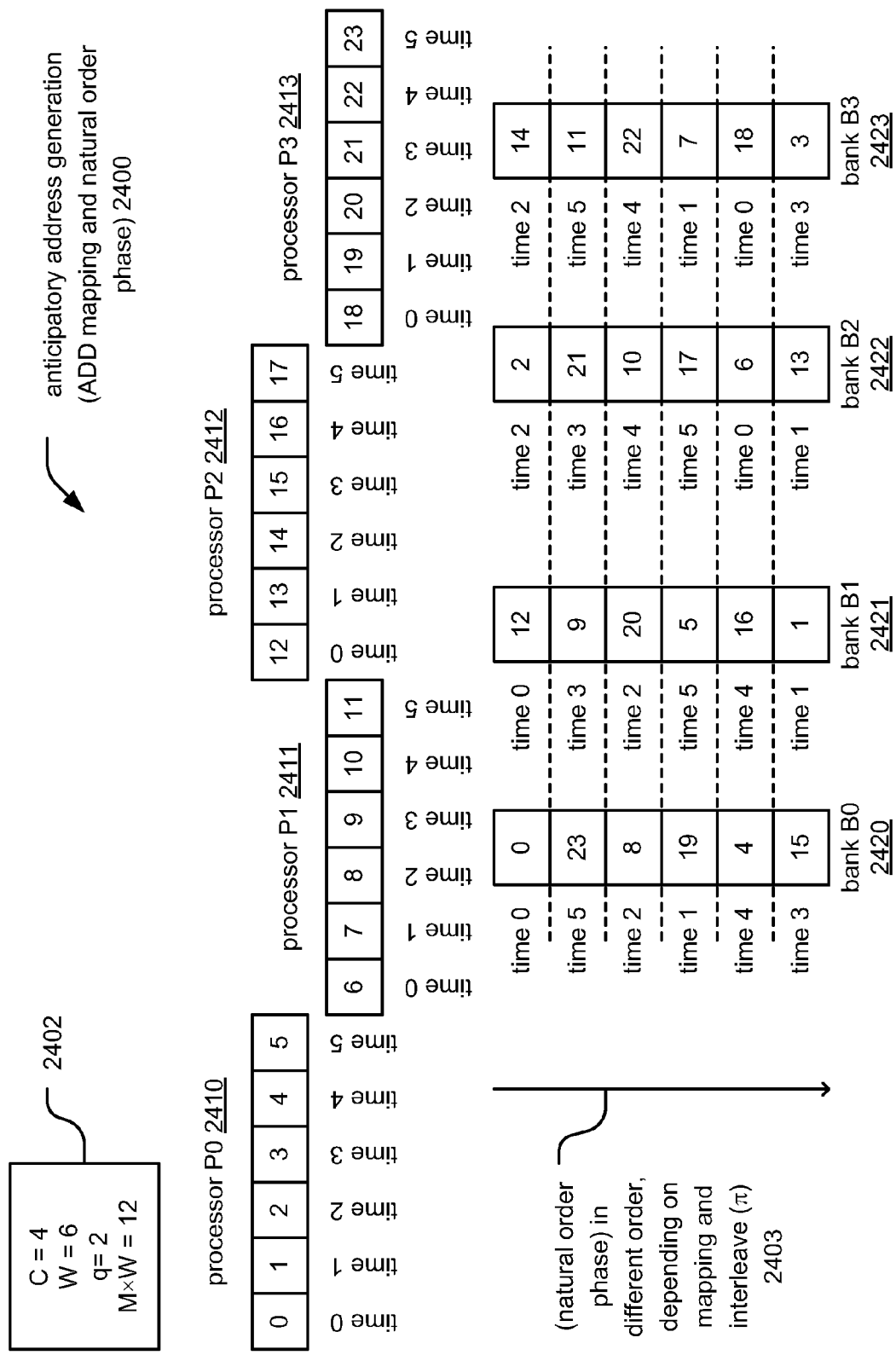
FIG. 24 illustrates an embodiment of anticipatory address generation for ADD mapping and natural order phase of parallel turbo decoding processing.

FIG. 24 illustrates an embodiment of anticipatory address generation 2400 for ADD mapping and natural order phase of parallel turbo decoding processing. A novel approach is presented herein by which the cycle time is reduced dramatically for address generation in accordance with parallel turbo decoding processing. This means of address generation is generally referred to as anticipatory address generation.

Initially, it is supposed that the address mapping is as follows:

$$\mathcal{A}_N : x \mapsto x \bmod(W).$$

The question may then be posed as to whether or not it is possible for each memory bank to calculate its own address sequence instead of necessitating that it be provided from the processors via the cross-bar switch. If the above-supposed address mapping ($\mathcal{A}_N : x \mapsto x \bmod(W)$) is employed, then this can actually be performed but it is very difficult in implementation.

A novel approach is provided herein by which an index function, referred to as $\mathcal{I}$, is calculated that gives the bit index x of the data value in the memory bank b at a cycle t of the interleaved ($\pi$) order phase of parallel turbo decoding processing. For example, the following index function, $\mathcal{I}$, is calculated for this particular address mapping ($\mathcal{A}_N : x \mapsto x \bmod(W)$).

$\mathcal{I}(b,t)$=x which implies that $\mathcal{M}(x)$=b and x=$\pi$(sW+t) for some s.

This index function, $\mathcal{I}$, however, is generally very hard to construct for this particular address mapping ($\mathcal{A}_N : x \mapsto x \bmod$ (W)) because the equation x=π(sW+t) may have some congruence with mod(W). One exception to this would be the DIV memory mapping (e.g., $\mathcal{M}_{DIV}$) and this is because therein the address $\mathcal{A}_y$ (π(sW+0) is independent of s for that particular memory mapping.

Therefore, a novel address generation means is presented that addresses the memory mapping instead in accordance with the inverse interleave ($\pi^{-1}$) order as follows:

$\mathcal{A}_y : x \mapsto \pi^{-1}(x) \bmod(W))$

As the interleave (π) is calculated, the inverse thereof (i.e., the inverse interleave ($\pi^{-1}$)) can also be saved.

In addition, the inverse interleave ($\pi^{-1}$) can also evaluated as another ARP interleave (π) as described in the following commonly-assigned U.S. provisional patent application and U.S. utility patent application, the contents of which are hereby incorporated herein by reference in their entirety for all purposes:

1. U.S. Provisional Application Ser. No. 60/872,367, entitled "Turbo decoder employing ARP (almost regular permutation) interleave and inverse thereof as de-interleave,", filed Dec. 1, 2006, pending.

2. U.S. Utility application Ser. No. 11/657,819, entitled "Turbo decoder employing ARP (almost regular permutation) interleave and inverse thereof as de-interleave,", filed Jan. 25, 2007, pending.

An example of calculating the inverse interleave ($\pi^{-1}$) for the Toy example (several embodiments of which are provided above) is shown below:

For the following parameters, L=24, C=4, and P=7. Then $P^{-1}$=7 since $PP^{-1} \equiv 1 \bmod(L)$.

$$\pi^{-1}(j) = \begin{cases} jP^{-1} \bmod L & \text{if } j = 0 \bmod 4 \\ (j-4)P^{-1}-4) \bmod L & \text{if } j = 1 \bmod 4 \\ (j-4)P^{-1}-4) \bmod L & \text{if } j = 2 \bmod 4 \\ (j-4)P^{-1} \bmod L & \text{if } j = 3 \bmod 4 \end{cases}$$

The natural order phase (when considering 4 processors) is as follows:

0, 1, 2, 3, 4, 5×6, 7, 8, 9, 10, 11×12, 13, 14, 15, 16, 17×18, 19, 20, 21, 22, 23.

The interleaved (π) order phase (when considering 4 processors) is as follows:

0, 11, 22, 5, 4, 15×2, 9, 8, 19, 6, 13×12, 23, 10, 17, 16, 3×14, 21, 20, 7, 18, 1.

Referring back to the FIG. 24,

The address generation 2400 using the natural order is as follows:

$\mathcal{A}_y : x \mapsto \pi^{-1}(x) \bmod(W)$.

This anticipatory address generation 2400 can be applied to a variety of types of memory mapping, and it provides for significantly improved decoding speed when compared to the straightforward address generation as described above.

Referring specifically to the FIG. 24, this embodiment employs the ADD mapping (i.e., memory mapping of $\mathcal{M}=\mathcal{M}_{ADD}$); in addition, this embodiment 2400 corresponds to the situation C=4, the window size, W=6, q=2, and qW=12, as depicted by reference numeral 2402. Moreover, 4 processors (shown by processor P0 2410, processor P1 2411, processor P2 2412, and processor P3 2413) and 4 memory banks (shown by processor B0 2420, processor B1 2421, processor B2 2422, and processor B3 2423).

In accordance with the natural order phase of turbo decoding processing (e.g., the SISO 0 decoding operations), the addresses are accessed in a different order (i.e., not necessarily sequentially), depending on the memory mapping ($\mathcal{M}$) and the interleave (π) employed, as indicated by reference numeral 2402. The mapping (in this case the ADD mapping) determines which data from which particular memory bank is provided which processor. Nevertheless, the following can be seen when considering each of the memory banks.

Considering memory bank B0 2420:

1. The top data entry of memory bank B0 2420 is accessed at time 0.
2. The $4^{th}$ to top data entry of memory bank B0 2420 is accessed at time 1.
3. The $3^{rd}$ to top data entry of memory bank B0 2420 is accessed at time 2.
4. The bottom data entry of memory bank B0 2420 is accessed at time 3.
5. The $2^{nd}$ to bottom data entry of memory bank B0 2420 is accessed at time 4.
6. The $2^{nd}$ to top data entry of memory bank B0 2420 is accessed at time 5.

Considering memory bank B1 2421:

1. The top data entry of memory bank B1 2421 is accessed at time 0.
2. The bottom top data entry of memory bank B1 2421 is accessed at time 1.
3. The $3^{rd}$ to top data entry of memory bank B1 2421 is accessed at time 2.
4. The $2^{nd}$ to data entry of memory bank B1 2421 is accessed at time 3.
5. The $2^{nd}$ to bottom data entry of memory bank B1 2421 is accessed at time 4.
6. The $4^{th}$ to top data entry of memory bank B1 2421 is accessed at time 5.

Analogous observations can be made when considering memory bank B2 2422 and memory bank B3 2423.

Figure 25:
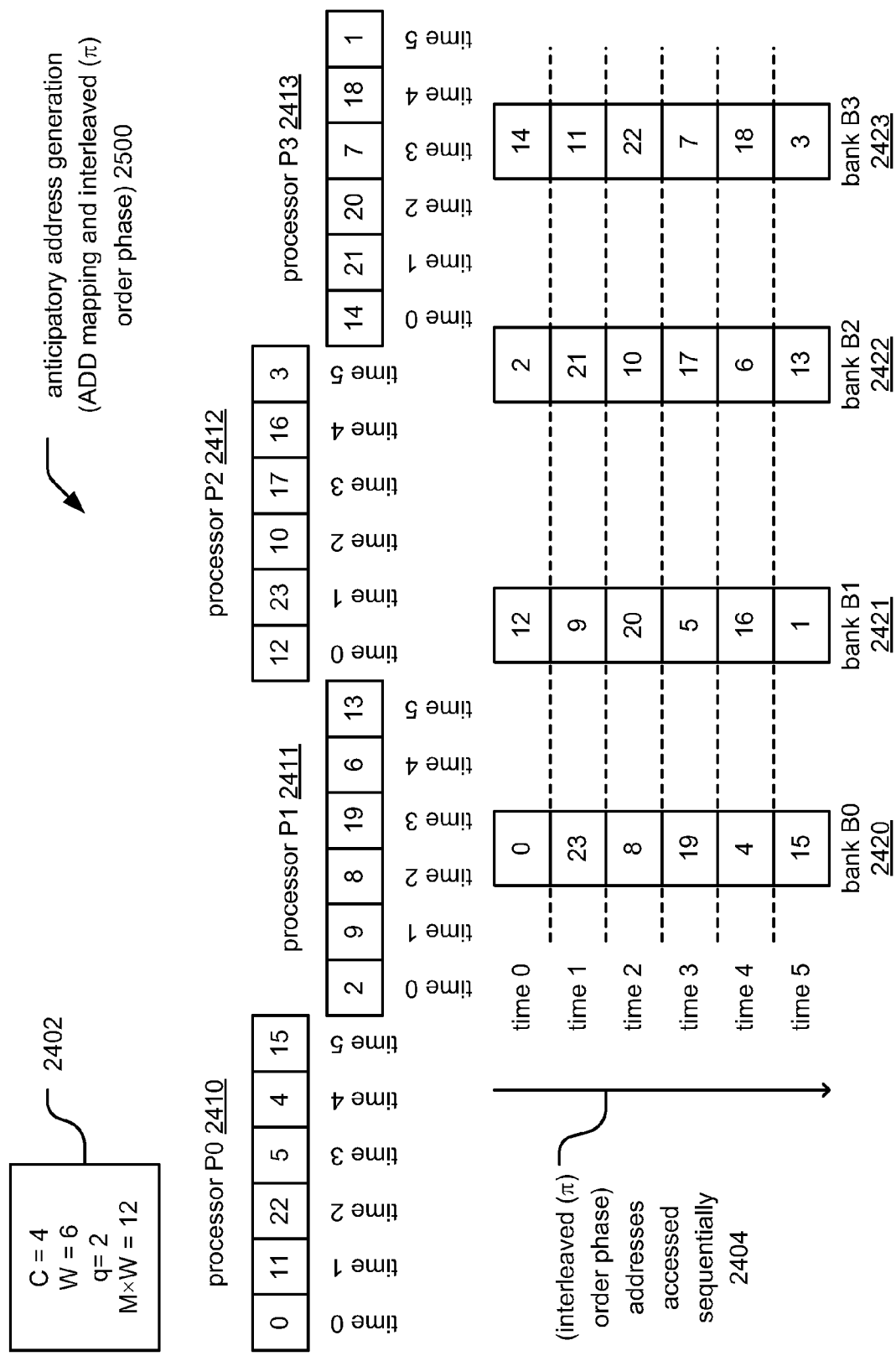
FIG. 25 illustrates an embodiment of anticipatory address generation for ADD mapping and interleaved ($\pi$) order phase of parallel turbo decoding processing.

FIG. 25 illustrates an embodiment of anticipatory address generation 2500 for ADD mapping and interleaved (π) order phase of parallel turbo decoding processing. This diagram should be considered in conjunction with FIG. 24.

In accordance with the interleaved (π) order of turbo decoding processing (e.g., the SISO 1 decoding operations), the addresses are accessed sequentially, as indicated by reference numeral 2404. The mapping (in this case the ADD mapping) determines which data from which particular memory bank is provided which processor. Nevertheless, the following can be seen:

1. The top data entry of each memory bank is accessed at time 0.
2. The $2^{nd}$ to top data entry of each memory bank is accessed at time 1.
3. The $3^{rd}$ to top data entry of each memory bank is accessed at time 2.
4. The $4^{th}$ to top data entry of each memory bank is accessed at time 3.
5. The $2^{nd}$ to bottom data entry of each memory bank is accessed at time 4.
6. The bottom data entry of each memory bank is accessed at time 5.

Figure 26:
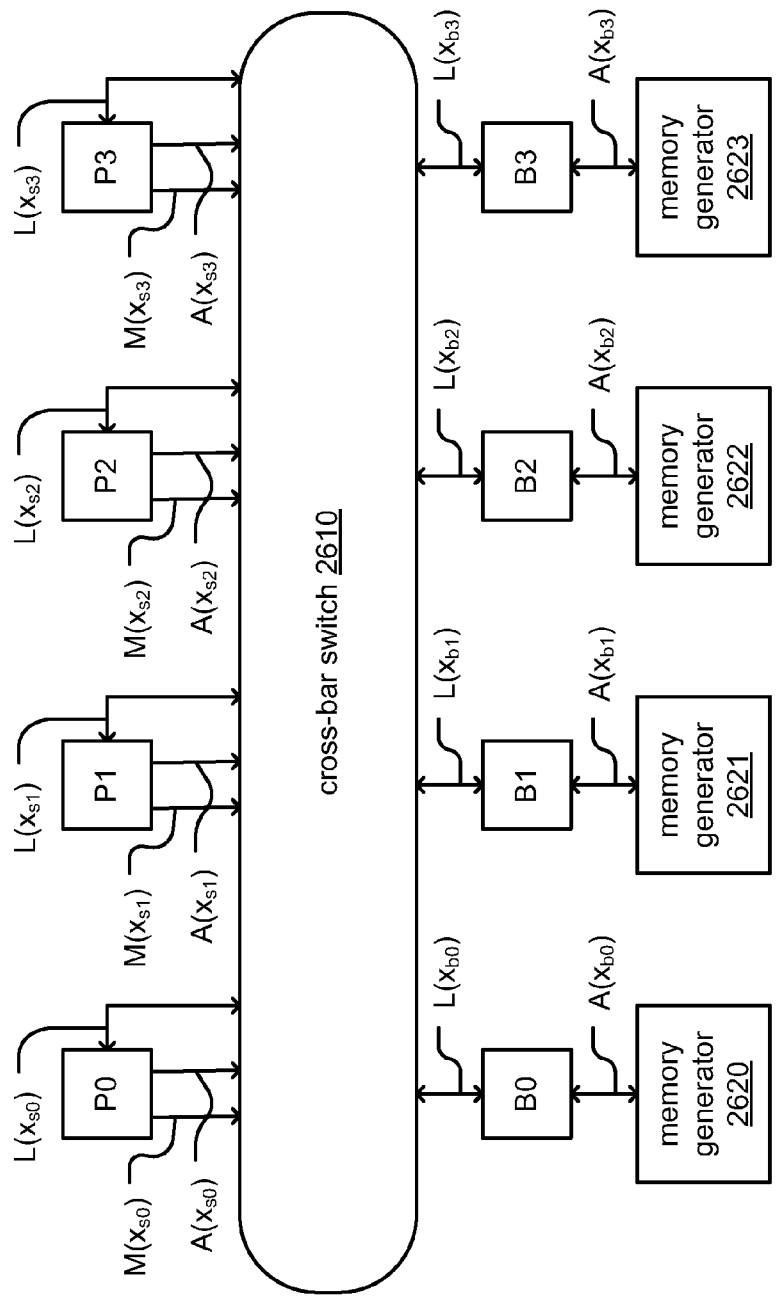
FIG. 26 illustrates an embodiment of a decoding architecture implemented for anticipatory address generation for ADD mapping.

FIG. 26 illustrates an embodiment of a decoding architecture 2600 implemented for anticipatory address generation for ADD mapping. This diagram should be considered in conjunction with FIG. 24 and FIG. 25. By employing the use of the index function ($\mathcal{I}$), a significant reduction in complexity and a significant increase in decoding speed can be achieved.

A cross-bar switch 2610 is employed to perform the appropriate providing of data values from each memory bank to the appropriate processor, but this embodiment is significantly less complex than the embodiment described above with respect to FIG. 23. This appropriate providing is again a function of the memory mapping ($\mathcal{M}$) and the interleave ($\pi$) that is employed. Depending on the mapping of each of the memory banks (e.g., to which processor each data entry within a particular memory bank is to be provided during a given decoding time) (these memory mappings of the 4 memory banks are depicted as $\mathcal{M}(x_{s0})$, $\mathcal{M}(x_{s1})$, $\mathcal{M}(x_{s2})$, and $\mathcal{M}(x_{s3})$) then the processor indices $\{s0, s1, s2, s3\}$ are mapped to the appropriate memory bank indices $\{b0, b1, b2, b3\}$ by sm→bn if ($\mathcal{M}(x_{sm})$=bn) for the data value only at that particular location within the memory bank; in other words, there is no longer a consideration of the memory bank address as there was within the embodiment of FIG. 23 (i.e., both the memory bank address and the data value are not considered—only the data value at a particular location within the memory bank is considered).

Referring to FIG. 26, the operations can be described as follows:

1. At a cycle t, processor Ps computes bit position xs (sW+t in natural order phase; $\pi$(sW+t) in interleaved ($\pi$) order phase).

2. Ps computes $\mathcal{M}$ (xs) (e.g., which memory bank) for bank of memory location for xs.

3. The cross-bar switch 2610 is configured according to the set of $\mathcal{M}$ (xs)'s to connect each processor Ps with the corresponding bank $\mathcal{M}$ (xs).

4. Simultaneously, the memory generator of each memory bank determines the address $\mathcal{A}$ (xs), so that $\mathcal{R}$ (xs), the value at bit position xs, can be accessed and provided to the appropriate processor via the cross-bar switch 2610.

Described another way, if the address mapping is as follows:

$$\mathcal{A}: x \mapsto \pi^{-1}(x) \bmod(W).$$

In the natural order phase of parallel turbo decoding processing, the addresses are calculated by each of the memory generators corresponding to each memory bank. For example, memory generator 2620 employs the calculated index function ($\mathcal{I}$) which then provides the information of the addresses of the data entries of the sub-block that have been stored in memory bank B0. Similarly, memory generator 2621 employs the calculated index function ($\mathcal{I}$) which then provides the information of the addresses of the data entries of the sub-block that have been stored in memory bank B1. Also analogously, memory generator 2622 employs the calculated index function ($\mathcal{I}$) which then provides the information of the addresses of the data entries of the sub-block that have been stored in memory bank B2, and memory generator 2623 employs the calculated index function ($\mathcal{I}$) which then provides the information of the addresses of the data entries of the sub-block that have been stored in memory bank B3.

In the interleaved ($\pi$) order phase of parallel turbo decoding processing, the addresses are simply access sequentially, which is very simple and quick. This use of these memory generators to calculate the addresses based on the index function ($\mathcal{I}$) allows for a much improved decoding speed in accordance with parallel turbo decoding processing.

In accordance with this anticipatory address generation, it is initially supposed that the address mapping is as follows:

$$\mathcal{A}: x \mapsto \pi^{-1}(x) \bmod(W).$$

The question may then be posed as to whether or not it is possible for each memory bank to calculate its own address sequence instead of necessitating that it be provided from the processors via the cross-bar switch. If the above-supposed address mapping ($\mathcal{A}: x \mapsto \pi^{-1}(x) \bmod(W)$) is employed, then this can be performed relatively easily thereby providing a much more simplistic implementation.

This employs the use of an index function ($\mathcal{I}$) that gives the bit index x of the data value in the memory bank b at a cycle t of the natural order phase of parallel turbo decoding processing. For example, the following index function, $\mathcal{I}$, is calculated for this particular address mapping ($\mathcal{A}: x \mapsto \pi^{-1}(x) \bmod(W)$).

$\mathcal{I}$ (b,t)=x which implies that $\mathcal{M}$ (x)=b and x=sW+t for some s.

This index function, $\mathcal{I}$, can be found because for this particular address mapping ($\mathcal{A}: x \mapsto \pi^{-1}(x) \bmod(W)$), the index function $\mathcal{I}$ (b,t) has the specific form of sW+t.

Generally speaking, once x is known, then the address mapping, $\mathcal{A}$, can be determined. Therefore, the novel address generation means is presented that addresses the memory mapping instead in accordance with the inverse interleave ($\pi^{-1}$) order as follows:

$$\mathcal{A}: x \mapsto \pi^{-1}(x) \bmod(W))$$

It is also noted that this anticipatory address generation, as employing an index function ($\mathcal{I}$), can be applied to any particular memory mapping ($\mathcal{M}$) that is desired in a particular application.

For one example, when considering the MOD mapping (i.e., $\mathcal{M}_{MOD}$) function as follows:

$$\mathcal{M}_{MOD}(i) = i \bmod M, \text{ then}$$

the index function is as follows:

$$\mathcal{I}_{MOD}(b,t) = (b-t)vW+t, \text{ where}$$

vW≡1 mod(M), where v exists since gcd(W,M)=1.

The proof of this is provided below:

$$\mathcal{M}_{MOD}(\mathcal{I}_{MOD}(b,t)) = ((b-t)vW+t) \bmod M$$

$$\mathcal{M}_{MOD}(\mathcal{I}_{MOD}(b,t)) = ((b-t)+t) \bmod M$$

$$\mathcal{M}_{MOD}(\mathcal{I}_{MOD}(b,t)) = b.$$

For another example, when considering the DIV mapping (i.e., $\mathcal{M}_{DIV}$) function as follows:

$$\mathcal{M}_{DIV}(i) = \lfloor i/W \rfloor, \text{ then}$$

the index function is as follows:

$$\mathcal{I}_{DIV}(b,t) = bW+t.$$

The proof of this is provided below:

$$\mathcal{M}_{DIV}(\mathcal{I}_{DIV}(b,t)) = \lfloor (bW+t)/W \rfloor$$

$$\mathcal{M}_{DIV}(\mathcal{I}_{DIV}(b,t)) = b.$$

For yet another example, when considering the ADD mapping (i.e., $\mathcal{M}_{ADD}$) function as follows:

$$\mathcal{M}_{ADD}(i) = \left(i + \left\lfloor \frac{i}{qW} \right\rfloor\right) \bmod M,$$

then
the index function is as follows:

$$\mathcal{I}_{ADD}(b,t) = \left(\left\lfloor \frac{b-t}{g} \right\rfloor v \bmod q\right)W + ((b-t)\bmod g)qW + t, \text{ where}$$

$$g = gcd(W, M) \text{ and } v(W/g) \equiv 1\bmod(q).$$

It is also noted that v exists because q=M/g by the following:

$$q(W/g) \equiv 0 \bmod(M/g) \Rightarrow (M/g)|q, \text{ and}$$

$$(M/g)W \equiv 0 \bmod M \Rightarrow (M/g) \geqq q.$$

The proof of this is provided below:
Let b−t=mg+n with 0≦n<g.

$$\mathcal{M}_{ADD}(\mathcal{I}_{ADD}(b,t)) = \left(\mathcal{I}_{ADD}(b,t) + \left\lfloor \frac{\mathcal{I}_{ADD}(b,t)}{qW} \right\rfloor\right)\bmod M$$

$$\mathcal{I}_{ADD}(b,t)\bmod M = ((mv\bmod q)W + t)\bmod M$$

$$= (mg + t)\bmod M$$

Since $vW \equiv g\bmod(M)$ by $v(W/g) \equiv 1\bmod(M/g)$.

$$\left(\left\lfloor \frac{\mathcal{I}_{ADD}(b,t)}{qW} \right\rfloor\right)\bmod M = n\bmod M.$$

$$\mathcal{M}_{ADD}(\mathcal{I}_{ADD}(b,t)) = (mg + t + n)\bmod M = b - t + t = b.$$

As such, it can be seen that this novel address function, $(\mathcal{A}_j : x \mapsto \pi^{-1}(x)\bmod(W))$, allows for each memory bank to compute its own sequence of addresses to perform appropriate memory bank access to provide the appropriate data portions therein to the appropriate processor for use in parallel turbo decoding processing.

Certain of the advantages of this novel, anticipatory address generation include a reduced cycle time. Because the memory banks themselves (or memory generators coupled to each of the memory banks, or even an integrated memory generator) are operable to generate the addresses themselves instead of needing to wait until these addresses are provided from the processors, and then passed to the memory banks via a cross-bar switch.

In addition, this novel address function, $(\mathcal{A}_j : x \mapsto \pi^{-1}(x) \bmod(W))$, allows for a smaller area in a hardware implementation because such a cross-bar switch need only perform data steering (i.e., the addresses are generated locally by the memory generators). This can be compared to a cross-bar switch that needs to perform both the providing of and directing of both addresses and data between the memory banks and the processors. Moreover, this novel address function, $(\mathcal{A}_j : x \mapsto \pi^{-1}(x) \bmod(W))$, allows for less net congestion in the parallel turbo decoding processing, in that, the addresses are generated locally by the memory generators instead of being set from the processors via such a cross-bar switch.

Figure 27:
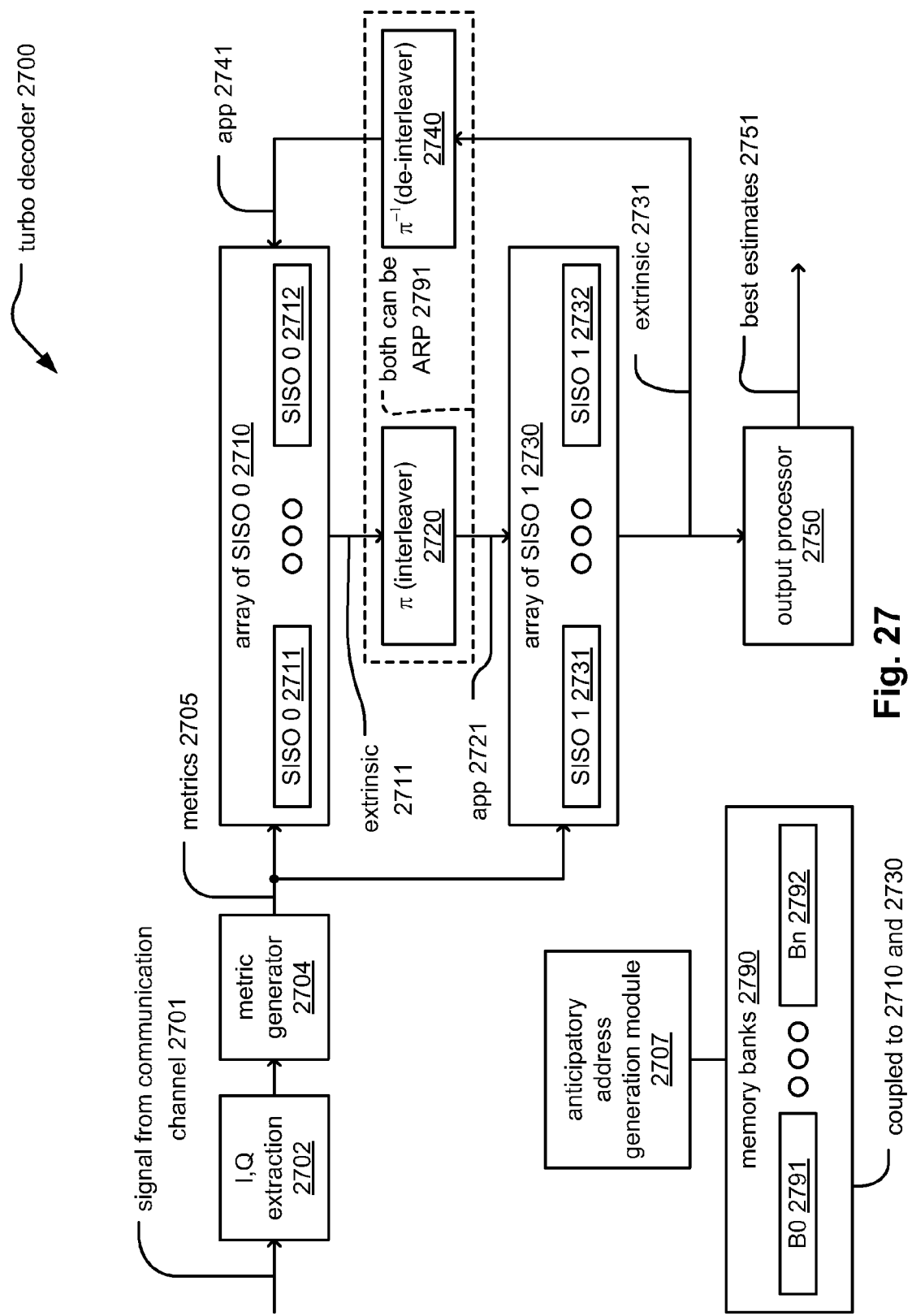
FIG. 27 illustrates an embodiment of a turbo decoder that employs two separate pluralities of SISO decoders and anticipatory address generation for accessing data stored within a plurality of memory banks.

FIG. 27 illustrates an embodiment of a turbo decoder 2700 that employs two separate pluralities of SISO decoders and anticipatory address generation for accessing data stored within a plurality of memory banks. As shown within other embodiments, a received signal (e.g., typically received from a communication channel) is provided to an I,Q extraction module 2702 that extracts the I,Q (in-phase and quadrature) components from the received signal 2701. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 2704. The metric generator 2704 generates the appropriate metrics 2705 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 2705 that are calculated by the metric generator 2704 are then provided to an anticipatory address generation module 2707. Initially, the anticipatory address generation module 2707 is operable to partition the received data block into a plurality of sub-blocks. Each of these sub-blocks includes a corresponding plurality of data. The individual data of each of the sub-blocks is then stored into a memory location within one memory bank of a plurality of memory banks 2790. The plurality of memory banks 2790 includes a number of memory banks, as shown by B0 2791, . . . , and Bn 2792. Based on the location of these data of each sub-block as they are placed into the memory banks 2790, the anticipatory address generation module 2707 is also operable to generate the appropriate index function (e.g., $\mathcal{I}$) that is employed for appropriate accessing of the addresses of each of the individual data entries when performing the natural order phase of the turbo decoding processing (e.g., the SISO 0 decoding operations).

This index function is then operable to be employed by a plurality of memory generators (e.g., as also described within other embodiments) so that the appropriate address can be generated immediately without necessitating the involvement of the multiple decoding processors as employed within parallel turbo decoding processing.

The appropriate addresses are then provided for use by a first array of soft-in/soft-out (SISO) 0 decoders 2710. This first array of SISO 0 decoders 2710 includes a number of SISO 0 decoders, as shown by as shown by SISO 0 2711, . . . , and SISO 0 2712. Each individual SISO decoder in the array of SISO 0 decoders 2710 is operable to perform SISO decoding of data stored within a particular memory location within one of the particular memory banks 2790.

The earlier calculated metrics 2705 that are calculated by the metric generator 2704 are also provided to the second array of SISO 1 decoders 2730. This array of SISO 1 decoders 2730 includes a number of SISO 1 decoders, as shown by as shown by SISO 1 2731, . . . , and SISO 1 2732. Each individual SISO decoder in the array of SISO 1 decoders 2730 is also operable to perform SISO decoding of data stored within a particular memory location within one of the particular memory banks 2790.

In the context of trellis coding (e.g., turbo trellis coded modulation (TTCM)), each of the first array of SISO 0 decoder 2710 and the second array of SISO 1 decoders 2730 calculates forward metrics (alphas) and backward metrics (betas), and extrinsic values according to the trellis employed for each of the individual data entries within each of the corresponding memory locations that are being updated in that particular decoding iterations.

These alphas, betas, and extrinsics are all calculated for each symbol within a frame that is to be decoded. These calculations of alphas, betas, and extrinsics are all based on the trellis.

Starting with the first array of SISO 0 decoders 2710, after the extrinsic values 2711 have been calculated, they are passed to an interleaver (π) 2720 after which it is passed to the second array of SISO 1 decoders 2730 as "a priori probability" (app) information 2721. It is noted that the accessing of the data within the memory banks 2790 by the second array of SISO 1 decoders 2730 is performed sequentially due to the employing of the index function (◌⃞) in accordance with the interleaved (π) order phase of the turbo decoding processing (e.g., the SISO 1 decoding operations).

Similarly, after extrinsic values 2731 have been calculated within the second array SISO 1 decoders 2730, they are passed to a de-interleaver ($\pi^{-1}$) 2740 after which it is passed as "a priori probability" (app) information 2741 to the anticipatory address generation module 2707 that is operable to employ the appropriate index function (e.g., ◌⃞) for appropriate accessing of the addresses of each of the individual data entries when performing the natural order phase of the turbo decoding processing (e.g., the SISO 0 decoding operations). As within other embodiments, the accessing of the addresses of each of the individual data entries when performing the natural order phase of the turbo decoding processing (e.g., the SISO 0 decoding operations) is not sequential; it is in a different order based on the particular memory mapping employed as well as the interleave (π).

It is noted that a single decoding iteration, within the iterative decoding process of the turbo decoder 2700 consists of performing two SISO operations; that is to say, the iterative decoding process must pass through both the first array of SISO 0 decoders 2710 and through the second array of SISO 1 decoders 2730.

After a significant level of confidence has been achieved and a solution is being converged upon, or after a predetermined number of decoding iterations have been performed, then the output from the second array of SISO 1 decoders 2730 is passed as output to an output processor 2750. The operation of the array of SISO 0 decoders 2710 and the array of SISO 1 decoders 2730 may generally be referred to as calculating soft symbol decisions of the symbol contained within the received symbol. These soft symbol decisions may be performed on a true bit level in certain embodiments. The output processor 2750 uses these soft symbol decisions to generate best estimates 2751 (e.g., hard bit and/or symbol decisions) for the information bits that have been encoded within the original turbo coded signal (e.g., generally within a turbo encoder location at another end of a communication channel into which the signal 2701 was originally launched.

It is also noted that each of the interleaving performed within the interleaver (π) 2720 can be performed using an embodiment of an ARP interleave, as shown by reference numeral 2791. Also, there are embodiments in which the de-interleaving performed within the de-interleaver ($\pi^{-1}$) 2740 can also be performed using an embodiment of an ARP de-interleave.

Figure 28:
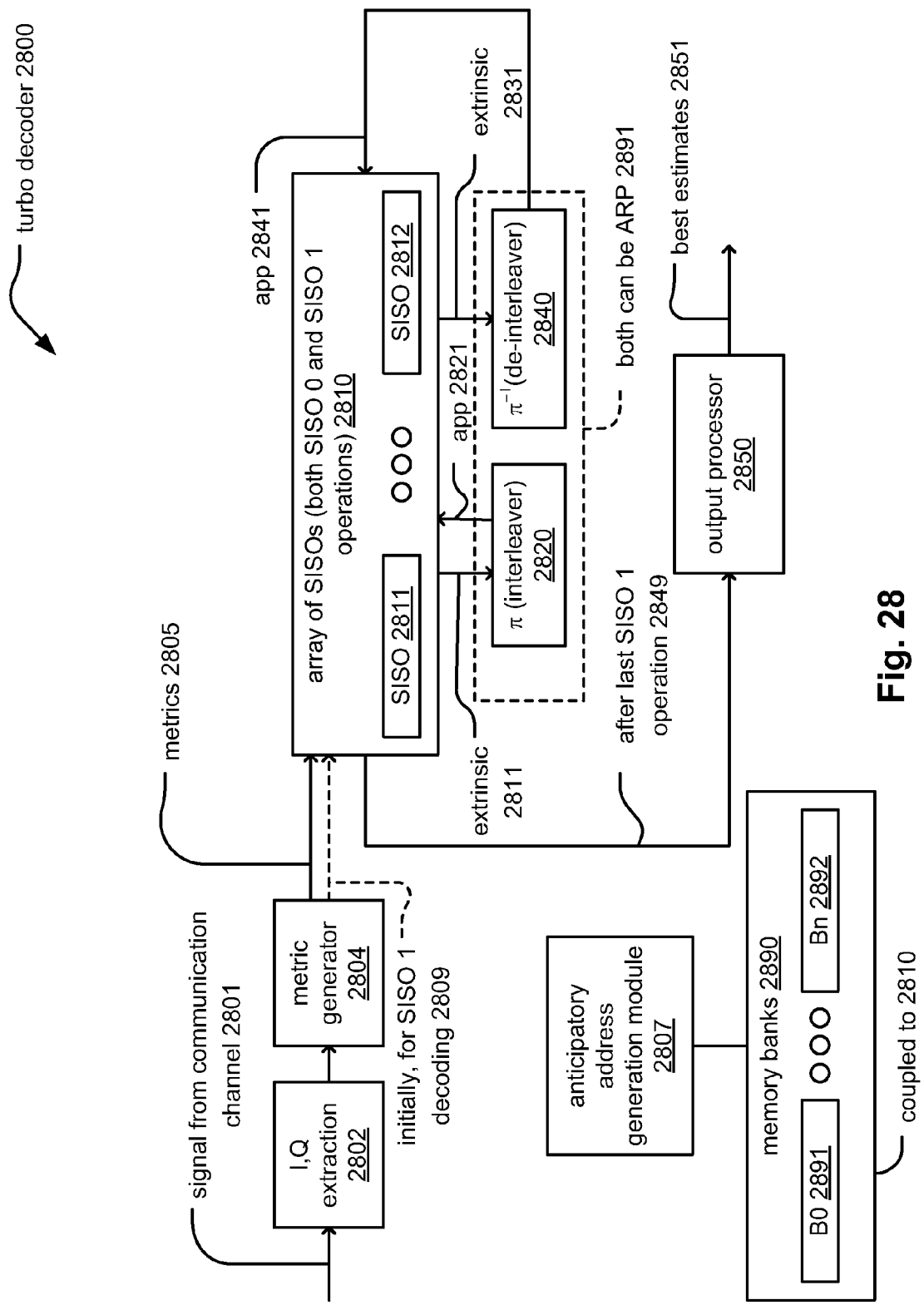
FIG. 28 illustrates an embodiment of a turbo decoder that employs a plurality of SISO decoders and anticipatory address generation for accessing data stored within a plurality of memory banks.

FIG. 28 illustrates an embodiment of a turbo decoder 2800 that employs a plurality of SISO decoders and anticipatory address generation for accessing data stored within a plurality of memory banks. As shown within other embodiments, a received signal (e.g., typically received from a communication channel) is provided to an I,Q extraction module 2802 that extracts the I,Q (in-phase and quadrature) components from the received signal 2801. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 2804. The metric generator 2804 generates the appropriate metrics 2805 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 2805 that are calculated by the metric generator 2804 are then provided to an anticipatory address generation module 2807. Initially, the anticipatory address generation module 2807 is operable to partition the received data block into a plurality of sub-blocks. Each of these sub-blocks includes a corresponding plurality of data. The individual data of each of the sub-blocks is then stored into a memory location within one memory bank of a plurality of memory banks 2890. The plurality of memory banks 2890 includes a number of memory banks, as shown by B0 2891, . . . , and Bn 2892. Based on the location of these data of each sub-block as they are placed into the memory banks 2890, the anticipatory address generation module 2807 is also operable to generate the appropriate index function (e.g., ◌⃞) that is employed for appropriate accessing of the addresses of each of the individual data entries when performing the natural order phase of the turbo decoding processing (e.g., the SISO 0 decoding operations). As within other embodiments, the accessing of the addresses of each of the individual data entries when performing the natural order phase of the turbo decoding processing (e.g., the SISO 0 decoding operations) is not sequential; it is in a different order based on the particular memory mapping employed as well as the interleave (π).

This index function is then operable to be employed by a plurality of memory generators (e.g., as also described within other embodiments) so that the appropriate address can be generated immediately without necessitating the involvement of the multiple decoding processors as employed within parallel turbo decoding processing.

The appropriate addresses are then provided for use by an array of soft-in/soft-out (SISO) decoders 2810 that is operable to perform both the SISO 0 and the SISO 1 decoding operations. This array of SISO decoders 2810 includes a number of SISO decoders, as shown by as shown by SISO 2811, . . . , and SISO 2812. Each individual SISO decoder in the array of SISO decoders 2810 is operable to perform SISO decoding of data stored within a particular memory location within one of the particular memory banks 2890 (for both the SISO 0 and SISO 1 decoding operations).

The earlier calculated metrics 2805 that are calculated by the metric generator 2804 are also provided to the array of SISO decoders 2810 for performing of initial SISO 1 decoding operations, as shown by the reference numeral 2809.

In the context of trellis coding (e.g., turbo trellis coded modulation (TTCM)), each SISO decoder of the array of SISO decoder 2810 calculates forward metrics (alphas) and backward metrics (betas), and extrinsic values according to the trellis employed for each of the individual data entries within each of the corresponding memory locations that are being updated in that particular decoding iterations.

These alphas, betas, and extrinsics are all calculated for each symbol within a frame that is to be decoded. These calculations of alphas, betas, and extrinsics are all based on the trellis.

Starting with the first decoding operation (i.e., SISO 0) as performed by the array of SISO decoders 2810, after the extrinsic values 2811 have been calculated, they are passed to an interleaver (π) 2820 after which it is passed to back to the array of SISO decoders 2810 as "a priori probability" (app) information 2821. It is noted that the accessing of the data within the memory banks 2890 by the array of SISO decoders 2810, when performing the SISO 1 decoding operations, is performed sequentially due to the employing of the index function ($\mathcal{S}$) in accordance with the interleaved ($\pi$) order phase of the turbo decoding processing (e.g., the SISO 1 decoding operations).

Similarly, after extrinsic values 2831 have been calculated within the SISO decoders 2810 (i.e., during the SISO 1 decoding operations), they are passed to a de-interleaver ($\pi^{-1}$) 2840 after which it is passed as "a priori probability" (app) information 2841 to the anticipatory address generation module 2807 that is operable to employ the appropriate index function (e.g., $\mathcal{S}$) for appropriate accessing of the addresses of each of the individual data entries when performing the natural order phase of the turbo decoding processing (e.g., the SISO 0 decoding operations).

It is noted that a single decoding iteration, within the iterative decoding process of the turbo decoder 2800 consists of performing two SISO operations; that is to say, the iterative decoding process must pass through both the array of SISO decoders 2810 twice.

After a significant level of confidence has been achieved and a solution is being converged upon, or after a predetermined number of decoding iterations has been performed, then the output from the array of SISO decoders 2810 (after having performed the SISO 1 decoding operations) is passed as output to an output processor 2850. The operation of the array of SISO decoders 2810 may generally be referred to as calculating soft symbol decisions of the symbol contained within the received symbol. These soft symbol decisions may be performed on a true bit level in certain embodiments. The output processor 2850 uses these soft symbol decisions to generate best estimates 2851 (e.g., hard bit and/or symbol decisions) for the information bits that have been encoded within the original turbo coded signal (e.g., generally within a turbo encoder location at another end of a communication channel into which the signal 2801 was originally launched.

It is also noted that each of the interleaving performed within the interleaver ($\pi$) 2820 can be performed using an embodiment of an ARP interleave, as shown by reference numeral 2891. Also, there are embodiments in which the de-interleaving performed within the de-interleaver ($\pi^{-1}$) 2840 can also be performed using an embodiment of an ARP de-interleave. As shown within this embodiment, a single array of SISO decoders 2810 is operable to perform both the SISO 0 and the SISO 1 decoding operations. Also, it sis noted that a single module can be employed to perform both the functionality of the interleaver ($\pi$) 2820 and the de-interleaver ($\pi^{-1}$) 2840. Particularly when the interleave ($\pi$) employed is of ARP format, then a de-interleave ($\pi^{-1}$) can be generated from the interleave ($\pi$) that is also of ARP format. In one such embodiment, a single module, software, hardware, and/or combination thereof can be employed to perform the functionality of both the interleaving ($\pi$) and de-interleaving ($\pi^{-1}$) operations in accordance with parallel turbo decoding processing.

Figure 29:
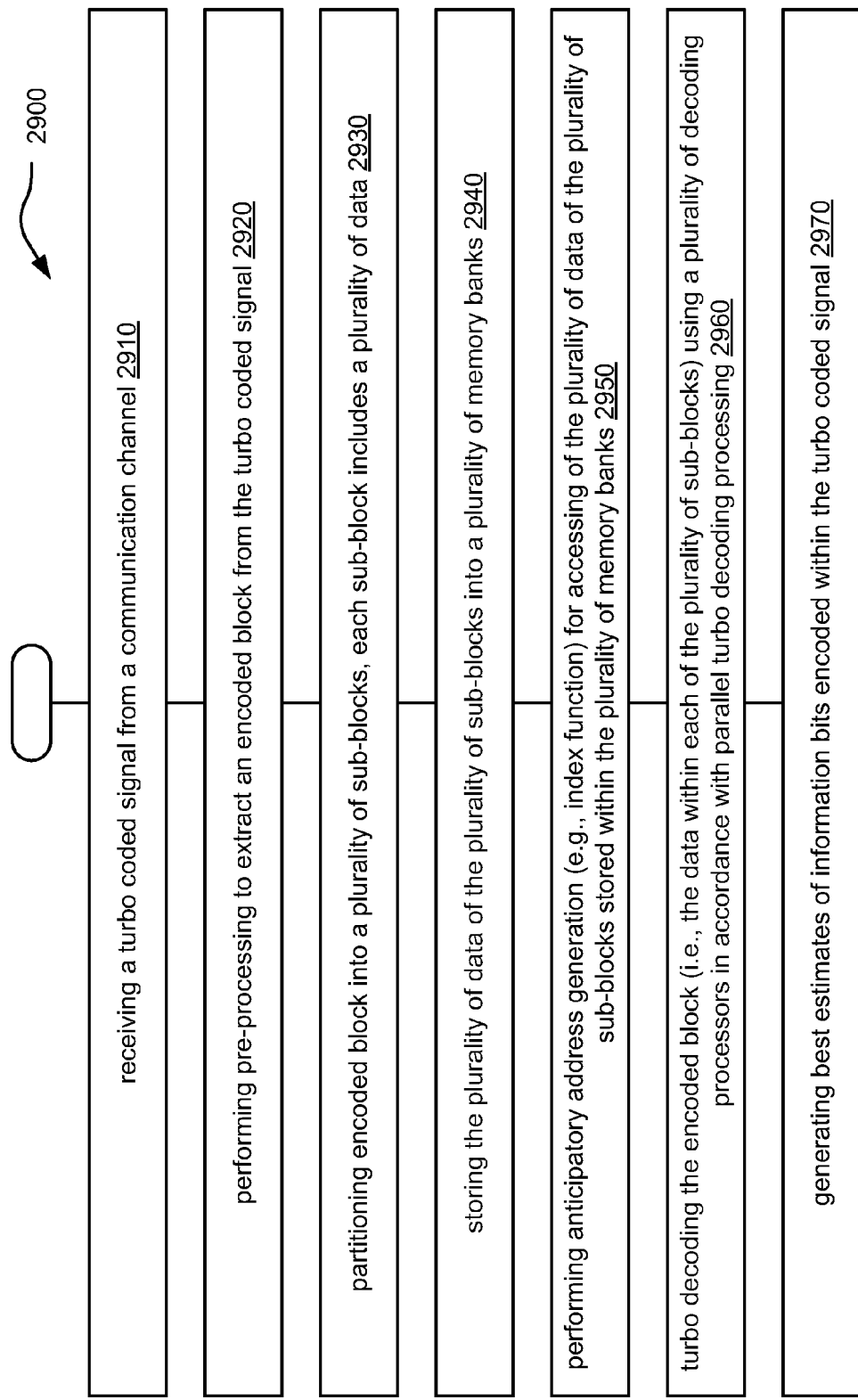
FIG. 29 illustrates an embodiment of a method for decoding a turbo coded signal.

FIG. 29 illustrates an embodiment of a method 2900 for decoding a turbo coded signal. As shown in a block 2910, the method 2900 begins by receiving a turbo coded signal from a communication channel. The method 2900 continues by performing pre-processing to extract an encoded block from the turbo coded signal, as shown in a block 2920. The method 2900 continues by partitioning the encoded block into a plurality of sub-blocks, as shown in a block 2930. It is also noted that each sub-block itself includes a plurality of data.

The method 2900 then continues by storing the plurality of data of the plurality of sub-blocks into a plurality of memory banks, as shown in a block 2930. The method 2900 also continues by performing anticipatory address generation (e.g., index function) for accessing of the plurality of data of the plurality of sub-blocks stored within the plurality of memory banks, as shown in a block 2950. The method 2900 also continues by turbo decoding the encoded block (i.e., the data within each of the plurality of sub-blocks) using a plurality of decoding processors in accordance with parallel turbo decoding processing, as shown in a block 2960. The method 2900 also continues by generating best estimates of information bits encoded within the turbo coded signal, as shown in a block 2970.

Figure 30:
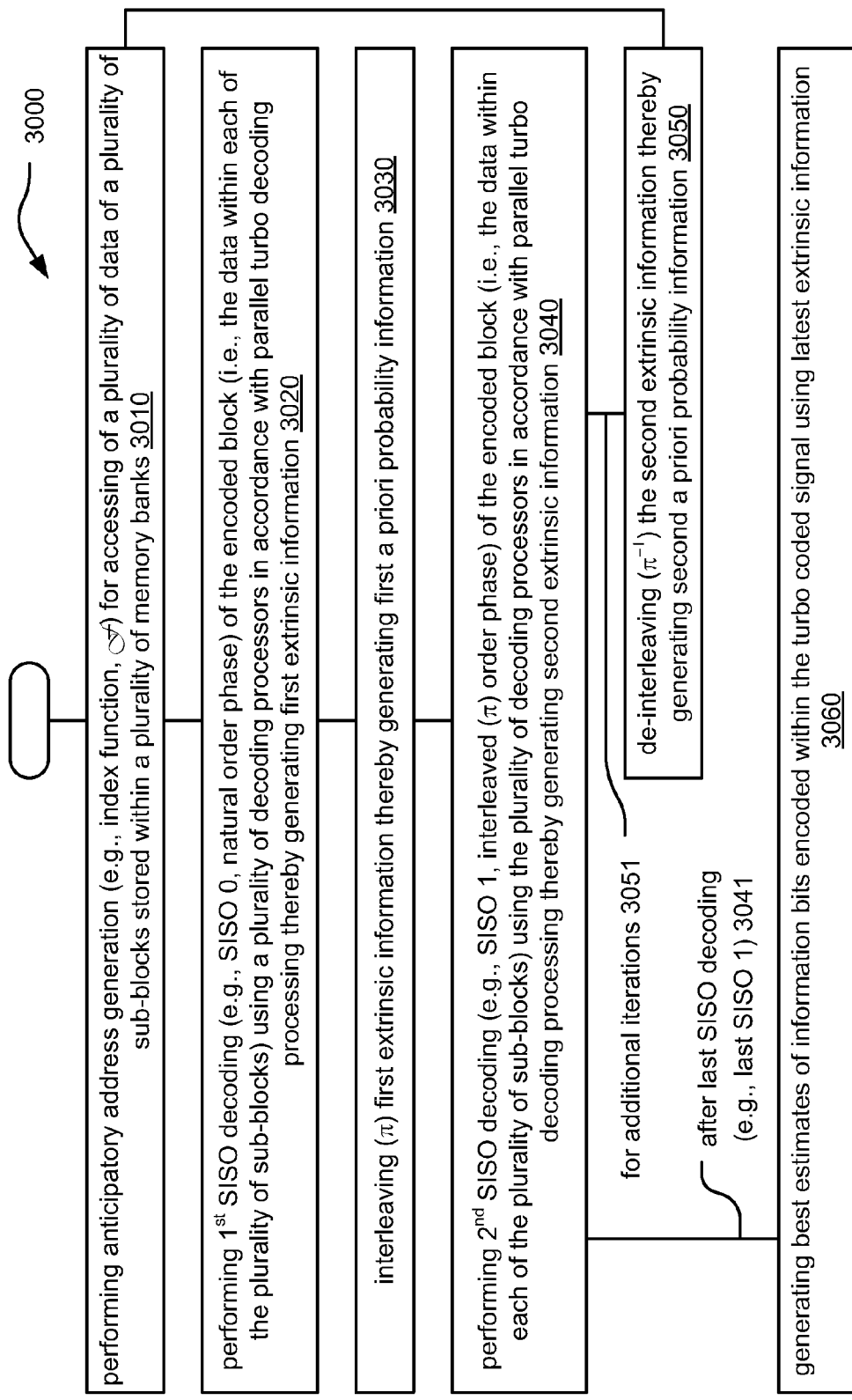
FIG. 30 illustrates an alternative embodiment of a method for decoding a turbo coded signal.

FIG. 30 illustrates an alternative embodiment of a method 3000 for decoding a turbo coded signal. Initially, in certain embodiments, the method 3000 can perform analogous operations as described within blocks 2910, 2920, 2930, and 2940 of method 2900 of FIG. 29.

As shown in a block 3010, the method 3000 operates by performing anticipatory address generation (e.g., index function, $\mathcal{S}$) for accessing of a plurality of data of a plurality of sub-blocks stored within a plurality of memory banks.

The method 3000 then continues by performing $1^{st}$ SISO decoding (e.g., SISO 0, natural order phase) of the encoded block (i.e., the data within each of the plurality of sub-blocks) using a plurality of decoding processors in accordance with parallel turbo decoding processing thereby generating first extrinsic information, as shown in a block 3020.

The method 3000 then continues by interleaving ($\pi$) first extrinsic information thereby generating first a priori probability information, as shown in a block 3030.

The method 3000 then continues by performing $2^{nd}$ SISO decoding (e.g., SISO 1, interleaved ($\pi$) order phase) of the encoded block (i.e., the data within each of the plurality of sub-blocks) using the plurality of decoding processors in accordance with parallel turbo decoding processing thereby generating second extrinsic information, as shown in a block 3040.

When performing additional decoding operations as shown by reference numeral 3051, the method 3000 continues by de-interleaving ($\pi^{-1}$) the second extrinsic information thereby generating second a priori probability information, as shown in a block 3050. The method 3000 then continues by returning to block 3010 to perform the anticipatory address generation for subsequent decoding iterations.

However, when a final decoding iteration has been performed (e.g., all of the SISO 0 and SISO 1 decoding operations have been performed, and particularly after a final SISO 1 decoding operation has been performed) as shown by reference numeral 3041, then the method 3000 continues by generating best estimates of information bits encoded within the turbo coded signal, as shown in a block 3060.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.

[2] France Telecom, GET, "Enhancement of Rel. 6 turbo Code," 3GPP TSG RAN WG1#43, R1-051310, 2005.

[3] Motorola, "A contention-free interleaver design for LTE codes," 3GPP TSG RAN WG1#47.

[4] A. Nimbalker, T. E. Fuja, D. J. Costello, Jr. T. K. Blankenship and B. Classon, "Contention-Free Interleavers," *IEEE ISIT* 2004, Chicago, USA, Jun. 27-Jul. 2, 2004.

What is claimed is:

1. An apparatus, comprising:
a plurality of memories; and
a plurality of turbo decoders, communicatively coupled to the plurality of memories, for decoding a turbo coded signal; and wherein:
during natural order phase decoding processing, the plurality of turbo decoders non-sequentially retrieving and processing first information from the plurality of memories based on a plurality of calculated indices based on address mappings of the plurality of memories;
during interleaved order phase decoding processing, the plurality of turbo decoders sequentially retrieving and processing second information from the plurality of memories; and
the plurality of turbo decoders generating a best estimate of at least one bit encoded into the turbo coded signal using latest processed information as generated by the plurality of turbo decoders.

2. The apparatus of claim 1, further comprising:
an anticipatory address module for generating an index function for use in calculating:
a first calculated index of the plurality of calculated indices corresponding to a first of the plurality of memories for use within a first decoding iteration; and
a second calculated index of the plurality of calculated indices corresponding to a second of the plurality of memories for use within a second decoding iteration.

3. The apparatus of claim 1, further comprising:
a processing module, interposed between and communicatively coupled to each of the plurality of memories and the plurality of turbo decoders, for effectuating contention-free memory mapping between the plurality of turbo decoders and the plurality of memories during iterative decoding processing of the turbo coded signal.

4. The apparatus of claim 1, further comprising:
a cross-bar switch, interposed between and communicatively coupled to each of the plurality of memories and the plurality of turbo decoders, for effectuating contention-free memory mapping between the plurality of turbo decoders and the plurality of memories during iterative decoding processing of the turbo coded signal.

5. The apparatus of claim 1, wherein:
the turbo coded signal generated using almost regular permutation (ARP) interleaving.

6. The apparatus of claim 1, wherein:
the plurality of turbo decoders performing almost regular permutation (ARP) interleaving and de-interleaving in accordance with decoding the turbo coded signal.

7. The apparatus of claim 1, wherein a turbo decoder of the plurality of turbo decoders including:
an anticipatory address module for:
receiving a plurality of metrics associated with the turbo coded signal;
storing the plurality of metrics into the plurality of memories; and
generating an index function for use in calculating the plurality of calculated indices;
a first soft-in/soft-out (SISO) decoder for performing SISO decoding on the plurality of metrics thereby calculating first extrinsic information;
an interleaver module for performing interleaving on the first extrinsic information thereby generating first "a priori probability" (app) information;
a second SISO decoder for performing SISO decoding on the first app information thereby generating second extrinsic information;
a de-interleaver module for performing de-interleaving on the second extrinsic information thereby generating second app information; and
an output processor for processing most recent extrinsic information that has been generated by the second SISO decoder thereby generating the best estimate of at least one bit encoded into the turbo coded signal.

8. The apparatus of claim 1, wherein:
the turbo coded signal being composed of a plurality of blocks each having a common block length;
one of the plurality of blocks being divided into a plurality of windows;
during a decoding cycle, each of the plurality of turbo decoders processing a sub-portion of a respective one of the plurality of windows.

9. The apparatus of claim 1, wherein:
the plurality of turbo decoders including a first number of turbo decoders; and
the plurality of memories including a second number of memories.

10. The apparatus of claim 1, wherein:
the apparatus being implemented within a communication device; and
the communication device being operative in accordance with at least one of a satellite communication system, a wireless communication system, a wired communication system, and a fiber-optic communication system.

11. An apparatus, comprising:
a plurality of memories;
a plurality of turbo decoders for decoding a turbo coded signal; and
a processing module, interposed between and communicatively coupled to each of the plurality of memories and the plurality of turbo decoders, for effectuating contention-free memory mapping between the plurality of turbo decoders and the plurality of memories during iterative decoding processing of the turbo coded signal; and wherein:
during natural order phase decoding processing, the plurality of turbo decoders non-sequentially retrieving and processing first information from the plurality of memories based on a plurality of calculated indices based on address mappings of the plurality of memories;
during interleaved order phase decoding processing, the plurality of turbo decoders sequentially retrieving and processing second information from the plurality of memories;
the plurality of turbo decoders generating a best estimate of at least one bit encoded into the turbo coded signal using latest processed information as generated by the plurality of turbo decoders;
the plurality of turbo decoders including a first number of turbo decoders; and
the plurality of memories including a second number of memories.

12. The apparatus of claim 11, further comprising:
an anticipatory address module for generating an index function for use in calculating:
a first calculated index of the plurality of calculated indices corresponding to a first of the plurality of memories for use within a first decoding iteration; and
a second calculated index of the plurality of calculated indices corresponding to a second of the plurality of memories for use within a second decoding iteration.

13. The apparatus of claim 11, wherein:
the plurality of turbo decoders performing almost regular permutation (ARP) interleaving and de-interleaving in accordance with decoding the turbo coded signal.

14. The apparatus of claim 11, wherein a turbo decoder of the plurality of turbo decoders including:
an anticipatory address module for:
receiving a plurality of metrics associated with the turbo coded signal;
storing the plurality of metrics into the plurality of memories; and
generating an index function for use in calculating the plurality of calculated indices;
a first soft-in/soft-out (SISO) decoder for performing SISO decoding on the plurality of metrics thereby calculating first extrinsic information;
an interleaver module for performing interleaving on the first extrinsic information thereby generating first "a priori probability" (app) information;
a second SISO decoder for performing SISO decoding on the first app information thereby generating second extrinsic information;
a de-interleaver module for performing de-interleaving on the second extrinsic information thereby generating second app information; and
an output processor for processing most recent extrinsic information that has been generated by the second SISO decoder thereby generating the best estimate of at least one bit encoded into the turbo coded signal.

15. The apparatus of claim 11, wherein:
the apparatus being implemented within a communication device; and
the communication device being operative in accordance with at least one of a satellite communication system, a wireless communication system, a wired communication system, and a fiber-optic communication system.

16. An apparatus, comprising:
a plurality of memories;
a plurality of turbo decoders for decoding a turbo coded signal; and
a cross-bar switch, interposed between and communicatively coupled to each of the plurality of memories and the plurality of turbo decoders, for effectuating contention-free memory mapping between the plurality of turbo decoders and the plurality of memories during iterative decoding processing of the turbo coded signal; and wherein:
during natural order phase decoding processing, the plurality of turbo decoders non-sequentially retrieving and processing first information from the plurality of memories based on a plurality of calculated indices based on address mappings of the plurality of memories;
during interleaved order phase decoding processing, the plurality of turbo decoders sequentially retrieving and processing second information from the plurality of memories;
the plurality of turbo decoders generating a best estimate of at least one bit encoded into the turbo coded signal using latest processed information as generated by the plurality of turbo decoders;
the plurality of turbo decoders including a first number of turbo decoders; and
the plurality of memories including a second number of memories.

17. The apparatus of claim 16, further comprising:
an anticipatory address module for generating an index function for use in calculating:
a first calculated index of the plurality of calculated indices corresponding to a first of the plurality of memories for use within a first decoding iteration; and
a second calculated index of the plurality of calculated indices corresponding to a second of the plurality of memories for use within a second decoding iteration.

18. The apparatus of claim 16, wherein:
the plurality of turbo decoders performing almost regular permutation (ARP) interleaving and de-interleaving in accordance with decoding the turbo coded signal.

19. The apparatus of claim 16, wherein a turbo decoder of the plurality of turbo decoders including:
an anticipatory address module for:
receiving a plurality of metrics associated with the turbo coded signal;
storing the plurality of metrics into the plurality of memories; and
generating an index function for use in calculating the plurality of calculated indices;
a first soft-in/soft-out (SISO) decoder for performing SISO decoding on the plurality of metrics thereby calculating first extrinsic information;
an interleaver module for performing interleaving on the first extrinsic information thereby generating first "a priori probability" (app) information;
a second SISO decoder for performing SISO decoding on the first app information thereby generating second extrinsic information;

a de-interleaver module for performing de-interleaving on the second extrinsic information thereby generating second app information; and an output processor for processing most recent extrinsic information that has been generated by the second SISO decoder thereby generating the best estimate of at least one bit encoded into the turbo coded signal.

20. The apparatus of claim 16, wherein:

the apparatus being implemented within a communication device; and the communication device being operative in accordance with at least one of a satellite communication system, a wireless communication system, a wired communication system, and a fiber-optic communication system.

* * * * *